(12) United States Patent
Seno

(10) Patent No.: US 8,321,193 B2
(45) Date of Patent: Nov. 27, 2012

(54) SUPPORT SYSTEM AND METHOD FOR MANUFACTURING INTEGRATED CIRCUIT

(75) Inventor: Shuntaro Seno, Fujisawa (JP)

(73) Assignee: Hitachi, Ltd., Tokyo (JP)

(*) Notice: Subject to any disclaimer, the term of this patent is extended or adjusted under 35 U.S.C. 154(b) by 579 days.

(21) Appl. No.: 12/526,621

(22) PCT Filed: Jun. 15, 2009

(86) PCT No.: PCT/JP2009/002708
§ 371 (c)(1),
(2), (4) Date: Aug. 10, 2009

(87) PCT Pub. No.: WO2010/146623
PCT Pub. Date: Dec. 23, 2010

(65) Prior Publication Data
US 2010/0318328 A1    Dec. 16, 2010

(51) Int. Cl.
*G06F 17/50* (2006.01)
(52) U.S. Cl. .......................... 703/14; 716/101
(58) Field of Classification Search .............. 703/14
See application file for complete search history.

(56) References Cited

U.S. PATENT DOCUMENTS

| 5,619,702 | A | * | 4/1997 | Ilic .................. 717/151 |
| 5,915,124 | A | * | 6/1999 | Morris, III ............ 710/9 |
| 5,995,736 | A | | 11/1999 | Aleksic et al. |
| 2004/0122990 | A1 | | 6/2004 | Meyer et al. |
| 2004/0261050 | A1 | * | 12/2004 | Broberg et al. ........ 716/18 |
| 2005/0015755 | A1 | | 1/2005 | Holmes et al. |

FOREIGN PATENT DOCUMENTS

JP    2005-327192    11/2005

* cited by examiner

*Primary Examiner* — Dwin M Craig
*Assistant Examiner* — Andre Pierre Louis
(74) *Attorney, Agent, or Firm* — Brundidge & Stanger, P.C.

(57) ABSTRACT

An integrated circuit including an I/O register, wherein based on the behavior level design data, I/O register access information is generated. Then, based on the I/O register access information and association of an SW address with an HW address, address map information is generated. The SW address being used when the processor device accesses the I/O register, and the HW address being used when the user logical circuit accesses the I/O register. Based on the behavior level design data and the address map information, behavior level design data is generated.

13 Claims, 51 Drawing Sheets

Fig. 4

ADDRESS MAP

| ADDRESS | BYTE0 | | | | BYTE1 | | | | BYTE2 | | | | BYTE3 | | |
|---|---|---|---|---|---|---|---|---|---|---|---|---|---|---|---|
| | 31 | 30 | ... | 24 | 23 | ... | 16 | 15 | ... | 8 | 7 | ... | 0 |
| 0x0000 | REGISTER A | | | | REGISTER B | | | | | | | | | | |
| 0x0004 | REGISTER B (CONTINUED) | | | | | | | | | | | RESERVED REGION | | | |
| 0x0008 | REGISTER C | | | | RESERVED REGION | | | | | | | | | | |

FIRST BEHAVIOR LEVEL DESIGN DATA 851

Fig. 11A

| REGION HIERARCHY MANAGEMENT INFORMATION TABLE | | | 1051 |
|---|---|---|---|
| REGION NAME | SUBREGIONNAME | REGION HIERARCHY NAME | |
| REGION INSTANCE NAME | SUBREGIONINST | REGION HIERARCHY INSTANCE NAME | |
| HVSM_ILB_SUBREGION_TBL | | | |

Fig. 11B

| BLOCK HIERARCHY MANAGEMENT INFORMATION TABLE 1052 | |
|---|---|
| BLOCK NAME | BLOCKNAME |
| BLOCK INSTANCE NAME | BLOCKINST |
| REGION NAME | REGIONNAME |
| BLOCK HIERARCHY NAME | |
| BLOCK HIERARCHY INSTANCE NAME | |
| NAME OF REGION HIERARCHY TO WHICH BLOCK HIERARCHY INSTANCE BELONGS | |

HVSM_ILB_BLOCK_TBL

Fig. 11C

I/O REGISTER ACCESS MANAGEMENT INFORMATION TABLE ⟵1053

| BLOCK NAME | I/O REGISTER NAME | I/O REGISTER R/W ATTRIBUTE |
|---|---|---|
| BLOCKNAME | IOREGNAME | IOREGRWATTR |
| NAME OF BLOCK HIERARCHY ACCESSING I/O REGISTER | NAME OF I/O REGISTER ACCESSED BY CORRESPONDING BLOCK | R/W ATTRIBUTE FROM CORRESPONDING BLOCK TO I/O REGISTER |

HVSM_ILB_IOREGRW_TBL

Fig. 11D

| I/O REGISTER MANAGEMENT INFORMATION TABLE | | | 1054 |
|---|---|---|---|
| I/O REGISTER NAME | IOREGNAME | I/O REGISTER NAME | |
| I/O REGISTER BIT SIZE | IOREGSIZE | I/O REGISTER BIT SIZE | |
| I/O REGISTER PARITY ATTRIBUTE | IOREGPYATTR | PRESENCE/ABSENCE OF PARITY OF I/O REGISTER | |
| I/O REGISTER SCOPE STATUS | SCOPESTATUS | I/O REGISTER SCOPE STATUS | |
| I/O REGISTER SCOPE | SCOPENAME | I/O REGISTER SCOPE (CMN/REGION) | |
| HVSM_ILB_IOREG_TBL | | | |

Fig. 15A

| SCOPE MANAGEMENT EXPORT INFORMATION | | | 1061 |
|---|---|---|---|
| REGION NAME | REGIONNAME | REGIONINST | REGION INSTANCE NAME |
| REGION HIERARCHY NAME | | | REGION HIERARCHY INSTANCE NAME |

Fig. 15B

| ADDRESS MAP EXPORT INFORMATION | | |
|---|---|---|
| I/O REGISTER NAME | IOREGNAME | I/O REGISTER NAME |
| I/O REGISTER BIT SIZE | IOREGSIZE | I/O REGISTER BIT SIZE |
| I/O REGISTER PARITY ATTRIBUTE | IOREGPYATTR | PRESENCE/ABSENCE OF PARITY OF I/O REGISTER |
| I/O REGISTER SCOPE STATUS | SCOPESTATUS | I/O REGISTER SCOPE STATUS |
| I/O REGISTER SCOPE | SCOPENAME | I/O REGISTER SCOPE (CMN/REGION) |

| INTERNAL WORK TABLE | | |
|---|---|---|
| I/O REGISTER NAME | IOREGNAME | I/O REGISTER NAME |
| I/O REGISTER BIT SIZE | IOREGSIZE | BIT SIZE OF I/O REGISTER |
| I/O REGISTER PARITY ATTRIBUTE | IOREGPYATTR | PRESENCE/ABSENCE OF PARITY OF I/O REGISTER |
| I/O REGISTER SCOPE STATUS | SCOPESTATUS | I/O REGISTER SCOPE STATUS |
| I/O REGISTER SCOPE | SCOPENAME | I/O REGISTER SCOPE (CMN/REGION) |
| STATUS | STATUS | ADDRESS MAPPING STATUS OF I/O REGISTER |
| MAPPING LENGTH | COMMITSIZE | BIT SIZE OF I/O REGISTER SUBJECTED TO ADDRESS MAPPING |
| SCOPE | COMMITSCOPE | SCOPE TO WHICH I/O REGISTER IS MAPPED |
| INITIALIZATION STATUS | INITSTATUS | INITIALIZATION STATUS OF I/O REGISTER |
| HVSM_ILB_ADRMAPWORK_TBL | | |

HW REGISTER SETTING SCREEN 1900

| ⟨REGISTER INFORMATION⟩ | | | | | | | |
|---|---|---|---|---|---|---|---|
| LSI NAME | OUTLINE | SCOPE | REGISTER NAME | offset | REGISTER ATTRIBUTE | SPACE ATTRIBUTE | INITIAL VALUE |
| CHP | | CMN | REG000 | 0x0000 | NORMAL | NORMAL | 0x00000000 |

⟨BITMAP INFORMATION⟩

| BYTE | Bit | FUNCTION NAME | CONTENT | INITIAL VALUE |
|---|---|---|---|---|
| +0 | 31 | HREG00 | | 0 |
| | 30 | | | 0 |
| | 29 | | | 0 |
| | 28 | | | 0 |
| | 27 | | | 0 |
| | 26 | | | 0 |
| | 25 | | | 0 |
| | 24 | | | 0 |
| +1 | 23 | HREG01 | | 0 |
| | 22 | | | 0 |
| | 21 | | | 0 |
| | 20 | | | 0 |
| | 19 | | | 0 |
| | 18 | | | 0 |
| | 17 | | | 0 |
| | 16 | | | 0 |
| +2 | 15 | | | 0 |
| | 14 | | | 0 |
| | 13 | | | 0 |
| | 12 | | | 0 |
| | 11 | | | 0 |
| | 10 | | | 0 |
| | 9 | | | 0 |
| | 8 | | | 0 |
| +3 | 7 | HREG02[23:16] | | 0 |
| | 6 | | | 0 |
| | 5 | | | 0 |
| | 4 | | | 0 |
| | 3 | | | 0 |
| | 2 | | | 0 |
| | 1 | | | 0 |
| | 0 | | | 0 |

HREG02[23:16]

Fig. 19B

HW REGISTER SETTING SCREEN 1900

⟨REGISTER INFORMATION⟩ —1910

| REGION NAME | OUTLINE | SCOPE | REGISTER NAME | offset | REGISTER ATTRIBUTE | SPACE ATTRIBUTE | INITIAL VALUE |
|---|---|---|---|---|---|---|---|
| DMA | SAMPLE | CMN | REG000 | 0x0000 | NORMAL | PGEN | 0x00000000 |

⟨BITMAP INFORMATION⟩ —1920

| BYTE | Bit | FUNCTION NAME | CONTENT | INITIAL VALUE |
|---|---|---|---|---|
| +0 | 31 | HREG00 | | 0 |
| | 30 | | | 0 |
| | 29 | | | 0 |
| | 28 | | | 0 |
| | 27 | | | 0 |
| | 26 | | | 0 |
| | 25 | | | 0 |
| | 24 | | | 0 |
| +1 | 23 | | | 0 |
| | 22 | | | 0 |
| | 21 | | | 0 |
| | 20 | | | 0 |
| | 19 | | | 0 |
| | 18 | | | 0 |
| | 17 | | | 0 |
| | 16 | | | 0 |
| +2 | 15 | | | 0 |
| | 14 | | | 0 |
| | 13 | | | 0 |
| | 12 | | | 0 |
| | 11 | | | 0 |
| | 10 | | | 0 |
| | 9 | | | 0 |
| | 8 | | | 0 |
| +3 | 7 | | | 0 |
| | 6 | | | 0 |
| | 5 | | | 0 |
| | 4 | | | 0 |
| | 3 | | | 0 |
| | 2 | | | 0 |
| | 1 | | | 0 |
| | 0 | | | 0 |

HW REGISTER SETTING SCREEN 1900

<REGISTER INFORMATION> ← 1910

| REGION NAME | OUTLINE | SCOPE | REGISTER NAME | offset | REGISTER ATTRIBUTE | SPACE ATTRIBUTE | INITIAL VALUE |
|---|---|---|---|---|---|---|---|
| DMA | SAMPLE | CMN | REG000 | 0x0000 | NORMAL | PGEN | 0x00000000 |

<BITMAP INFORMATION> ← 1920   2010

| BYTE | Bit | FUNCTION NAME | CONTENT | INITIAL VALUE |
|---|---|---|---|---|
| +0 | 31 | | | 0 |
| | 30 | Reserved | | 0 |
| | 29 | HREG02 | | 0 |
| | 28 | HREG03 | | 0 |
| | 27 | HREG00 | | 0 |
| | 26 | HREG01 | | 0 |
| | 25 | HREG05 | | 0 |
| | 24 | HREG07 | | 0 |
| | | HREG04[7:0] | | |
| +1 | 23 | | | 0 |
| | 22 | | | 0 |
| | 21 | | | 0 |
| | 20 | | | 0 |
| | 19 | | | 0 |
| | 18 | | | 0 |
| | 17 | | | 0 |
| | 16 | | | 0 |
| +2 | 15 | | | 0 |
| | 14 | | | 0 |
| | 13 | | | 0 |
| | 12 | | | 0 |
| | 11 | | | 0 |
| | 10 | | | 0 |
| | 9 | | | 0 |
| | 8 | | | 0 |
| +3 | 7 | | | 0 |
| | 6 | | | 0 |
| | 5 | | | 0 |
| | 4 | | | 0 |
| | 3 | | | 0 |
| | 2 | | | 0 |
| | 1 | | | 0 |
| | 0 | | | 0 |

2010:
Reserved
HREG02
HREG03
HREG00
HREG01
HREG05
HREG07
HREG04[7:0]

Fig. 22A

SCOPE MANAGEMENT IMPORT INFORMATION 1661

| SCOPE MANAGEMENT IMPORT INFORMATION | | |
|---|---|---|
| I/O REGISTER UPPER ADDRESS | IOREGHADR | UPPER ADDRESS ALLOCATED TO I/O REGISTER BLOCK |
| I/O REGISTER SCOPE | SCOPENAME | I/O REGISTER SCOPE (CMN/REGION) |
| I/O REGISTER SCOPE INSTANCE NAME | SCOPEINST | SCOPE INSTANCE NAME |
| I/O BLOCK ID | IOREGBKID | ID OF I/O REGISTER BLOCK |

Fig. 22B

ADDRESS MAP IMPORT INFORMATION 1662

| ADDRESS MAP IMPORT INFORMATION | | |
|---|---|---|
| I/O REGISTER SCOPE | SCOPENAME | I/O REGISTER SCOPE (CMN/REGION) |
| I/O BLOCK ID | IOREGBKID | ID OF I/O REGISTER BLOCK |
| I/O REGISTER LOWER ADDRESS | IOREGLADR | LOWER ADDRESS ALLOCATED TO I/O REGISTER |
| SW REGISTER NAME | SWREGNAME | REGISTER NAME SEEN FROM SW |
| SW REGISTER ATTRIBUTE | SWREGATTR | REGISTER ATTRIBUTE SEEN FROM SW |
| SW REGISTER SPACE ATTRIBUTE | SWREGPYATTR | REGISTER SPACE ATTRIBUTE SEEN FROM SW |
| HW REGISTER NAME | HWREGNAME | REGISTER NAME SEEN FROM HW |
| HW REGISTER INITIAL VALUE | HWREGSINI | INITIAL VALUE OF CORRESPONDING HW REGISTER (SYNCHRONOUS RESET) *EXPRESSED IN BINARY |
| START BIT POSITION | HWREGSOP | START BIT POSITION OF CORRESPONDING HW REGISTER |
| STOP BIT POSITION | HWREGEOP | STOP BIT POSITION OF CORRESPONDING HW REGISTER |

Fig. 24A

| I/O BLOCK MANAGEMENT INFORMATION TABLE 2351 | | |
|---|---|---|
| I/O REGISTER UPPER ADDRESS | IOREGHADR | UPPER ADDRESS ALLOCATED TO I/O BLOCK |
| I/O REGISTER SCOPE | SCOPENAME | I/O REGISTER SCOPE (CMN/REGION) |
| I/O REGISTER SCOPE INSTANCE NAME | SCOPEINST | SCOPE INSTANCE NAME |
| I/O BLOCK ID | IOREGBKID | ID OF I/O REGISTER BLOCK |

Fig. 24B

| SW REGISTER MANAGEMENT INFORMATION TABLE | | 2352 |
|---|---|---|
| SW REGISTER NAME | SWREGNAME | REGISTER NAME SEEN FROM SW |
| SW REGISTER ATTRIBUTE | SWREGPYATTR | REGISTER ATTRIBUTE SEEN FROM SW |
| SW REGISTER SPACE ATTRIBUTE | HWREGNAME | REGISTER SPACE ATTRIBUTE SEEN FROM SW |
| I/O REGISTER LOWER ADDRESS | IOREGLADR | LOWER ADDRESS ALLOCATED TO I/O REGISTER |
| I/O REGISTER SCOPE | SCOPENAME | I/O REGISTER SCOPE (CMN/REGION) |
| I/O BLOCK ID | IOREGBKID | ID OF I/O REGISTER BLOCK |

Fig. 24C

| HW REGISTER MANAGEMENT INFORMATION TABLE | | 2353 |
|---|---|---|
| HW REGISTER NAME | HWREGNAME | REGISTER NAME SEEN FROM HW |
| SW REGISTER NAME | SWREGNAME | REGISTER NAME SEEN FROM SW |
| HW REGISTER INITIAL VALUE | HWREGSINI | INITIAL VALUE OF CORRESPONDING HW REGISTER (SYNCHRONOUS RESET) *EXPRESSED IN BINARY |
| START BIT POSITION | HWREGSOP | START BIT POSITION OF CORRESPONDING HW REGISTER |
| STOP BIT POSITION | HWREGEOP | STOP BIT POSITION OF CORRESPONDING HW REGISTER |

Fig. 28B

ADDRESS SPACE

| LOWER ADDRESS=0x0000 SPACE ATTRIBUTE=NORMAL | | | LOWER ADDRESS=0x0004 SPACE ATTRIBUTE=NORMAL | | | LOWER ADDRESS=0x0008 SPACE ATTRIBUTE=PGEN | | |
|---|---|---|---|---|---|---|---|---|
| BYTE | Bit | FUNCTION NAME | BYTE | Bit | FUNCTION NAME | BYTE | Bit | FUNCTION NAME |
| +0 | 31 | XREG | +0 | 31 | ZREG[31:0] | +0 | 31 | Reserved |
|  | 30 |  |  | 30 |  |  | 30 |  |
|  | 29 |  |  | 29 |  |  | 29 |  |
|  | 28 |  |  | 28 |  |  | 28 |  |
|  | 27 |  |  | 27 |  |  | 27 |  |
|  | 26 |  |  | 26 |  |  | 26 |  |
|  | 25 |  |  | 25 |  |  | 25 | AREG |
|  | 24 |  |  | 24 |  |  | 24 | Reserved |
| +1 | 23 | YREG | +1 | 23 |  | +1 | 23 |  |
|  | 22 |  |  | 22 |  |  | 22 |  |
|  | 21 |  |  | 21 |  |  | 21 |  |
|  | 20 |  |  | 20 |  |  | 20 |  |
|  | 19 |  |  | 19 |  |  | 19 |  |
|  | 18 |  |  | 18 |  |  | 18 |  |
|  | 17 |  |  | 17 |  |  | 17 |  |
|  | 16 |  |  | 16 |  |  | 16 |  |
| +2 | 15 |  | +2 | 15 |  | +2 | 15 |  |
|  | 14 |  |  | 14 |  |  | 14 |  |
|  | 13 |  |  | 13 |  |  | 13 |  |
|  | 12 |  |  | 12 |  |  | 12 |  |
|  | 11 |  |  | 11 |  |  | 11 |  |
|  | 10 |  |  | 10 |  |  | 10 |  |
|  | 9 |  |  | 9 |  |  | 9 |  |
|  | 8 |  |  | 8 |  |  | 8 |  |
| +3 | 7 | ZREG[39:32] | +3 | 7 |  | +3 | 7 |  |
|  | 6 |  |  | 6 |  |  | 6 | BREG |
|  | 5 |  |  | 5 |  |  | 5 | Reserved |
|  | 4 |  |  | 4 |  |  | 4 |  |
|  | 3 |  |  | 3 |  |  | 3 |  |
|  | 2 |  |  | 2 |  |  | 2 |  |
|  | 1 |  |  | 1 |  |  | 1 |  |
|  | 0 |  |  | 0 |  |  | 0 |  |

Fig. 28C

WRITE SIGNAL CONVERSION LOGIC

```
XREG_BE0 <= WEN and ADR0000 and BE(3);

YREG_BE0 <= WEN and ADR0000 and BE(2);
YREG_BE1 <= WEN and ADR0000 and BE(1);

ZREG_BE4 <= WEN and ADR0000 and BE(0);
ZREG_BE3 <= WEN and ADR0004 and BE(3);
ZREG_BE2 <= WEN and ADR0004 and BE(2);
ZREG_BE1 <= WEN and ADR0004 and BE(1);
ZREG_BE0 <= WEN and ADR0004 and BE(0);

AREG_BE0 <= WEN and ADR0008 and BE(3);

BREG_BE0 <= WEN and ADR0008 and BE(0);
```

Fig. 29B

ADDRESS SPACE

LOWER ADDRESS=0x0000
SPACE ATTRIBUTE=NORMAL

| BYTE | Bit | FUNCTION NAME |
|---|---|---|
| +0 | 31 | XREG |
| | 30 | |
| | 29 | |
| | 28 | |
| | 27 | |
| | 26 | |
| | 25 | |
| | 24 | |
| +1 | 23 | YREG |
| | 22 | |
| | 21 | |
| | 20 | |
| | 19 | |
| | 18 | |
| | 17 | |
| | 16 | |
| +2 | 15 | |
| | 14 | |
| | 13 | |
| | 12 | |
| | 11 | |
| | 10 | |
| | 9 | |
| | 8 | |
| +3 | 7 | ZREG[39:32] |
| | 6 | |
| | 5 | |
| | 4 | |
| | 3 | |
| | 2 | |
| | 1 | |
| | 0 | |

LOWER ADDRESS=0x0004
SPACE ATTRIBUTE=NORMAL

| BYTE | Bit | FUNCTION NAME |
|---|---|---|
| +0 | 31 | ZREG[31:0] |
| | 30 | |
| | 29 | |
| | 28 | |
| | 27 | |
| | 26 | |
| | 25 | |
| | 24 | |
| +1 | 23 | |
| | 22 | |
| | 21 | |
| | 20 | |
| | 19 | |
| | 18 | |
| | 17 | |
| | 16 | |
| +2 | 15 | |
| | 14 | |
| | 13 | |
| | 12 | |
| | 11 | |
| | 10 | |
| | 9 | |
| | 8 | |
| +3 | 7 | |
| | 6 | |
| | 5 | |
| | 4 | |
| | 3 | |
| | 2 | |
| | 1 | |
| | 0 | |

LOWER ADDRESS=0x0008
SPACE ATTRIBUTE=PGEN

| BYTE | Bit | FUNCTION NAME |
|---|---|---|
| +0 | 31 | Reserved |
| | 30 | |
| | 29 | |
| | 28 | |
| | 27 | |
| | 26 | |
| | 25 | AREG |
| | 24 | Reserved |
| +1 | 23 | |
| | 22 | |
| | 21 | |
| | 20 | |
| | 19 | |
| | 18 | |
| | 17 | |
| | 16 | |
| +2 | 15 | |
| | 14 | |
| | 13 | |
| | 12 | |
| | 11 | |
| | 10 | |
| | 9 | |
| | 8 | |
| +3 | 7 | |
| | 6 | BREG |
| | 5 | Reserved |
| | 4 | |
| | 3 | |
| | 2 | |
| | 1 | |
| | 0 | |

Fig. 29C

NORMAL SPACE SIGNAL CONVERSION LOGIC

```
REG0000_RDDT(35)                <= XREG_RDDT(8);
REG0000_RDDT(34)                <= YREG_RDDT(17);
REG0000_RDDT(33)                <= YREG_RDDT(16);
REG0000_RDDT(32)                <= ZREG_RDDT(44);

REG0000_RDDT(31 downto 24)      <= XREG_RDDT(7 downto 0);
REG0000_RDDT(23 downto 8)       <= YREG_RDDT(15 downto 0);
REG0000_RDDT(7 downto 0)        <= ZREG_RDDT(39 downto 32);

REG0004_RDDT(35)                <= ZREG_RDDT(43);
REG0004_RDDT(34)                <= ZREG_RDDT(42);

REG0004_RDDT(33)                <= ZREG_RDDT(41);
REG0004_RDDT(32)                <= ZREG_RDDT(40);
REG0004_RDDT(31 downto 0)       <= ZREG_RDDT(31 downto 0);
```

Fig. 29D

PGEN SPACE SIGNAL CONVERSION LOGIC

```
REG0008_RDDT(35) <= '1' xor '0' xor AREG(0) xor '0' xor '0' xor '0' xor '0' xor '0' xor '0' xor '0';
REG0008_RDDT(34) <= '1' xor '0' xor '0' xor '0' xor '0' xor '0' xor '0' xor '0' xor '0' xor '0';
REG0008_RDDT(33) <= '1' xor '0' xor '0' xor '0' xor '0' xor '0' xor '0' xor '0' xor '0' xor '0';
REG0008_RDDT(32) <= '1' xor '0' xor '0' xor '0' xor '0' xor '0' xor '0' xor BREG(0) xor '0';
REG0008_RDDT(31 downto 24) <= "000000" & AREG(0) & '0';
REG0008_RDDT(23 downto 16) <= "00000000";
REG0008_RDDT(15 downto 8)  <= "00000000";
REG0008_RDDT(7 downto 0)   <= '0' & BREG(0) & "000000";
```

Fig. 31B

```
ZREG_WDATAB0 <= ZREG_WDATA(32) & ZREG_WDATA(7 downto 0);
ZREG_WDATAB1 <= ZREG_WDATA(35) & ZREG_WDATA(31 downto 24);
ZREG_WDATAB2 <= ZREG_WDATA(34) & ZREG_WDATA(23 downto 16);
ZREG_WDATAB3 <= ZREG_WDATA(33) & ZREG_WDATA(15 downto 8);
ZREG_WDATAB4 <= ZREG_WDATA(32) & ZREG_WDATA(7 downto 0);
```

LOGICAL FORMULA FOR BYTE DECOMPRESSION

SUPPORT SYSTEM AND METHOD FOR MANUFACTURING INTEGRATED CIRCUIT

TECHNICAL FIELD

The present invention relates to a design support system and a method for manufacturing an integrated circuit, and particularly, relates to a technique for efficiently manufacturing an integrated circuit including an I/O register.

BACKGROUND ART

In a design system for hardware, in order to facilitate extraction and coding of registers in hardware design, PTL 1 discloses, for example: extracting hardware registers from an abstract message sequence between a software model and a hardware model, and presenting the extracted hardware registers; customizing an address and a bit field of each hardware register thus extracted; integrating multiple registers with respect to a group of the extracted hardware registers, and tiering the group of extracted hardware registers; and generating a specification of the group of hardware registers thus customized.

Citation List

Patent Literature

PTL 1: Japanese Patent Application Laid-Open Publication No. 2005-327192

SUMMARY OF INVENTION

Technical Problem

I/O Registers, which are an internal structure of an integrated circuit mounted on a storage apparatus, are a critical part that stores control information for input and output of data to and from a storage. Thus, high reliability is required for such I/O registers. For that reason, the I/O registers have been devised with various techniques such as error detection, memory protection, and batch initialization.

Generally, employed for existing design of I/O registers is a method where addresses are allocated to I/O registers, which are disposed by hand, per circuit in accordance with the RTL design approach. Although general-purpose tools that automatically generate I/O register circuits exist, these tools cannot satisfy a detailed demand in the system development sectors of storage apparatuses. For this reason, such design largely depends on manpower.

In recent years, the number of control information between an MPU and I/O registers and the number of I/O registers needed have been increasing with larger scale circuits. Thus, it is getting difficult to deal with such needs with the conventional design method.

For example, with respect to logical design, increase in design man hour (input man hour/verification man hour) by hand and deterioration in quality makes it difficult to detect or suppress constraint violation in design for accessing I/O registers. With respect to mounting, increase in concentrated wiring and long distance wiring makes timing convergence difficult. Moreover, with respect to system development, there has been a problem of ensuring consistency between an address map (document for software design) and actual circuits along with change in specification. The present invention has been made in consideration of such a background. An object of the present invention is to provide a design support system and a method for manufacturing an integrated circuit that allow efficient manufacturing of an integrated circuit including an I/O register.

Solution to Problem

To achieve the above-mentioned object, a main aspect of the present invention is a design support system that is used for design of an integrated circuit and that is an information apparatus having a user interface, the integrated circuit including an interface circuit for communicating with a processor device that implements a predetermined function by executing a program;

a user logical circuit that is hardware implementing a predetermined function; and an I/O register circuit having an I/O register used for transmission and receipt of data between the processor device and the user logical circuit. The design support system includes:

an I/O register access information extracting part that generates I/O register access information on the basis of first behavior level design data which is design data at a behavior level subjected to modeling for the integrated circuit, the I/O register access information including information on access control from the user logical circuit to the I/O register and information on a specification of the I/O register;

an address map edit processing part that generates address map information including information on an association of an SW register with an HW register, on the basis of the I/O register access information and association of an SW address with an HW address, the association of the SW address with the HW address being acquired through the user interface, the SW register being a register defined on the processor device side, the HW register being a register defined on the user logical circuit side, the SW address being an address used when the processor device accesses the I/O register, the HW address being an address used when the user logical circuit accesses the I/O register; and an I/O register automatic generating part that generates second behavior level design data which is design data at the behavior level describing an internal structure of the I/O register circuit described in the first behavior level design data, on the basis of the first behavior level design data and the address map information.

In the design support system of the present invention, on the basis of the first behavior level design data, the I/O register access information extracting part generates the I/O register access information including information on access control (scope) from the user logical circuit to the I/O register and information on a specification of the I/O register. On the basis of the I/O register access information and the association of the SW address with HW address acquired through the user interface, the address map edit processing part generates the address map information including information on the association of the SW register with the HW register. On the basis of the first behavior level design data and the address map information, the I/O register automatic generating part generates the second behavior level design data that is design data at the behavior level describing an internal structure of the I/O register circuit described in the first behavior level design data. Thus, according to the design support system of the present invention, by only setting correctly the association of the SW address with the HW address, a user can easily generate the second behavior level design data that describes the internal structure of the I/O register circuit, on the basis of the first behavior level design data subjected to modeling.

Another aspect of the present invention is the above-mentioned design support system in which circuits that form the integrated circuit are classified into tiered groups and managed. The I/O register access information outputted by the I/O register access information extracting part includes information on at least one of:

an I/O register scope that is information on access permission from the groups to the I/O register;

an I/O register scope status that is information set in accordance with existence of writing of data from the groups to the I/O register or reading of data from the I/O register to the groups;

an I/O register bit size that is information on a bit size of the I/O register; and an I/O register parity attribute that is information on existence of parity of the I/O register. The address map edit processing part presents, through the user interface, a screen that visually expresses an unallocated area of an HW register when acquiring a setting to allocate, to the SW register, the HW register having a bit size larger than a bit size of the SW register. As a candidate for an HW register to be associated with an SW register, the address map edit processing part presents, through the user interface, the HW register in which the unallocated area remains when acquiring the setting to allocate, to the SW register, the HW register having a bit size larger than a bit size of the SW register. The I/O register access information outputted by the I/O register access information extracting part includes the I/O register scope as the information on the access control of the I/O register, the I/O register scope being the information on the access permission from the groups to the I/O register. The I/O register access information outputted by the I/O register access information extracting part includes the I/O register parity attribute as the information on the specification of the I/O register, the I/O register parity attribute being the information on the existence of the parity of the I/O register. The address map edit processing part acquires, through the user interface, a setting of a space attribute that is information on existence of parity of the SW register. As the candidate for the HW register to be associated with the SW register, the address map edit processing part presents, through the user interface, an HW register in which information on access control to the SW register and the I/O register scope coincide, and the space attribute and the I/O register parity attribute coincide. As the internal structure of the I/O register circuit, the I/O register automatic generating part generates:

a register write space conversion circuit that performs signal conversion between the SW address and the HW address in accordance with the address map information in writing of data to the I/O register;

a register read space conversion circuit that performs signal conversion from the SW address to the HW address in accordance with the address map information in reading of data from the I/O register; and a register circuit that is an entity of the I/O register, and writes data to or reads data from the processor device through the register write space conversion circuit and the register read space conversion circuit. The I/O register automatic generating part generates any one of the register write space conversion circuit and the register read space conversion circuit, which has a circuit that converts a plurality of the SW addresses of a plurality of the SW registers into the address of the one HW register. The address map edit processing part acquires, through the user interface, the setting of the space attribute that is the information on the existence of the parity of the SW register. The I/O register automatic generating part provides, in the register read space conversion circuit, a logical circuit for allowing the SW register to take over parity held by the HW register when a content of the space attribute of the SW register associated with the register circuit thus generated shows that parity exists. The I/O register automatic generating part provides, in the register read space conversion circuit, a logical circuit for generating a value of parity to be given to the SW register when the content of the space attribute of the SW register associated with the register circuit thus generated shows that no parity exists. The address map edit processing part accepts, through the user interface, a register attribute that is information on access control to the SW register. The I/O register access information outputted by the I/O register access information extracting part includes register information as information on the specification of the I/O register. The register circuit includes:

the entity of the I/O register;

a partial-write circuit that generates data to be written into the I/O register in accordance with the address map information on the basis of data inputted from the register write space conversion circuit;

a multiplexer that writes the data generated by the partial-write circuit into the I/O register; and a controller circuit that controls the multiplexer in accordance with the register attribute to allow or prohibit writing of the data into the I/O register by the multiplexer.

According to the present invention, when acquiring a setting to allocate, to the SW register, an HW register having a bit size larger than a bit size of the SW register, the address map edit processing part presents, through the user interface, a screen that visually expresses an unallocated area of the HW register. Thus, by visually expressing and presenting the unallocated area, the user can intuitively and easily recognize that the size of the SW register and the size of the HW register are not identical, and that the unallocated area exists in the HW register. Accordingly, the user can correctly grasp a use state of the HW register, and can suppress design errors.

When acquiring a setting to allocate, to the SW register, the HW register having a bit size larger than a bit size of the SW register, the address map edit processing part presents, through the user interface, the HW register in which the unallocated area remains as a candidate for an HW register to be associated with an SW register. Accordingly, the user can effectively utilize the HW register, without managing the HW register in which an unallocated area remains.

The address map edit processing part acquires a setting of a space attribute that is the information on existence of parity of the SW register, and through the user interface, presents an HW register in which information on access control to the SW register and the I/O register scope coincide, and the space attribute and the I/O register parity attribute coincide, as the candidate for the HW register to be associated with the SW register.

Thus, since the HW register meeting a specification and design constraints of the SW register is automatically presented as a candidate, the user can associate the SW register with the HW register easily and simply, without checking a specification and design constraints of the SW register and the HW register one by one.

As the internal structure of the I/O register circuit, the I/O register automatic generating part generates: the register write space conversion circuit that performs signal conversion between the SW address and the HW address in accordance with the address map information in writing of data to the I/O register; the register read space conversion circuit that performs signal conversion from the SW address to the HW address in accordance with the address map information in reading of data from the I/O register; and the register circuit that is an entity of the I/O register, and writes data to or reads data from the processor device through the register write space conversion circuit and the register read space conversion circuit.

Thus, when generating the internal structure of the I/O register circuit, the I/O register automatic generating part generates the register circuit that is an entity of the I/O register, as well as generates the register write space conversion circuit and the register read space conversion circuit which act as an interface between this register circuit and the processor device side. By automatically generating the register circuit, the register write space conversion circuit, and the register read space conversion circuit at the same time in such a way, it is possible to reduce occurrence of concentrated wiring and long distance wiring, which may be caused when these circuits are separately generated.

When an HW register having a bit size larger than a bit size of an SW register is allocated to the SW register, the I/O register automatic generating part generates the register write space conversion circuit or the register read space conversion circuit, which has a circuit that converts SW addresses of multiple SW registers into an address of one HW register.

Thus, according to the present invention, even when the HW register is allocated to the multiple SW registers, the register write space conversion circuit and the register read space conversion circuit corresponding to such allocation can be automatically generated.

Through the user interface, the address map edit processing part acquires the setting of the space attribute that is information on existence of parity of the SW register. When a content of the space attribute of the SW register associated with the register circuit thus generated shows that parity exists, the I/O register automatic generating part provides, in the register read space conversion circuit, a logical circuit for allowing the SW register to take over parity held by the HW register. When the content of the space attribute of the SW register associated with the register circuit thus generated shows that no parity exists, the I/O register automatic generating part provides, in the register read space conversion circuit, a logical circuit for generating a value of parity to be given to the SW register.

Thus, according to the present invention, in accordance with the existence of the parity, the logical circuit for allowing the SW register to take over the parity from the HW register and the logical circuit for generating a value of parity to be given to the SW register are automatically generated. Accordingly, the user can generate the register read space conversion circuit that appropriately operates in accordance with existence of the parity of the SW register, without managing existence of the parity of the SW register.

Through the user interface, the address map edit processing part accepts the register attribute that is the information on access control to the SW register. The I/O register access information outputted by the I/O register access information extracting part includes register information as information on a specification of the I/O register. The register circuit to be generated includes: the entity of the I/O register; the partial-write circuit that generates data to be written into the I/O register in accordance with the address map information on the basis of data, inputted from the register write space conversion circuit; the multiplexer that writes the data generated by the partial-write circuit into the I/O register; and the controller circuit that allows or prohibits writing of data to the I/O register by the multiplexer by controlling the multiplexer in accordance with the register attribute.

Thus, according to the present invention, the register circuit including the controller circuit that allows or prohibits writing of data to the I/O register by the multiplexer by controlling the multiplexer in accordance with the register attribute of the SW register, is automatically generated. Accordingly, the user can generate a register circuit having a desired register attribute by only specifying the register attribute for the SW register.

In addition, the problems and solutions disclosed by this application will be clarified with descriptions of embodiments of the invention and the drawings.

Advantageous Effects Of Invention

According to the present invention, an integrated circuit including an I/O register can be efficiently manufactured.

BRIEF DESCRIPTION OF DRAWINGS

FIG. 4 is a diagram showing an address map of I/O registers.

FIG. 11A is a diagram showing a data structure of a region hierarchy management information table 1051.

FIG. 11B is a diagram showing a data structure of a block hierarchy management information table 1052.

FIG. 11C is a diagram showing a data structure of an I/O register access management information table 1053.

FIG. 11D is a diagram showing a data structure of an I/O register management information table 1054.

FIG. 15A is a diagram showing a data structure of scope management export information 1061.

FIG. 15B is a diagram showing a data structure of address map export information 1062.

FIG. 17 is a diagram showing a data structure of an internal work table 1700.

FIG. 19A shows an example of an HW register setting screen 1900.

FIG. 19B shows an example of the HW register setting screen 1900.

FIG. 20 shows an example of the HW register setting screen 1900.

FIG. 22A is a diagram showing a data structure of scope management import information 1661.

FIG. 22B is a diagram showing a data structure of address map import information 1662.

FIG. 24A is a diagram showing a data structure of an I/O block management information table 2351.

FIG. 24B is a diagram showing a data structure of an SW register management information table 2352.

FIG. 24C is a diagram showing a data structure of an HW register management information table 2353.

FIG. 28B is a diagram illustrating logic of signal conversion of the register write space conversion circuit 272.

FIG. 28C is a diagram illustrating logic of signal conversion of the register write space conversion circuit 272.

FIG. 29B is a diagram illustrating logic of signal conversion of the register read space conversion circuit 273.

FIG. 29C is a diagram illustrating logic of signal conversion of the register read space conversion circuit 273.

FIG. 29D is a diagram illustrating logic of signal conversion of the register read space conversion circuit 273.

FIG. 31B is a diagram showing a logical formula for byte decompression.

DESCRIPTION OF EMBODIMENTS

Hereinafter, as one embodiment, description will be given on a design support system 1 used for design of an integrated circuit. The design support system 1 includes a function as an EDA tool (EDA: Electronic Design Automation). The design support system 1 supports the work of the user in designing an integrated circuit (LSI (Large Scale Integration)) used as a component of a storage apparatus 10.

Figure 1:
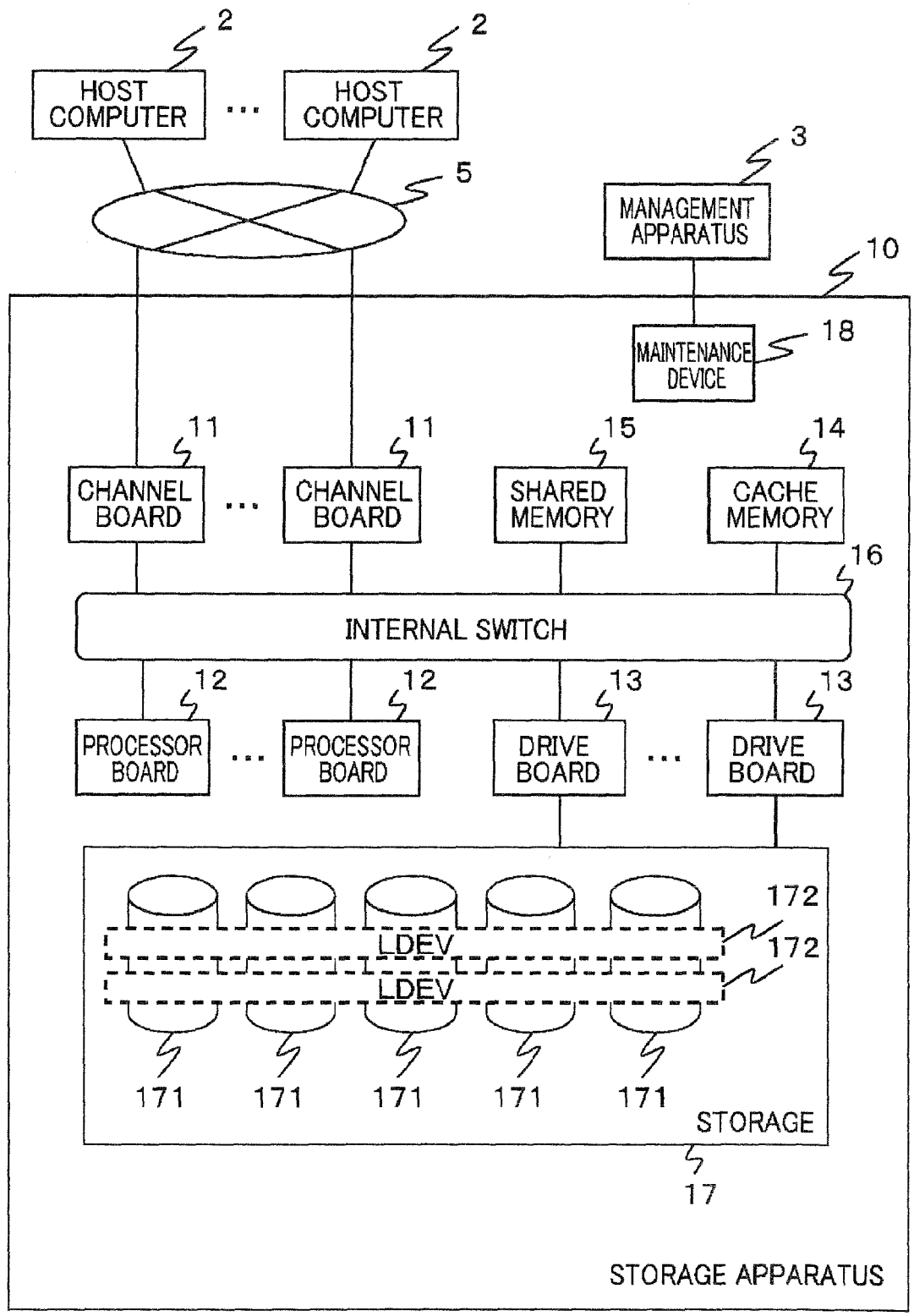
FIG. 1 is a diagram showing an example of the configuration of a storage apparatus 10 using an integrated circuit designed by use of a design support system 1.

FIG. 1 shows an example of the configuration of the storage apparatus 10 using the above-mentioned integrated circuit designed by use of the design support system 1 of this embodiment. As shown in FIG. 1, host computers 2 (external apparatuses) are communicably coupled to the storage apparatus 10 through a communication network 5. A management apparatus 3 that performs setting, control, monitoring, and the like on the storage apparatus 10 is also communicably coupled to the storage apparatus 10 through a LAN (Local Area Network), or the like.

The communication network 5 that couples each host computer 2 and the storage apparatus 10 is, for example, a LAN, a SAN (Storage Area Network), the Internet, a public communication network, or the like. Communications between these is performed, for example, in accordance with protocols such as TCP/IP, iSCSI (internet Small Computer System Interface), Fibre Channel protocol, FICON (Fibre Connection) (registered trademark), ESCON (Enterprise System Connection) (registered trademark), ACONARC (Advanced Connection Architecture) (registered trademark), and FIBARC (Fibre Connection Architecture) (registered trademark).

The host computer 2 is an information apparatus (computer) that uses a storage area provided by the storage apparatus 10. For example, the host computers 2 are formed by using hardware, such as personal computers, mainframes (Mainframe), and office computers. Each host computer 2 sends a data I/O request to the storage apparatus 10 when accessing the above-mentioned storage area.

As shown in FIG. 1, the storage apparatus 10 includes one or more channel boards 11, one or more processor boards 12 (Micro Processor), one or more drive boards 13, a cache memory 14 (Cache Memory), a shared memory 15 (Shared Memory), an internal switch 16, a storage 17, and a maintenance device 18 (SVP: Service Processor). The channel boards 11, the processor boards 12, the drive boards 13, the cache memory 14, and the shared memory 15 are communicably coupled to one another through the internal switch 16.

Each channel board 11 accepts a data I/O request (data write request, data read request, etc.) sent from the host computer 2, and sends a response on processing for the accepted data I/O request (for example, read data, read completion report, and write completion report) to the host computer 2. The channel board 11 has a function with respect to protocol control so as to communicate with the host computer 2.

In response to the above-mentioned data I/O request received by the channel board 11, each processor board 12 executes processing on data transfer performed among the channel boards 11, the drive boards 13, and the cache memory 14. The processor board 12 performs, for example, delivery of data between the channel boards 11 and the drive boards 13 (data read from the storage 17, data to be written into the storage 17) performed through the cache memory 14, and staging (reading data from the storage 17) and destaging (writing data to the storage 17) of the data stored in the cache memory 14.

The cache memory 14 is formed, for example, by using a RAM (Random Access Memory) that allows high speed access. The cache memory 14 stores therein data to be written into the storage 17 (hereinafter, referred to as write data) and data read from the storage 17 (hereinafter, described as read data). The shared memory 15 stores therein a variety of information used for control of the storage apparatus 10.

Each drive board 13 performs communications with the storage 17 at the time of reading data from the storage 17 or writing data into the storage 17. The internal switch 16 is formed, for example, by using a high-speed cross bar switch (Cross Bar Switch). Communications performed through the internal switch 16 is performed in accordance with protocols such as Fibre Channel, iSCSI, and TCP/IP, for example.

The storage 17 is formed of multiple storage media (hard disk drives, semiconductor memories (SSD (Solid State Drive) and the like)). In the description below, the storage 17 is assumed to be formed by using hard disk drives of types of, for example, SAS (Serial Attached SCSI), SATA (Serial ATA), FC (Fibre Channel), PATA (Parallel ATA), SCSI, or semiconductor memories (SSD) (hereinafter, storage media such as hard disk drives and semiconductor memories are generically referred to as storage drives 171).

The storage 17 provides a storage area in units of logical devices (LDEVs 172 (LDEV: logical Device)). Each logical device is formed by using a storage area provided in such a way that the storage drive 171 is controlled through a control method such as RAID (Redundant Arrays of Inexpensive (or Independent) Disks) (for example, a storage area of a RAID group (a parity group (Parity Group))). As described later, the storage apparatus 10 provides, to the host computer 2, a logical storage area (hereinafter, referred to as an LU (Logical Unit)) formed by using the LDEV 172.

Figure 2A:
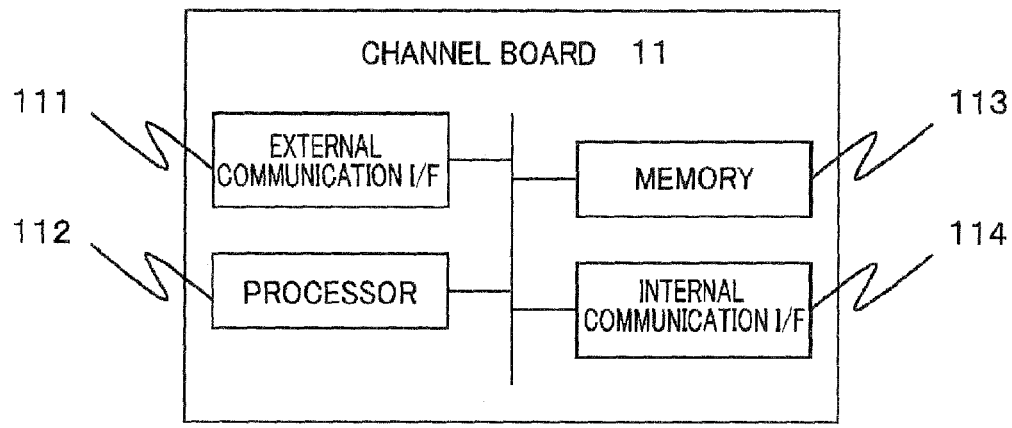
FIG. 2A is a diagram showing a hardware configuration of a channel board 11.

FIG. 2A shows a hardware configuration of the channel board 11. The channel board 11 includes an external communication interface (hereinafter, described as an external communication I/F 111) having a port (communication port) for communicating with the host computer 2, a processor 112 (including a frame processing chip and a frame transfer chip which are to be described later), a memory 113, an internal communication interface (hereinafter, described as an internal communication I/F 114) having a port (communication port) for communicating with the processor board 12.

Out of these, the external communication I/F 111 is formed, for example, by using an NIC (Network Interface Card) or an HBA (Host Bus Adaptor). The processor 112 is formed, for example, by using a CPU (Central Processing Unit) or an MPU (Micro Processing Unit). The memory 113 is a RAM (Random Access Memory) or a ROM (Read Only Memory). The internal communication I/F 114 performs communications with the processor board 12, the drive board 13, the cache memory 14, and the shared memory 15 through the internal switch 16.

Figure 2B:
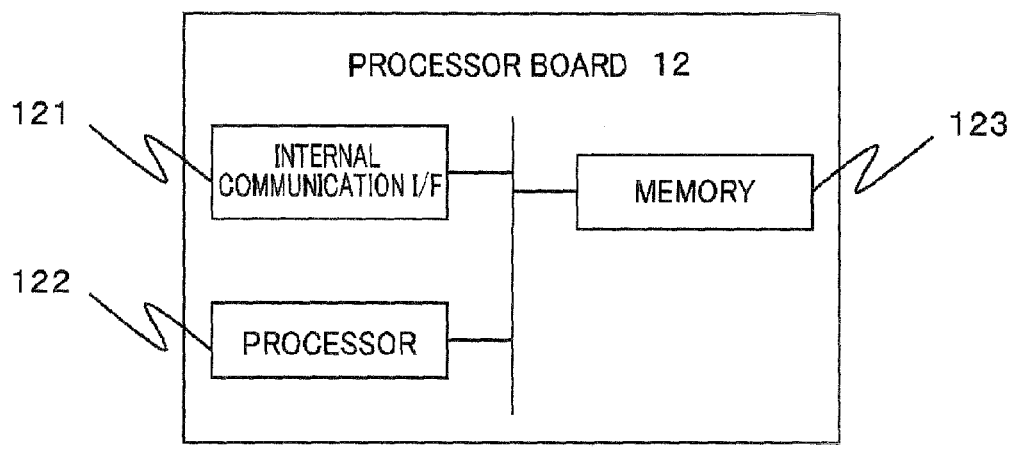
FIG. 2B is a diagram showing a hardware configuration of a processor board 12.

FIG. 2B shows a hardware configuration of the processor board 12. The processor board 12 includes an internal communication interface (hereinafter, written as an internal communication I/F 121), a processor 122, and a memory 123 (local memory) with higher access performance (higher speed accessibility) from the processor 122 than the shared memory 15. The internal communication I/F 121 performs communications with the channel board 11, the drive board 13, the cache memory 14, and the shared memory 15 through the internal switch 16. The processor 122 is, for example, a CPU, an MPU, or a DMA (Direct Memory Access). The memory 123 is a RAM or a ROM. While the processor 122 can access both of the memory 123 and the shared memory 15, from a viewpoint of the processor 122, the memory 123 has an access speed higher than that of the shared memory 15 (has higher access performance). Accordingly, the memory 123 has access cost smaller than that of the shared memory 15.

Figure 2C:
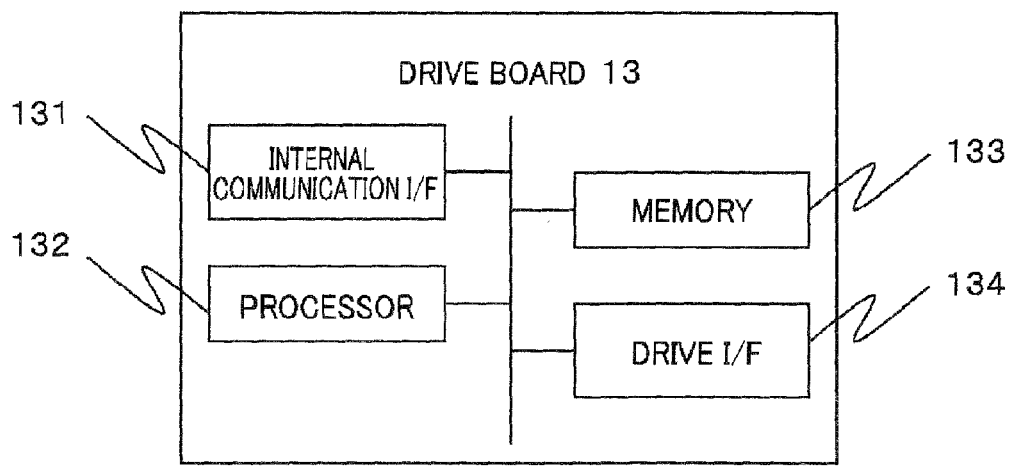
FIG. 2C is a diagram showing a hardware configuration of a drive board 13.

FIG. 2C shows a hardware configuration of the drive board 13. The drive board 13 includes an internal communication interface (hereinafter, described as an internal communication I/F 131), a processor 132, a memory 133, and a drive interface (hereinafter, described as a drive I/F 134). The internal communication I/F 131 communicates with the channel board 11, the processor board 12, the cache memory 14, and the shared memory 15 through the internal switch 16. The processor 132 is, for example, a CPU or an MPU. The memory 133 is, for example, a RAM or a ROM. The drive I/F 134 communicates with the storage 17.

The maintenance device 18 is a computer including a CPU and a memory. The maintenance device 18 controls each component of the storage apparatus 10, and monitors the state thereof. The maintenance device 18 communicates with the components of the storage apparatus 10, such as the channel board 11, the processor board 12, the drive board 13, the cache memory 14, the shared memory 15, and the internal switch 16, through communication means such as the internal switch 16, a LAN, or the like. The maintenance device 18 acquires operation information and the like from each component of the storage apparatus 10 at any time, and provides the management apparatus 3 with the information. The maintenance device 18 performs various settings, control, maintenance (installation and update of software), and the like on each component in accordance with the information sent from the management apparatus 3.

Configuration of Integrated Circuit

Figure 3:
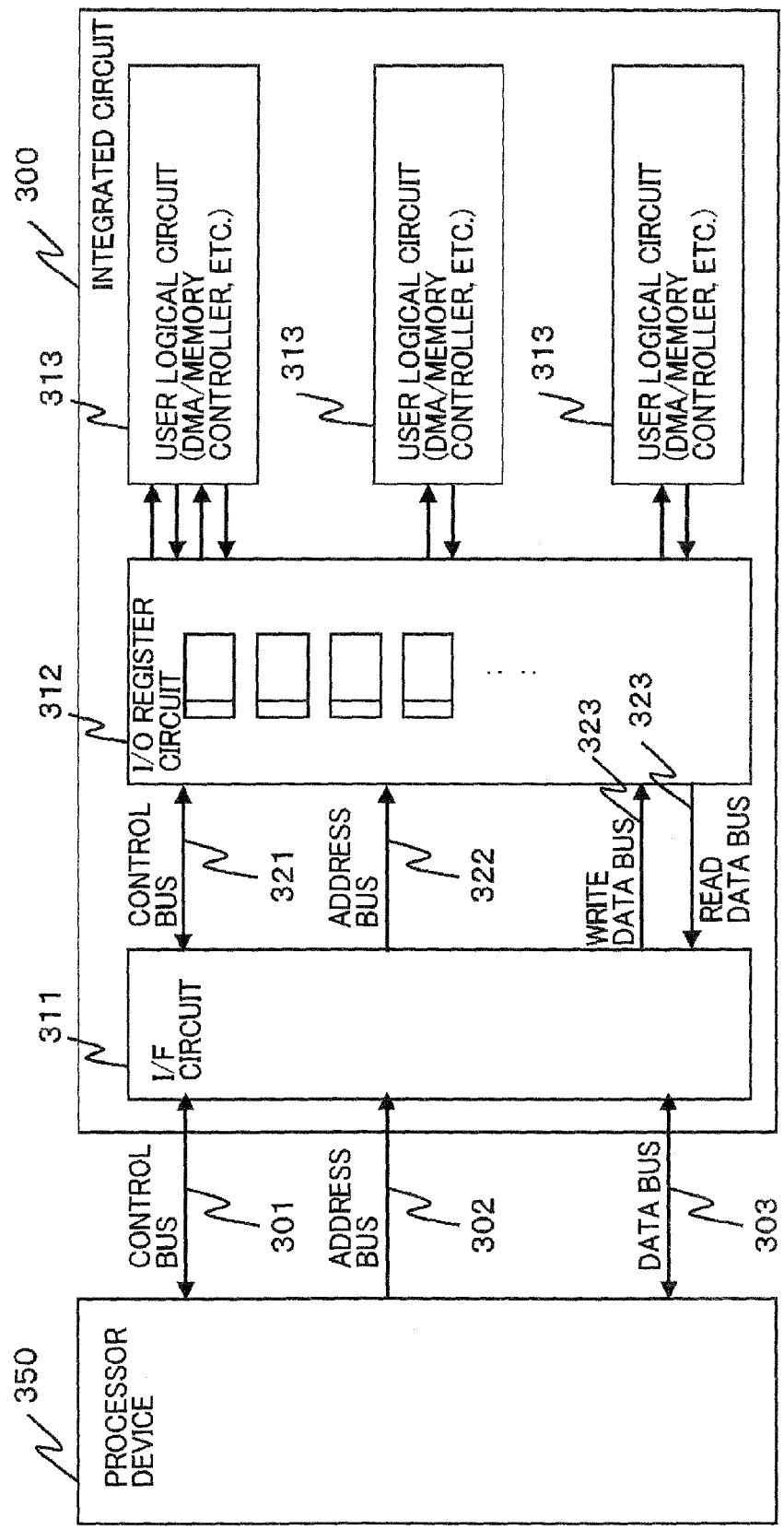
FIG. 3 is a diagram showing a schematic configuration of an integrated circuit 300.

FIG. 3 shows a schematic configuration of an integrated circuit 300, which the design support system 1 of this embodiment designs. The integrated circuit 300 is a programmable logic device such as an ASIC (Application Specific Integrated Circuit), an FPGA (Field Programmable Gate Array), a CPLD (Complex Programmable Logic Device), etc. The integrated circuit 300 is, for example, a component of the processor board 12 mentioned above.

The integrated circuit 300 is communicably coupled to a processor device 350 through a control bus 301, an address bus 302, and a data bus 303. The processor device 350 is formed, for example, by using a commercially available CPU or MPU. The processor device 350 operates by reading and executing a program in an executable form (run-time program generated by compiling a source code described with a programming language such as a C language or an assembler) stored in a storage such as a memory.

As shown in FIG. 3, the integrated circuit 300 includes an interface circuit (hereinafter, referred to as an I/F circuit 311), an I/O register circuit 312, and one or more user logical circuits 313. Out of these, the I/F circuit 311 communicates with the processor device 350 through a control bus 321, an address bus 322, and a data bus 323 that are formed within the integrated circuit. Each user logical circuit 313 is, for example, a DMA (Direct Memory Access) or a memory controller (Memory Controller). Each user logical circuit 313 communicates with the I/O register circuit 312, and accesses an I/O register within the I/O register circuit 312.

The I/O register circuit 312 includes I/O registers used at the time of, for example, transmission and receipt of control information performed between the processor device 350 and the user logical circuit 313. The processor device 350 transmits information to the user logical circuit 313 by writing data into an I/O register. On the other hand, the processor device 350 acquires data from the user logical circuit 313 by reading the data written into an I/O register by the user logical circuit 313.

For example, when the processor device 350 writes a value of "1," which means start of operation, into an address of "0x1000" in which a value of an operation start flag of the user logical circuit 313 is stored, the user logical circuit 313 that monitors an I/O register associated with the "0x1000" address begins to operate. Moreover, for example, when the user logical circuit 313 writes a value into an I/O register, the processor device 350 acquires information outputted from the user logical circuit 313 by referring to the address "0x2000" associated with the I/O register.

Access Method to I/O Register

Access from the processor device 350 to an I/O register performed through the address buses is performed by specifying an address of a fixed length, such as 4 bytes or 8 bytes, which is determined in accordance with constraints of the bus width of the processor device 350. On the other hand, the user logical circuit 313 can access an I/O register by specifying an address with any data size (bit size).

FIG. 4 shows an address map of the I/O registers. The processor device 350 can access an I/O register by specifying an address in units of rows (in the drawing, in units of 32 bits (4 bytes)) of the address map shown in FIG. 4. On the other hand, the user logical circuit 313 can access an I/O register by specifying any address (1 bit or more) of the address map shown in FIG. 4.

Hierarchy Structure

Circuits that form in the integrated circuit 300 are classified into tiered groups and thus managed. In accordance with this management structure, data on a circuit configuration of the integrated circuit 300 (hereinafter, referred to as design data) is described.

Figure 5A:
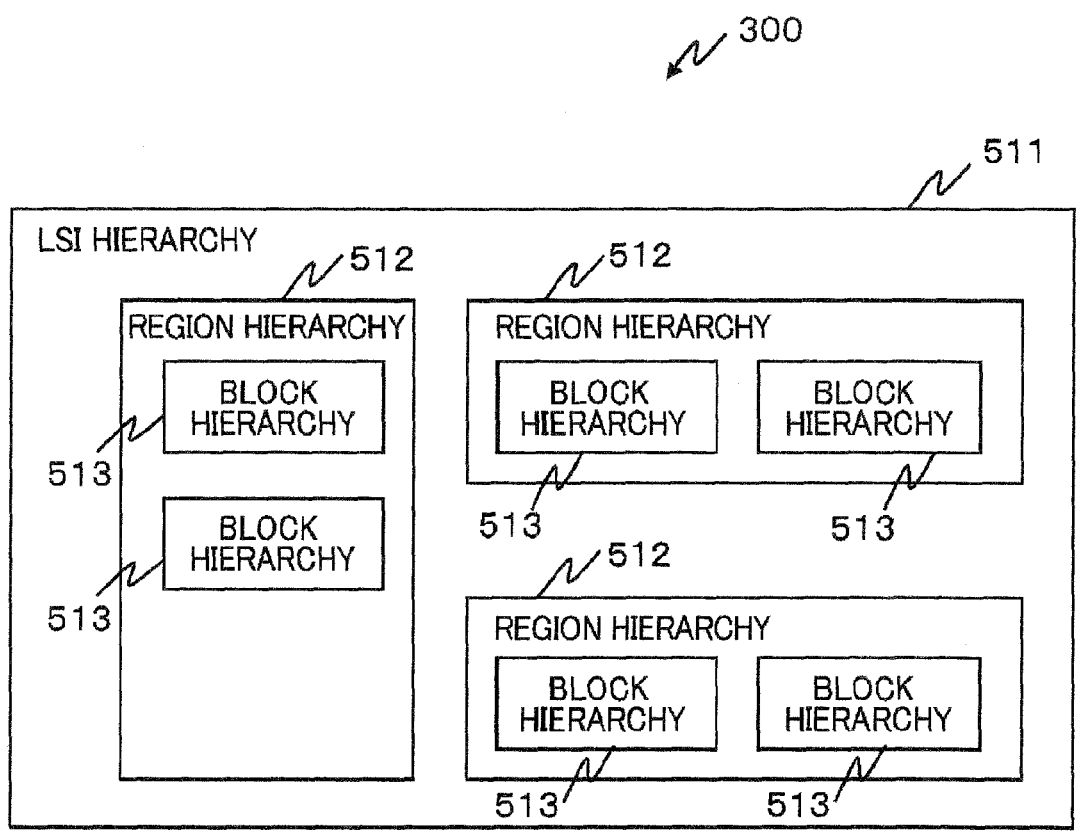
FIG. 5A is a diagram illustrating a management structure for circuits forming the integrated circuit 300.
Figure 5B:
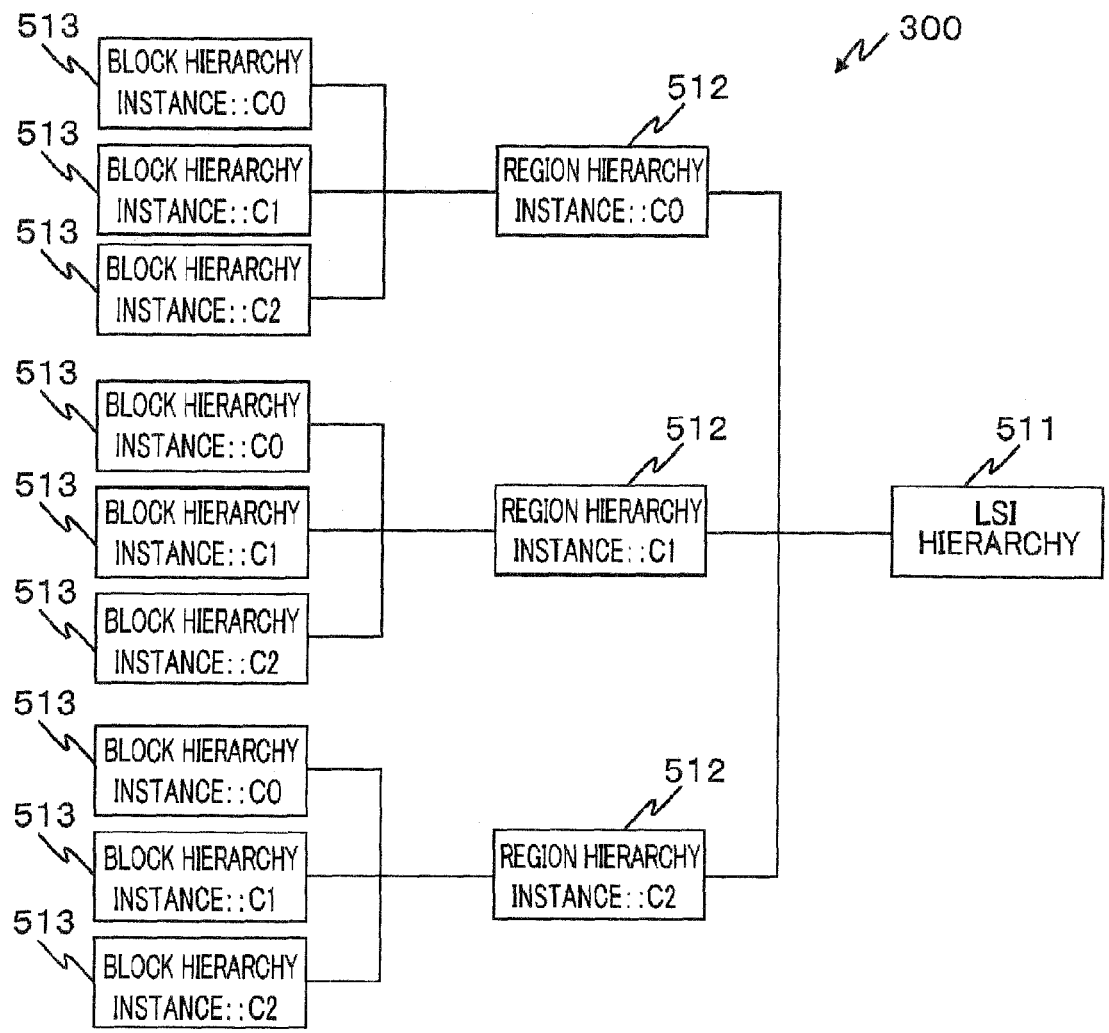
FIG. 5B is a diagram illustrating a management structure for circuits forming the integrated circuit 300.

FIGS. 5A and 5B are drawings illustrating the above-mentioned management structure. As shown in FIGS. 5A and 5B, each above-mentioned group is tiered into an LSI hierarchy 511 that is the uppermost hierarchy, a region hierarchy 512 that is the lower hierarchy of the LSI hierarchy 511, and a block hierarchy 513 that is the lower hierarchy of the region hierarchy 512. The region hierarchy 512 and the block hierarchy 513 of these can generate an instance (see FIG. 5B). The I/O registers that form the I/O register circuit 312 each belong to any one of the block hierarchies 513.

In the description below, of the data that forms the design data, information on the region hierarchy 512 is referred to as region hierarchy management information and information on the block hierarchy 513 is referred to as block hierarchy management information. Moreover, information on the block hierarchy to which each I/O register belongs is referred to as I/O register access management information, and information on the I/O registers of the I/O register circuit 312 is referred to as I/O register management information.

=Design support system=

Hardware

Figure 6:
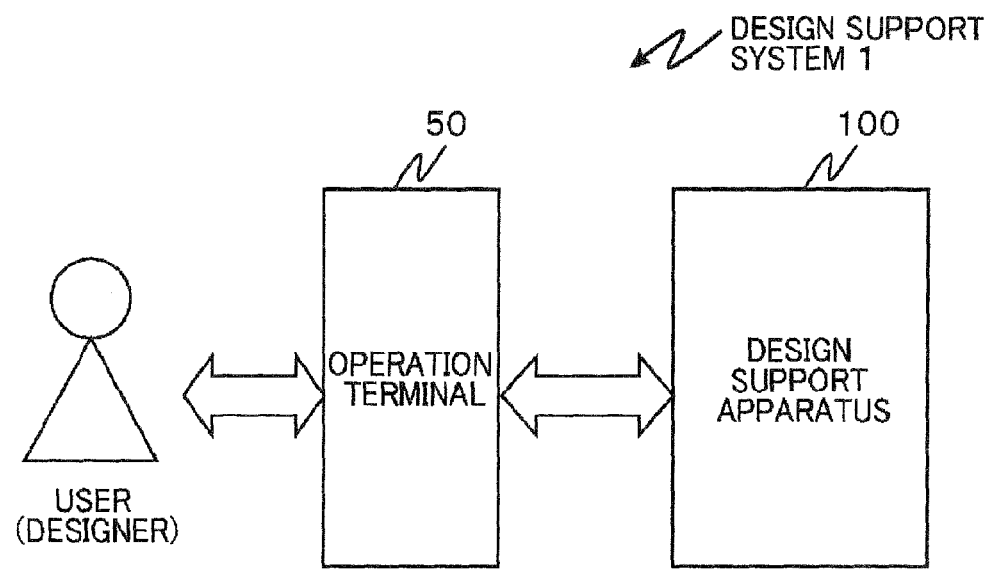
FIG. 6 is a diagram showing a hardware configuration of the design support system 1.

FIG. 6 shows a hardware configuration of the design support system 1. As shown in FIG. 6, the design support system 1 includes an operation terminal 50 operated by the user (designer) and a design support apparatus 100. For example, the operation terminal 50 and the design support apparatus 100 are computers (information apparatus), such as personal computers, office computers, and mainframes. The operation terminal 50 is communicably coupled to the design support apparatus 100, and includes a user interface such as a GUI (Graphical User Interface) or a CLI (Command Line Interface). Here, the operation terminal 50 and the design support apparatus 100 do not always need to be separately formed, and may be implemented by the same hardware.

Figure 7:
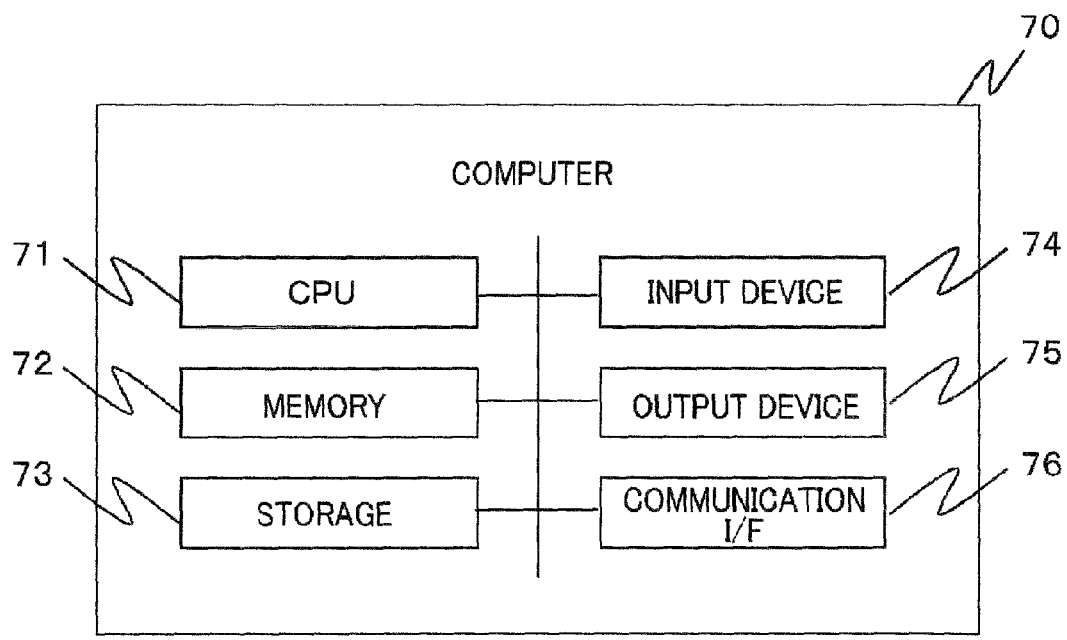
FIG. 7 is a diagram showing an example of a computer that can be used as hardware for an operation terminal 50 or a design support apparatus 100.

FIG. 7 shows an example of a computer that can be used as hardware for the operation terminal 50 or the design support apparatus 100. As shown in FIG. 7, this computer 70 includes a CPU 71, a volatile or nonvolatile memory 72 (RAM or ROM), a storage 73 (for example, a hard disk drive or a semiconductor memory (SSD)), input devices 74 such as a keyboard and a mouse, output devices 75 such as a liquid crystal display monitor and a printer, and a communication interface (described as a communication I/F 76) such as an NIC.

Function and Data

Figure 8A:
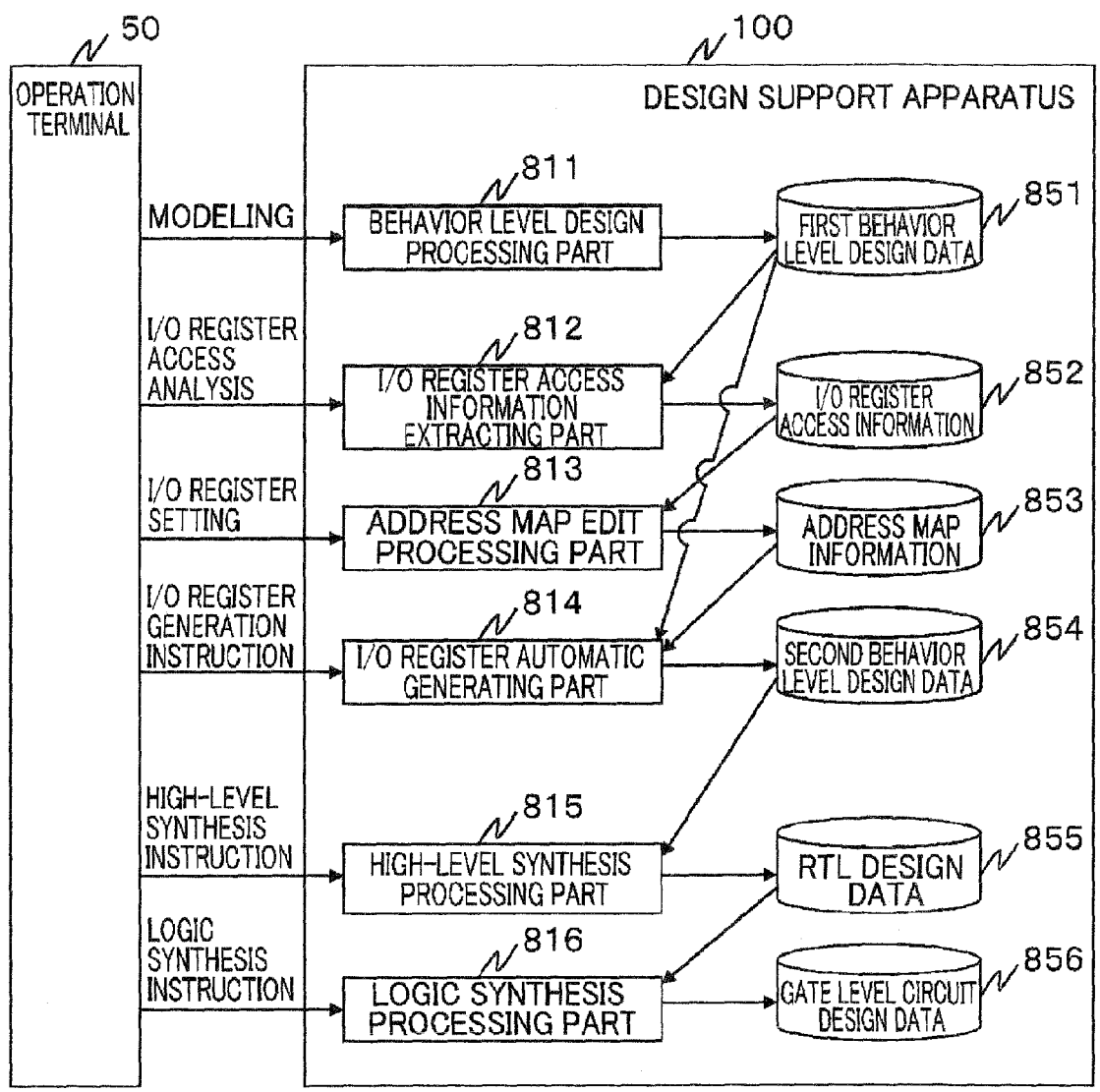
FIG. 8A is a diagram showing principal functions that the design support apparatus 100 includes, and principal data that the design support apparatus 100 manages (refers to, generates and updates).

FIG. 8A shows principal functions that the design support apparatus 100 includes and principal data that the design support apparatus 100 manages (refers to, generates, and updates). As shown in FIG. 8A, the design support apparatus 100 includes a behavior level design processing part 811, an I/O register access information extracting part 812, an address map edit processing part 813, an I/O register automatic generating part 814, a high-level synthesis processing part 815, and a logic synthesis processing part 816. These functions are implemented either by the hardware that the design support apparatus 100 includes, or by causing the CPU 71 of the design support apparatus 100 to read and execute data stored in the memory 72 or the storage 73.

As shown in FIG. 8A, the design support apparatus 100 manages a variety of design data including first behavior level design data 851, I/O register access information 852, address map information 853, second behavior level design data 854, RTL design data 855, and gate level circuit design data 856. These pieces of data are stored, for example, in the memory 72 and the storage 73 of the design support apparatus 100. These pieces of data are managed, for example, by a database management system (DBMS). These pieces of design data are written in accordance with a hardware description language (HDL) such as VHDL (Very High Hardware Description Language) or Verilog HDL.

As shown in FIG. 8A, the behavior level design processing part 811 generates the first behavior level design data 851. The first behavior level design data 851 is design data in which a configuration of the integrated circuit 300 to be designed at a behavior level is described.

Figure 8B:
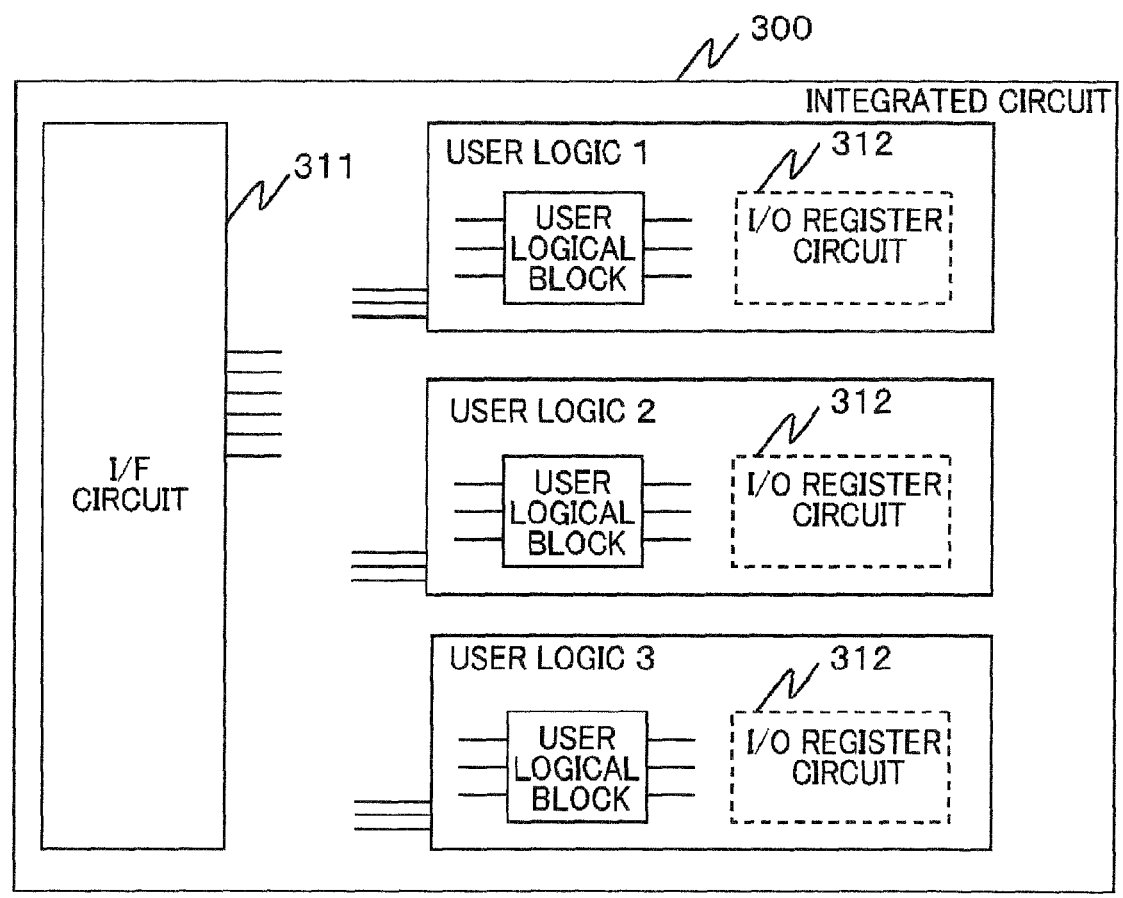
FIG. 8B is an image diagram of first behavior level design data 851.

FIG. 8B is an image diagram of the first behavior level design data 851. As shown in FIG. 8B, in a stage of the first behavior level design data 851, specific configurations of an I/O register circuit and the like provided within the I/O register circuit 312 and the user logical circuit 313 are not described yet. The behavior level design processing part 811 generates the first behavior level design data 851 by, for example, a method disclosed in Japanese Patent Application Laid-open Publication No. 2007-42085.

The I/O register access information extracting part 812 generates the I/O register access information 852 on the basis of the first behavior level design data 851. Detailed description of the I/O register access information 852 and functions of the I/O register access information extracting part 812 will be given later.

The address map edit processing part 813 generates the address map information 853 on the basis of the I/O register access information 852. Detailed description of the address map information 853 and functions of the address map edit processing part 813 will be given later.

The I/O register automatic generating part 814 generates the second behavior level design data 854 on the basis of the first behavior level design data 851 and the address map information 853.

Figure 8C:
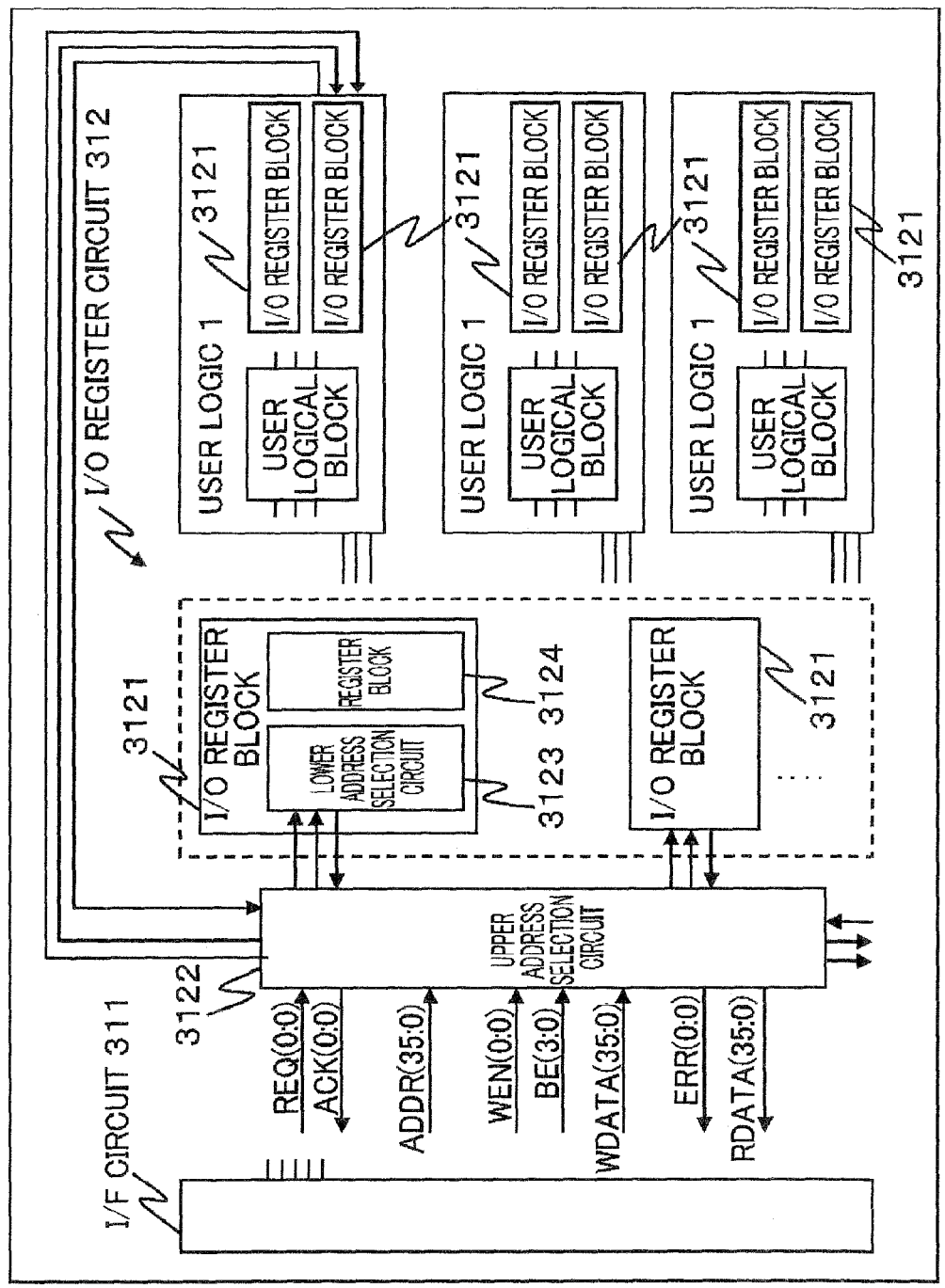
FIG. 8C is an image diagram of second behavior level design data 854.

FIG. 8C is an image diagram of the second behavior level design data 854. As shown in FIG. 8C, in the second behavior level design data 854, a specific configuration of the I/O register circuit 312 in the integrated circuit 300 (I/O register blocks 3121, an upper address selection circuit 3122, a lower address selection circuit 3123, register blocks 3124, and the like, which are to be described later). Detailed description of the second behavior level design data 854 and functions of the I/O register automatic generating part 814 will be given later.

The high-level synthesis processing part 815 generates the RTL design data 855 that is circuit design data at an RTL level (Register Transfer Level), on the basis of the second behavior level design data 854. The RTL design data 855 can be generated, for example, by using a commercially available high-level synthesis tool.

The logic synthesis processing part 816 generates the gate level circuit design data 856 that is circuit design data at a gate level, on the basis of the RTL design data 855. The gate level circuit design data 856 can be generated, for example, by using a commercially available logic synthesis tool.

=Overall Processing=

Figure 9:
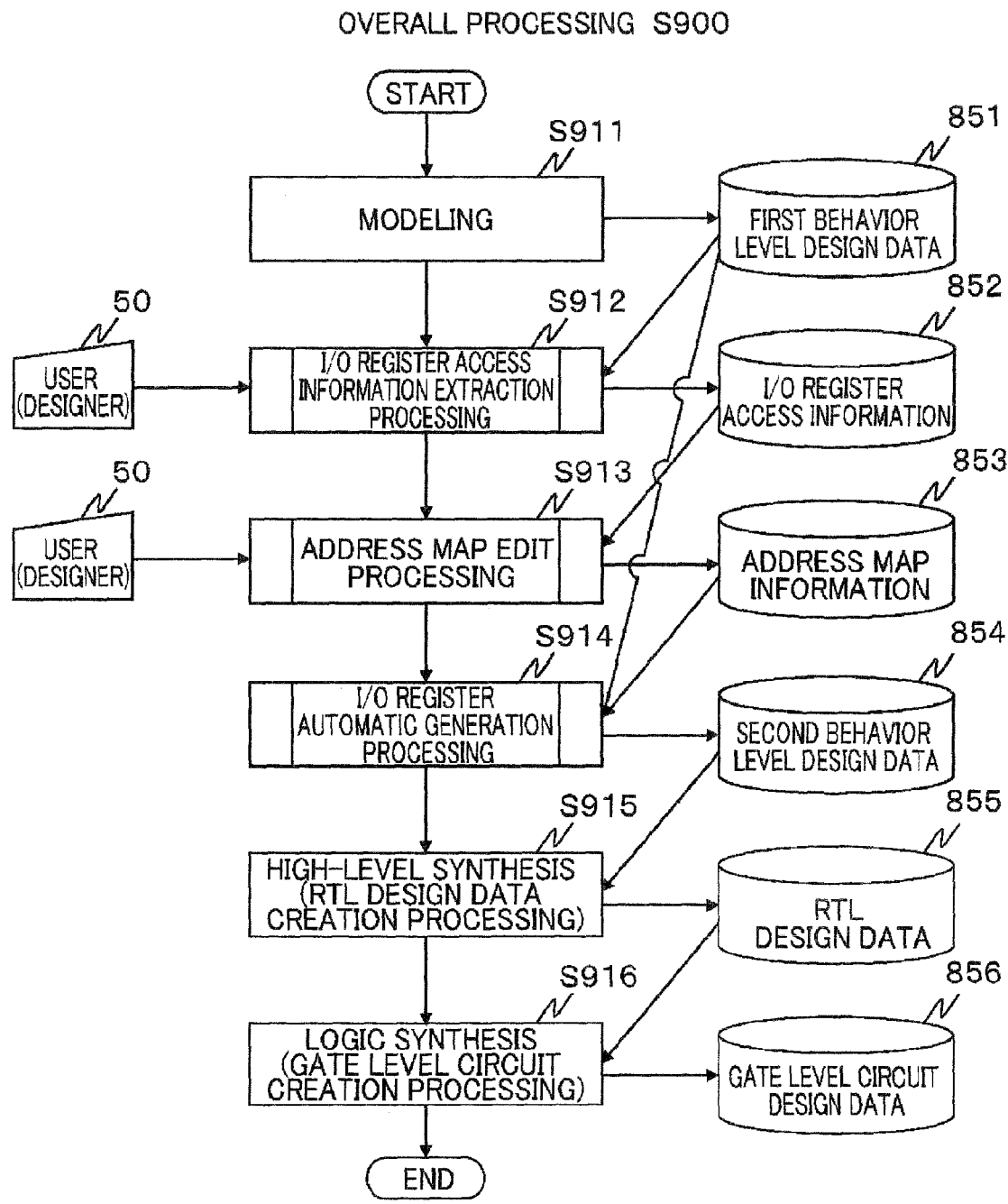
FIG. 9 is a flow chart illustrating overall processing S900.

FIG. 9 is a flow chart illustrating a flow of processing (hereinafter, referred to as overall processing S900) performed by the design support system 1 when the user (designer) designs the integrated circuit 300 by use of the design support system 1. Hereinafter, the overall processing S900 will be described with FIG. 9. Note that a character of "S" given before a reference numeral means a step.

First, by using the function of the behavior level design processing part 811, the user creates the first behavior level design data 851 (modeling) (S911). Next, by using the function of the I/O register access information extracting part 812, the user creates the I/O register access information 852 on the basis of the first behavior level design data 851 (hereinafter, referred to as I/O register access information extraction processing S912). Moreover, by using the function of the address map edit processing part 813, the user creates (edits) the address map information 853 on the basis of the I/O register access information 852 (hereinafter, referred to as address map edit processing S913). Further, by using the function of the I/O register automatic generating part 814, the user creates the second behavior level design data 854 on the basis of the first behavior level design data 851 and the address map information 853 (hereinafter, referred to as I/O register automatic generation processing S914).

Next, by using the function of the high-level synthesis processing part 815, the user creates the RTL design data 855 that is the circuit design data at the RTL level, on the basis of the second behavior level design data 854 (S915). Further, by using the function of the logic synthesis processing part 816, the user creates the gate level circuit design data 856 that is the circuit design data at the gate level, on the basis of the RTL design data 855 (S916).

=I/O Register Access Information Extraction Processing=

Figure 10:
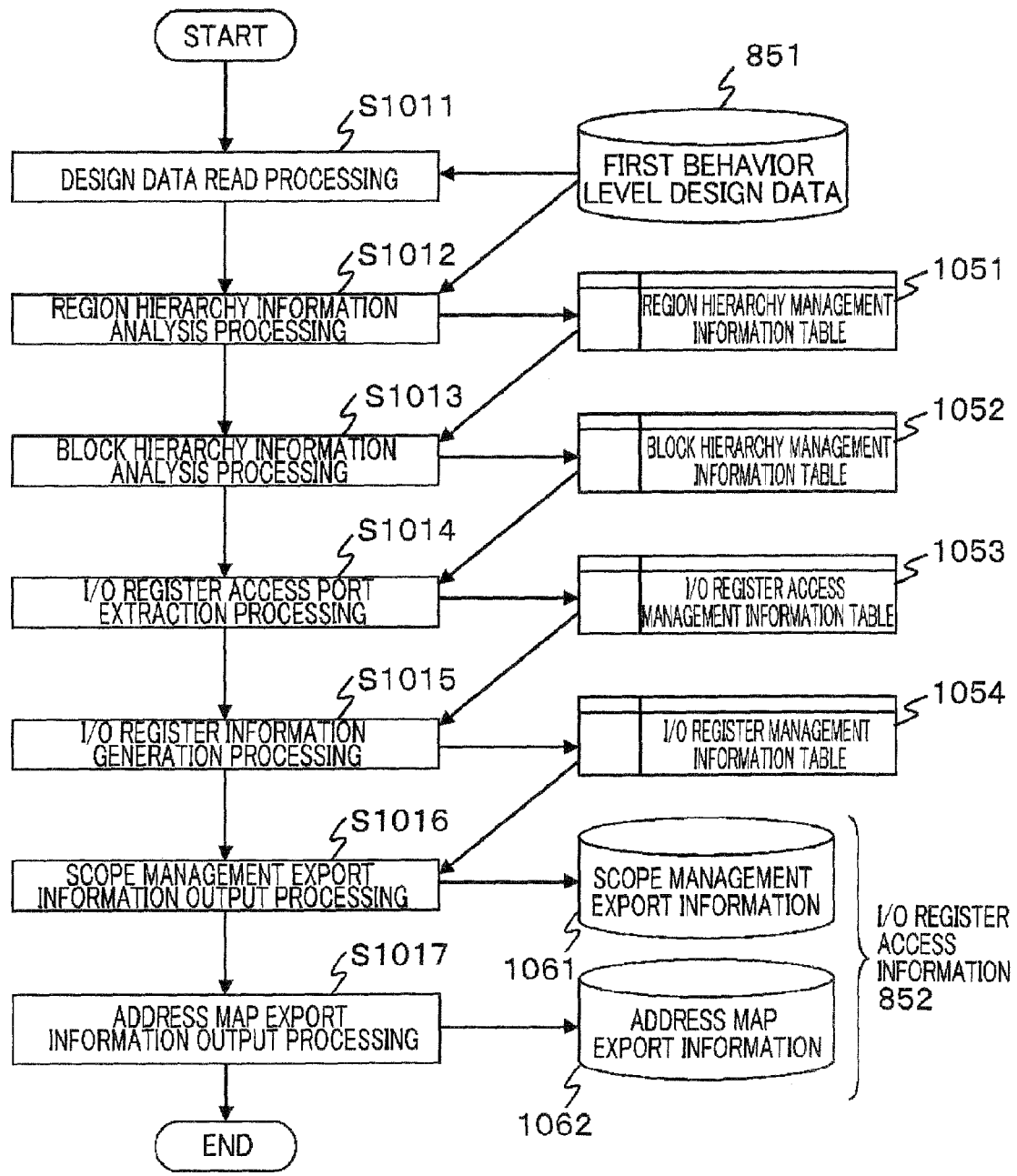
FIG. 10 is a flow chart illustrating I/O register access information extraction processing S912.

FIG. 10 is a flow chart illustrating details of the I/O register access information extraction processing S912 shown in FIG. 9. In the I/O register access information extraction processing S912, the I/O register access information extracting part 812 extracts information on I/O registers from the first behavior level design data 851, and generates (outputs) the I/O register access information 852 on the basis of the extracted information. Hereinafter, the I/O register access information extraction processing S912 will be described with FIG. 10.

First, the I/O register access information extracting part 812 reads the first behavior level design data 851 (S1011), and extracts the above-mentioned region hierarchy management information, block hierarchy management information, I/O register access management information, and I/O register management information from the first behavior level design data 851. Then, the I/O register access information extracting part 812 outputs pieces of the extracted information as a region hierarchy management information table 1051, a block hierarchy management information table 1052, an I/O register access management information table 1053, and an I/O register management information table 1054, respectively (S1012 to S1015). Each outputted table is stored in the memory 72 or the storage 73.

FIGS. 11A to 11D respectively show data structures of the region hierarchy management information table 1051, the block hierarchy management information table 1052, the I/O register access management information table 1053, and the I/O register management information table 1054 which are outputted by the I/O register access information extracting part 812.

As shown in FIG. 11A, the region hierarchy management information table 1051 is formed of one or more records each having items of a region name where the name of a region hierarchy is set and a region instance name where the name of an instance of the region hierarchy is set.

As shown in FIG. 11B, the block hierarchy management information table 1052 is formed of one or more records each having items of a block name where the name of a block hierarchy is set, a block instance name where the name of an instance of the block hierarchy is set, and a region name where the name of a region hierarchy to which the instance of the block hierarchy belongs is set.

As shown in FIG. 11C, the I/O register access management information table 1053 is formed of one or more records each having items of a block name where the name of a block hierarchy accessing an I/O register (the name of a block hierarchy of an access source) is set, an I/O register name where the name of the I/O register is set, and an I/O register R/W attribute where an R/W attribute set in the I/O register is set.

As shown in FIG. 11D, the I/O register management information table 1054 is formed of one or more records each having items of an I/O register name where the name of an I/O register is set, an I/O register bit size where the bit size of the I/O register is set, an I/O register parity attribute where information on whether a parity function of the I/O register is present (PY/NP) is set, an I/O register scope status where information on the status of a scope of the I/O register (OK/PEND/NG) is set, and an I/O register scope where the scope of the I/O register (CMN/region) is set.

The I/O register access information extracting part 812 acquires a value of the parity attribute of an I/O register (PY/NP) and a value of the scope of the I/O register (CMN/region) in the I/O register management information table 1054 from the descriptive content of the first behavior level design data 851, and sets the values.

Moreover, in accordance with a usage mode (access mode) of the I/O register in the first behavior level design data 851, the I/O register access information extracting part 812 sets a value of the I/O register scope status (OK/PEND/NG) in the I/O register management information table 1054. FIGS. 12 to 14 respectively illustrate usage modes of the I/O register corresponding to the statuses (OK/PEND/NG) set as the I/O register scope status in the I/O register management information table 1054.

Figure 12A:
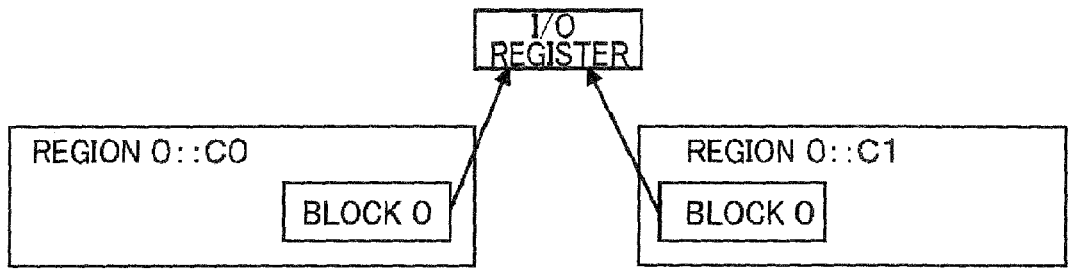
FIG. 12A is a diagram showing an example of an I/O register for which "OK" is set as an I/O register scope status.
Figure 12B:
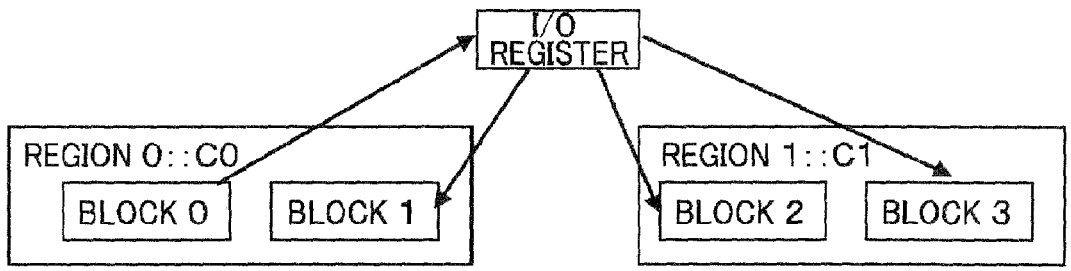
FIG. 12B is a diagram showing an example of an I/O register for which "OK" is set as the I/O register scope status.
Figure 12C:
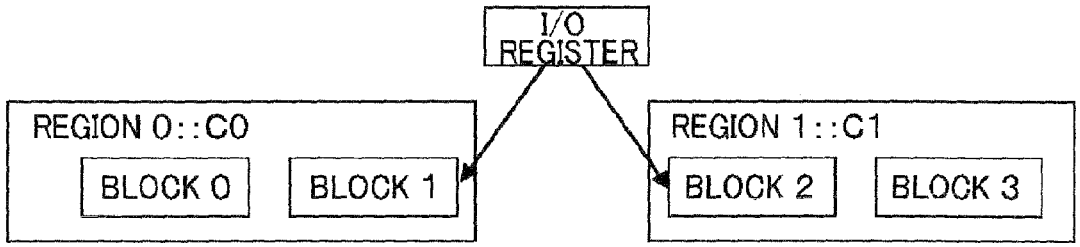
FIG. 12C is a diagram showing an example of an I/O register for which "OK" is set as the I/O register scope status.

FIGS. 12A to 12C show an example of an I/O register in which "OK" is set as the I/O register scope status. Out of these, FIG. 12A shows a case where blocks (block 0, block 0) that respectively belong to different instances (C0, C1) of the same region (region 0) only write data into a single I/O register. FIG. 12B shows a case where a block (block 0) that belongs to a region (C0) writes data into a single I/O register, and blocks (block 1, block 2, block 3) that belong to different regions (region 0, region 1) read data from the above-mentioned single I/O register. FIG. 12C shows a case where blocks (block 1, block 2) that respectively belong to different regions (region 0, region 1) only read data from a single I/O register.

Figure 13A:
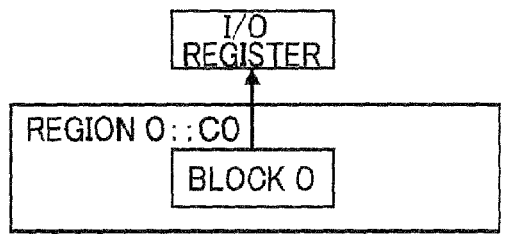
FIG. 13A is a diagram showing an example of an I/O register for which "PEND" is set as the I/O register scope status.
Figure 13B:
FIG. 13B is a diagram showing an example of an I/O register for which "PEND" is set as the I/O register scope status.
Figure 13C:
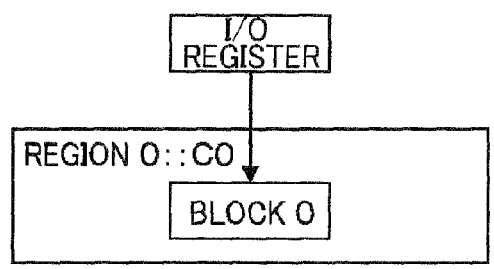
FIG. 13C is a diagram showing an example of an I/O register for which "PEND" is set as the I/O register scope status.

FIGS. 13A to 13C show an example of an I/O register in which "PEND" is set as the I/O register scope status. Out of these, FIG. 13A shows a case where a single block (block 0) that belongs to a single region (C0) only writes data into a single I/O register. FIG. 13B shows a case where blocks (block 0, block 0) that respectively belong to different instances (C0, C1) of the same region (region 0) only read data from a single I/O register. FIG. 13C shows a case where a block that belongs to a single region (region 0) only reads data from a single I/O register.

Figure 14A:
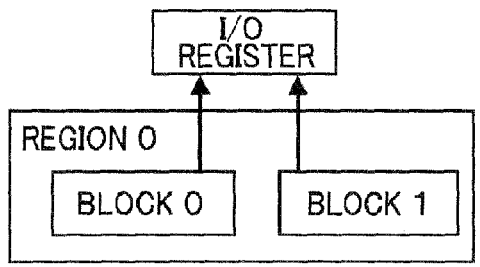
FIG. 14A is a diagram showing an example of an I/O register or which "NG" is set as the I/O register scope status.
Figure 14B:
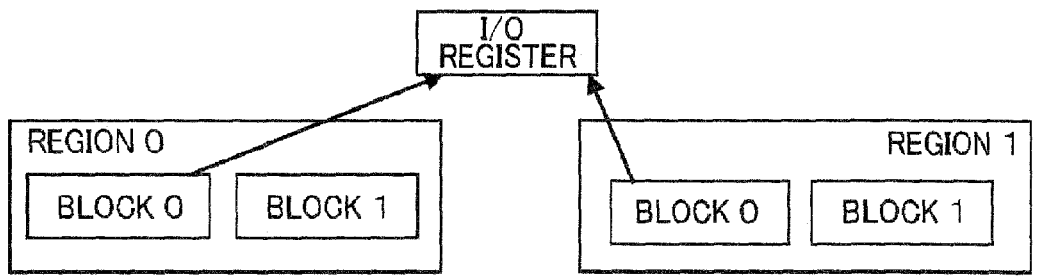
FIG. 14B is a diagram showing an example of an I/O register for which "NG" is set as the I/O register scope status.
Figure 14C:
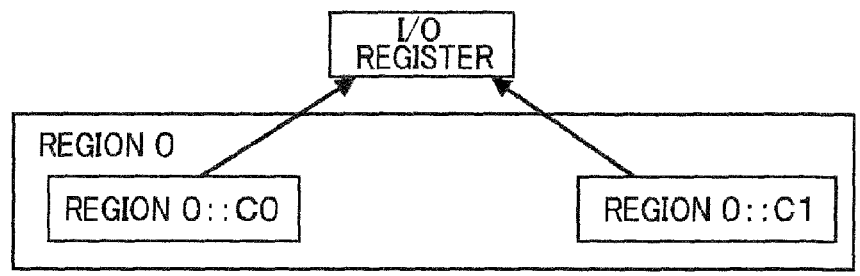
FIG. 14C is a diagram showing an example of an I/O register for which "NG" is set as the I/O register scope status.

FIGS. 14A to 14E show an example of an I/O register in which "NG" is set as the I/O register scope status. FIG. 14A shows a case where different blocks (block 0, block 1) that belong to a single region (region 0) only write data into a single I/O register. FIG. 14B shows a case where blocks (block 0, block 0) that respectively belong to different regions (region 0, region 1) only write data into a single I/O register. FIG. 14C shows a case where instances (C0, C1) of a block that belong to a single region (region 0) only write data into a single I/O register.

Figure 14D:
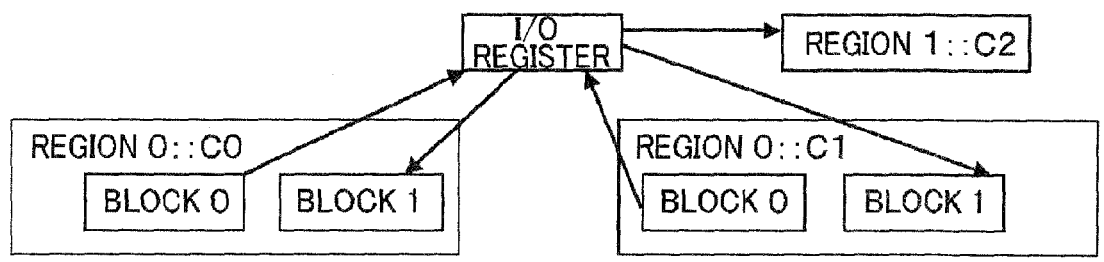
FIG. 14D is a diagram showing an example of an I/O register for which "NG" is set as the I/O register scope status.

FIG. 14D shows a case where blocks (block 0, block 0) that respectively belong to different instances (C0, C1) of the same region (region 0) write data into a single I/O register, blocks (block 1, block 1) that respectively belong to the different instances (C0, C1) of the region read data from the single I/O register, and another region (region 1) different from the above-mentioned region (region 0) only reads data therefrom.

Figure 14E:
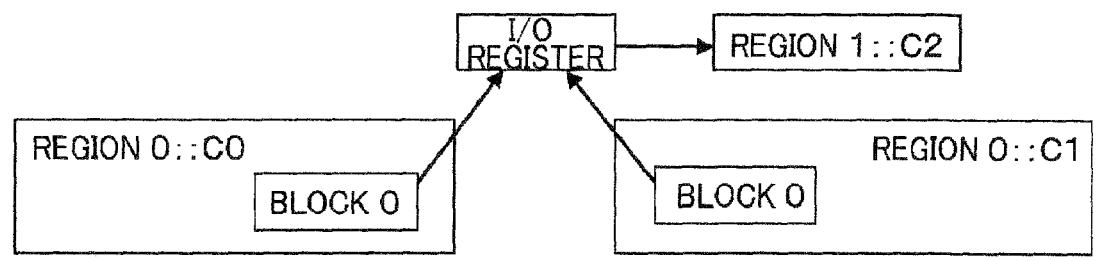
FIG. 14E is a diagram showing an example of an I/O register for which "NG" is set as the I/O register scope status.

FIG. 14E shows a case where blocks (block 0, block 0) that respectively belong to different instances (C0, C1) of the same region (region 0) only write data into a single I/O register, and another region (region 1) different from the above-mentioned region only reads data therefrom.

When the region hierarchy management information table 1051, the block hierarchy management information table 1052, the I/O register access management information table 1053, and the I/O register management information table 1054 are outputted in the aforementioned processing, then, the I/O register access information extracting part 812 generates the I/O register access information 852 on the basis of these tables (S1016, S1017). As shown in FIG. 10, the I/O register access information 852 includes scope management export information 1061 and address map export information 1062. FIG. 15A shows a data structure of the scope management export information 1061, and FIG. 15B shows a data structure of the address map export information 1062.

As shown in FIG. 15A, the scope management export information 1061 is formed of one or more records each having items of a region name where the name of a region hierarchy is set, and a region instance name where the name of an instance of the region hierarchy is set. Note that, the scope management export information 1061 is generated on the basis of the content of the region hierarchy management information table 1051.

As shown in FIG. 15B, the address map export information 1062 is formed of one or more records each having items of an I/O register name where the name of an I/O register is set, an I/O register bit size where the bit size of the I/O register is set, an I/O register parity attribute where information on whether a parity function of the I/O register is present (PY/NP) is set, an I/O register scope status where information on the status of a scope of the I/O register (OK/PEND/NG) is set, and an I/O register scope where the scope of the I/O register (CMN/region) is set. Note that, the address map export information 1062 is generated on the basis of the content of the I/O register access management information table 1053.

As described so far, the design support system 1 of this embodiment automatically generates the I/O register access information 852 on the basis of the first behavior level design data 851 subjected to modeling. Accordingly, information on the I/O register, such as the bit size, the parity attribute, and the scope status, can be accurately extracted from the first behavior level design data 851. Moreover, as described along with FIGS. 12 to 14, the status of the scope which is classified in accordance with the usage mode of the I/O register can be extracted accurately.

=Address Map Edit Processing=

Next, address map edit processing S913 will be described. The address map edit processing S913 is processing in which through interactive processing performed via the user interface of the operation terminal 50, the address map edit processing part 813 edits the address map information 853 on the basis of the I/O register access information 852 generated in the I/O register access information extraction processing S912.

The above-mentioned address map information 853 is information (mapping information) on the association of an address management system (address space) of a register referred to (defined) by a program that operates the processor device 350 (hereinafter, also referred to as an SW register) with an address management system of a register referred to by the integrated circuit 300 (I/O register, hereinafter, also referred to as an HW register). In the design development of the integrated circuit 300 which is applied to a configuration as shown in FIG. 3 and designed to communicate with the processor device 350, the address management system of the SW register used on the processor device 350 side is different from the address management system of the HW register in the integrated circuit 300, and therefore it is necessary to manage the association of the SW register with HW register in this way.

Figure 16:
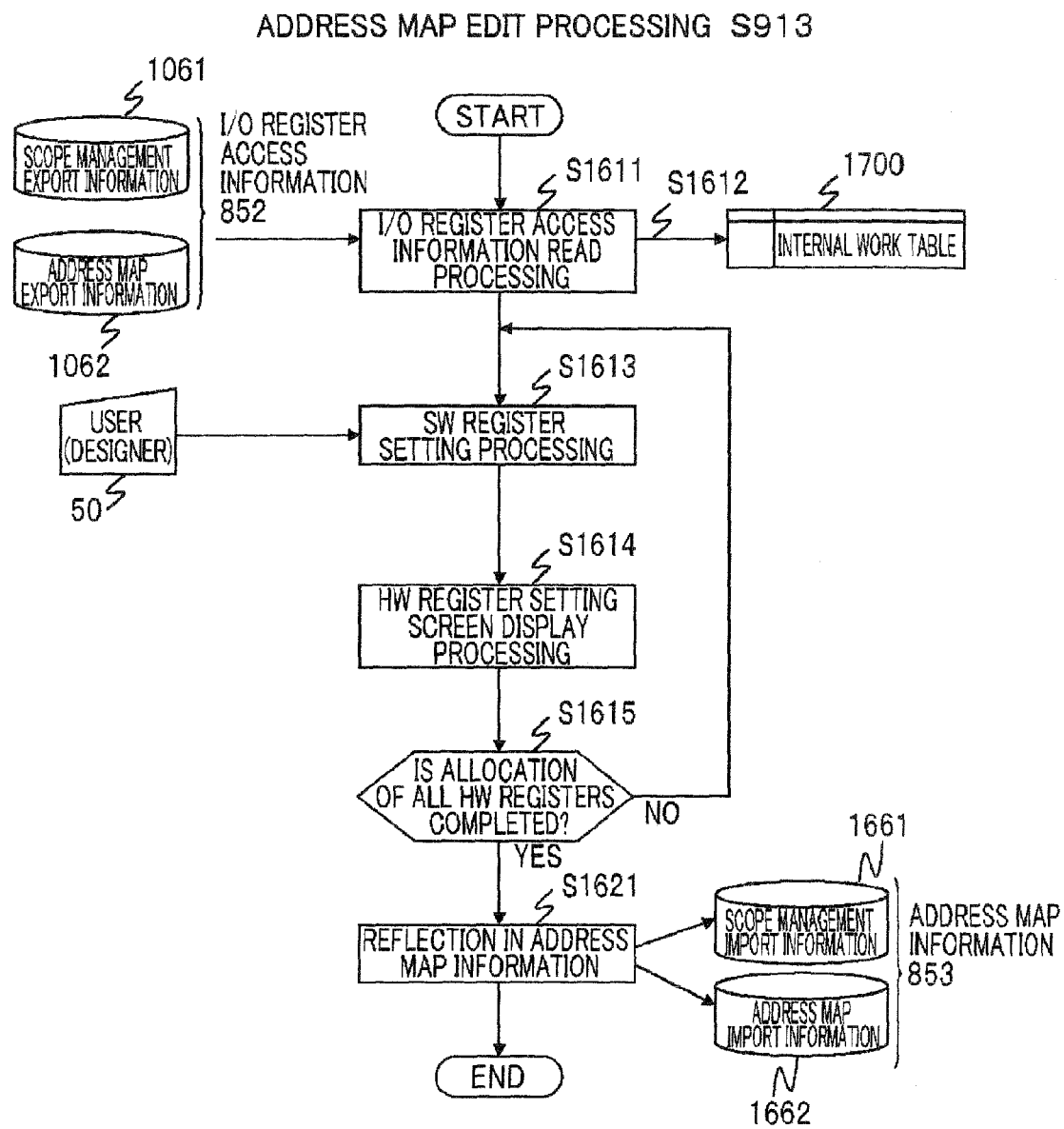
FIG. 16 is a flow chart illustrating address map edit processing S913.

Hereinafter, the address map edit processing S913 will be described with a flow chart shown in FIG. 16. First, the address map edit processing part 813 reads the I/O register access information 852 (S1611). Then, the address map edit processing part 813 generates an internal work table 1700 on the basis of the read I/O register access information 852 (S1612).

FIG. 17 shows a data structure of the internal work table 1700. As shown in FIG. 17, the internal work table 1700 is formed of one or more records each having items of an I/O register name where the name of an I/O register is set, an I/O register bit size where the bit size of the I/O register is set, an I/O register parity attribute where information on whether a parity function of the I/O register is present (PT/NP) is set, an I/O register scope status where information on the status of a scope of the I/O register (OK/PEND/NG) is set, an I/O register scope where the scope of the I/O register (CMN/region)

is set, a status where the status of address mapping of the I/O register (OK/SPLIT/PEND) is set, a mapping length where the bit size of the I/O register subjected to the address mapping is set, a scope where a scope to which the I/O register is mapped is set, and an initialization status where the initialization status of the I/O register is set.

Figure 18:
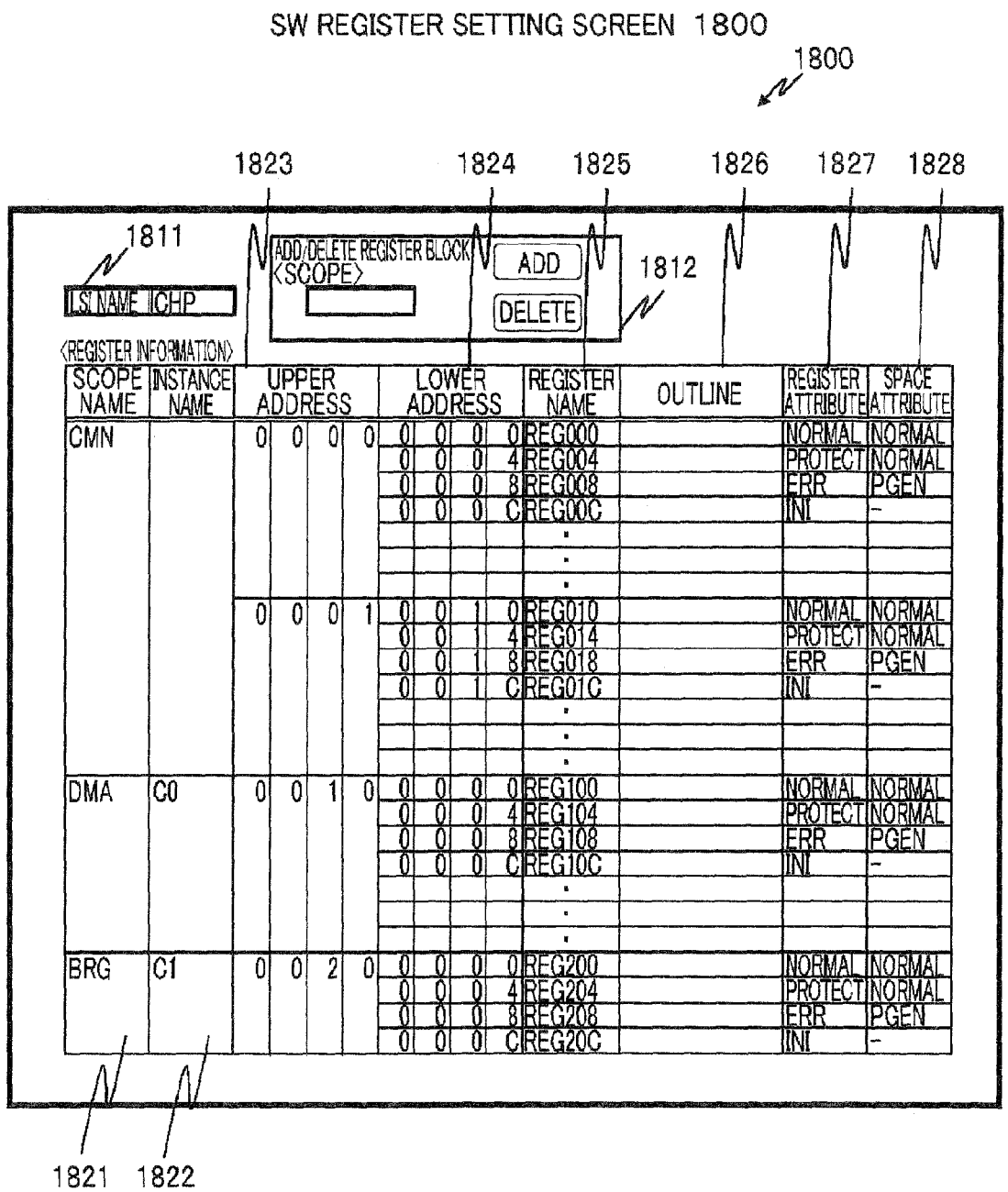
FIG. 18 shows an example of an SW register setting screen 1800.

Then, the address map edit processing part 813 accepts information on the SW register inputted by the user (S1613). FIG. 18 shows an example of a screen (hereinafter, referred to as an SW register setting screen 1800) outputted to the operation terminal 50 by the address map edit processing part 813 in this step.

An LSI name 1811 in the SW register setting screen 1800 displays the name of the integrated circuit 300 to be designed. A register block addition/deletion column 1812 is used when a block of the SW register is added to or deleted from the inside of a scope currently edited.

A scope name 1821 displays a scope name of a SW register. For example, "CMN" is set if the SW register is accessible only from the whole integrated circuit 300 to be designed. If the SW register is accessible only from a DMA that is the user logical circuit 313, "DMA" which is the name of the region is set. If the SW register is accessible only from a bridge circuit that is the user logical circuit 313, "BRG" which is the name of the region is set.

When the region name is set for the scope, an instance name given to the region is set in an instance name 1822. In FIG. 18, "C0" is set as the instance name 1822 whose scope name 1821 is "DMA," and "C1" is set as the instance name 1822 whose scope name 1821 is "BRG," respectively.

In an upper address 1823, an upper address is set among addresses in accordance with the address management system of the SW register. Moreover, in a lower address 1824, a lower address is set among the addresses in accordance with the address management system of the SW register. FIG. 18 shows a case where the SW register has a bit size of a fixed length of 4 byte, and the lower address is displayed every 4 bytes.

All of a register name 1825, an outline 1826, a register attribute 1827, and a space attribute 1828 are items set by the user. Note that, these user set items may be automatically set as appropriate depending on the usage mode of the design support system 1. Out of these, the name of each SW register is set in the register name 1825. Moreover, information on the SW register such as application and function of the SW register is set in the outline 1826.

An attribute (NORMAL/PROTECT/ERR/INI) given to the SW register is set in the register attribute 1827. Out of these, "NORMAL" is set when the SW register is used as a usual register from and to which data can be read and written. "PROTECT" is set when the SW register is prevented from being written unless the integrated circuit 300 performs the setting of the protection release. "ERR" is set when the SW register is used to store error information. "INI" is set when the generation of a circuit for initializing an HW register is instructed.

Information (NORMAL/PGEN) that specifies an effective range of parity (guarantee code) of the SW register is set in the space attribute 1828. Out of these, "NORMAL" is set when the guarantee code (parity) held by the HW register (I/O register) is taken over to the processor device 350 to guarantee the data. "PGEN" is set when a guarantee code is generated at the time of reading data from the HW register if the HW register has no guarantee code.

When the user selects one of the register names displayed in the register name 1825 on the SW register setting screen 1800 shown in FIG. 18, the address map edit processing part 813 displays a screen shown in FIG. 19A (hereinafter, referred to as an HW register setting screen 1900) on the operation terminal 50 (S1614). As shown in FIG. 19A, two display columns of SW register information 1910 and SW bitmap information 1920 are provided on the HW register setting screen 1900.

A name of the integrated circuit 300 to be designed is displayed in an LSI name 1911 of the SW register information 1910 in FIG. 19A. In each of an outline 1912, a scope 1913, a register name 1914, a register attribute 1916, and a space attribute 1917, the content set in the corresponding item in the SW register setting screen 1800 is displayed without any modification. The content of the lower address 1824 of the SW register setting screen 1800 is displayed in an offset 1915. An initial value automatically set in the SW register is displayed in an initial value 1918.

The byte position of the SW register is automatically displayed in a BYTE 1921 of the SW bitmap information 1920. A bit position of the SW register is automatically displayed in a Bit 1922. A function name 1923 is an item set by the user, and the name of an HW register allocated to the address of the SW register (an identifier of the I/O register) is set. In FIG. 19A, an 8-bit HW register named "HREG00" is set in a column of the byte position of "0" and the bit position of "31". This means that portions of the byte position of "+0" and the bit positions of "31 to 24" in the SW register of the register name "REG000" are allocated to the respective bits of the HW register named "HREG00". Moreover, bits of a 16-bit HW register named "HREG01 " are respectively allocated to portions of the byte positions of "+1" and "+2" and the bit positions of "23 to 8" in the SW register "REG00".

The function name 1923 is "HREG02[23:16]" for the byte position of "+3". This means that 8 bits from an uppermost bit "23" to an intermediate bit "16" of "HREG02", which is a 24-bit HW register, are respectively allocated to the byte position of "+3" and the bit positions of "7 to 0" in the SW register "REG000". When allocating only a part of bits of the HW register to the SW register in this way, the address map edit processing part 813 sets "SPLIT" as the status for the HW register in the internal work table 1700.

When the bit size of the HW register and the bit size of the SW register do not coincide with each other in this way, the address map edit processing part 813 performs highlighting such that the user can recognize that easily. FIG. 19B shows an example of the highlighting. In FIG. 19B, in order to make visually recognizable a bit unallocated to the SW register among the bits of the HW register, an area indicating the unallocated bit is drawn, on the HW register setting screen 1900, as an area 1950 protruded outside the frame of the SW bitmap information 1920.

In this manner, the unallocated area is visually expressed and presented. Thereby, the user can intuitively and easily recognize that the size of the SW register and that of the HW register are not identical, and that the unallocated area exists in the HW register. Accordingly, the user can grasp the use state of the HW register correctly, and can thereby suppress design errors effectively.

Setting of the name of an HW register in the function name 1923 of the SW bitmap information 1920 (setting of the HW register to be associated with the SW register) can be simply performed by using a list box displayed on the HW register setting screen 1900.

FIG. 20 shows a state where a list box 2010 described above is displayed on the HW register setting screen 1900. The user can easily set the HW register to be associated with the SW register by selecting one of the HW registers displayed in the list box 2010.

Figure 21:
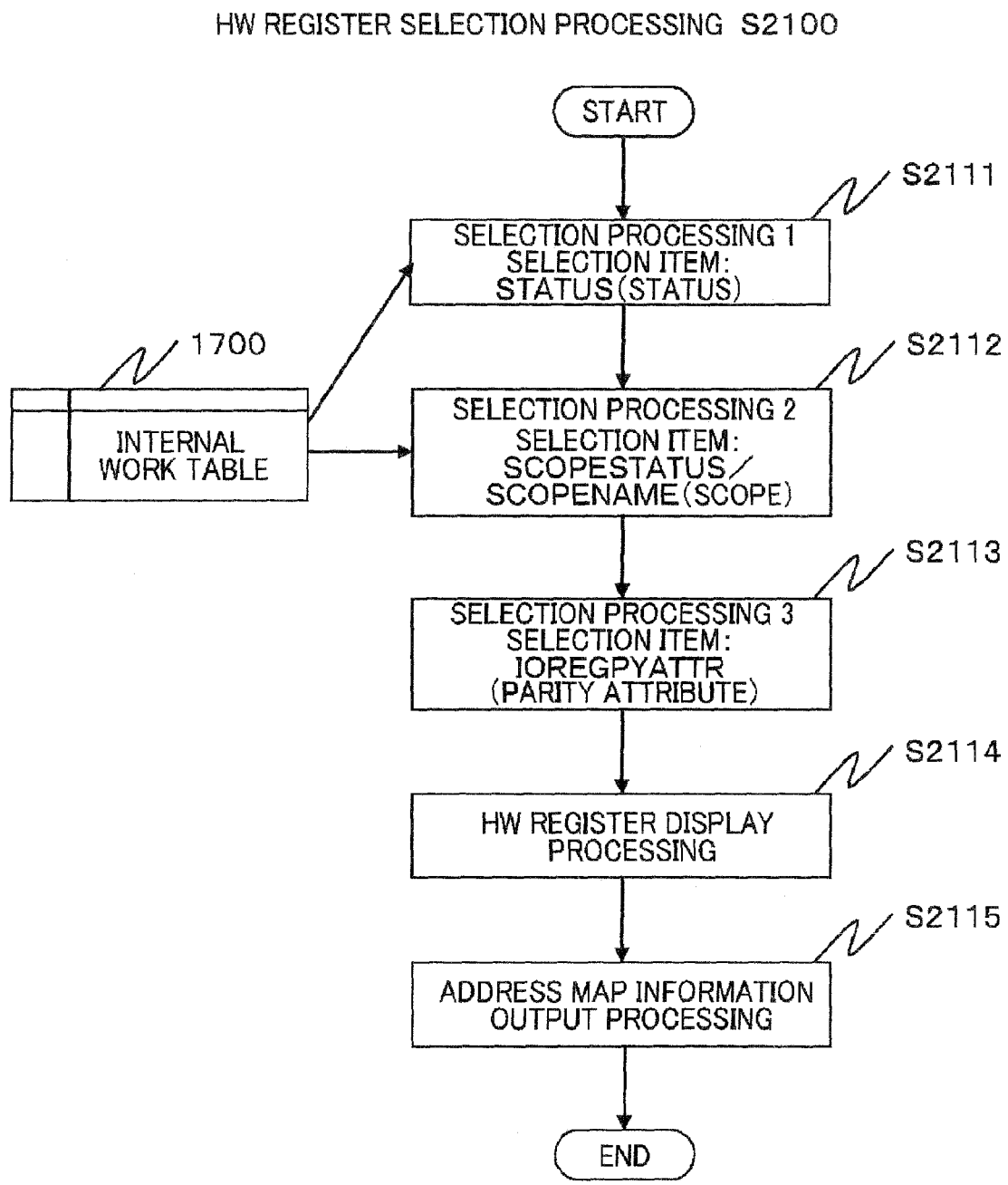
FIG. 21 is a flow chart illustrating HW register selection processing S2100.

Here, from the internal work table 1700, the address map edit processing part 813 selects the HW register to be displayed in the above-mentioned list box 2010 in accordance with a predetermined condition. FIG. 21 is a flow chart illustrating processing in which the address map edit processing part 813 selects the HW register to be displayed in the list box 2010 (hereinafter, referred to as HW register selection processing S2100). Hereinafter, the HW register selection processing S2100 will be described along with FIG. 21.

First, the address map edit processing part 813 selects a HW register (I/O register) having a value of the status of "PEND" or "SPLIT" from the internal work table 1700 (S2111). Here, when the HW register is already associated with the SW register, "OK" is set in the above-mentioned status. When the HW register is not yet associated therewith, "PEND" is set therein. When an unallocated bit remains while a part of the bits are already allocated to the SW register, as in the case of the HW register "HREG02" shown in FIG. 19A for example, "SPLIT" is set therein.

Thus, when acquiring a setting to allocate, to an SW register, an HW register having a bit size larger than the bit size of the SW register, the address map edit processing part 813 presents the HW register in which an unallocated area remains to the user as a candidate for an HW register to be associated with an SW register. Accordingly, the user can effectively utilize the HW register, without separately managing the HW registers in which an unallocated area remains.

In a content 1924 of the SW bitmap information 1920, description, especially, of the HW register seen from the processor device 350 side is set by the user (designer). In an initial value 1925 of the SW bitmap information 1920, an initial value set in each bit is set by the user (designer).

Then, out of the HW registers selected at S2111, the address map edit processing part 813 selects, with reference to the internal work table 1700, the HW registers in which the I/O register scope status is "OK" or "PEND" and the scope of the SW register currently set (the content in the scope 1913 of the HW register setting screen 1900) coincides with the I/O register scope (S2112).

Then, out of the HW registers selected at S2112, the address map edit processing part 813 selects, with reference to the internal work table 1700, the HW register whose value of the I/O register parity attribute coincides with the value of the space attribute of the SW register currently set (the content in the space attribute 1917 of the HW register setting screen 1900) (S2113). Here, the address map edit processing part 813 determines that the space attributes coincide with each others when the value of the space attribute of the SW register is "NORMAL" and the value of the I/O register parity attribute of the HW register is "PY," or when the value of the space attribute of the SW register is "PGEN" and the value of the I/O register parity attribute of the HW register is "NP." The address map edit processing part 813 displays the HW register selected at S2113 in the list box 2010 (S2114).

Thus, the address map edit processing part 813 acquires a setting of the space attribute that is information on whether the parity of the SW register is present. Then, as a candidate for an HW register to be associated with the SW register, the address map edit processing part 813 presents, to the user, the HW register in which the information on access control to the SW register and the I/O register scope coincide and the space attribute and the I/O register parity attribute coincide (S2115). In this way, in the design support system 1 of this embodiment, the HW register meeting the specification and design constraints of the SW register is automatically presented as a candidate. Accordingly, the user can associate the SW register with the HW register easily and simply, without checking the specification and design constraints of the SW register and those of the HW register one by one.

The user sets the HW register setting screen 1900 as mentioned above, and subsequently, performs a predetermined operation for setting termination. Then, the address map edit processing part 813 temporarily stores the contents set in the SW register setting screen 1800 and the HW register setting screen 1900, and determines whether or not allocation of all the HW registers of the integrated circuit 300 is completed (S1615 in FIG. 16). If an HW register not having been allocated to the SW register exists, the process returns to S1613. If allocation of all the HW registers is completed (S1615: YES), the process goes to S1621.

Note that in the above-mentioned determination, when an HW register in which an unallocated bit remains (the HW register in which "SPLIT" is kept set as the status of the internal work table 1700) exists, the address map edit processing part 813 may determine that allocation of all the HW registers is not completed yet until all the bits thereof are allocated to the SW register.

In S1621, the address map edit processing part 813 reflects the above-mentioned setting contents, which is temporarily stored, in the address map information 853. As shown in FIG. 16, the address map information 853 includes scope management import information 1661 and address map import information 1662. FIG. 22A shows a data structure of the scope management import information 1661, and FIG. 22B shows a data structure of the address map import information 1662, respectively.

As shown in FIG. 22A, the scope management import information 1661 is formed of one or more records each having items of an I/O register upper address where an upper address of an I/O register block is set, an I/O register scope where the scope of the I/O register (CMN/region) is set, an I/O register scope instance name where the name of an instance of the scope is set, and an I/O block ID where an identifier of the I/O register block is set.

As shown in FIG. 22B, the address map import information 1662 is formed of one or more records each having items of an I/O register scope where the scope of an I/O register (CMN/region) is set, an I/O block ID where an identifier of the I/O register block is set, an I/O register lower address where a lower address of the I/O register block is set, an SW register name where the name of an SW register is set, an SW register attribute where the attribute of the SW register is set, an SW register space attribute where the space attribute of the SW register is set, an HW register name where the name of an HW register is set, an HW register initial value where an initial value (synchronous reset information) of the HW register is set, a start bit position where a start hit position of the HW register is set when the status is "SPLIT," a stop bit position where a stop bit position of the HW register is set when the status is "SPLIT."

As mentioned above, according to the design support system 1 of this embodiment, an unallocated HW register and an HW register in which an unallocated bit remains are automatically displayed as candidates. Thereby, the user can easily set the association of the SW register with the HW register by selecting an HW register from the candidates. Thus, since the SW register can be associated with the HW register simply, the SW register can be associated with the HW register easily and accurately, even when a huge number of the SW registers and the HW registers needs to be associated. Moreover, in the allocation of the HW register to the SW register, the HW register meeting predetermined conditions such as coincidence of the parity attribute and coincidence of the scope is presented as a candidate. Accordingly, the HW register can be correctly associated with the SW register, without deviating from the design constraints.

=I/O Register Automatic Generation Processing S914=

Next, the I/O register automatic generation processing S914 will be described. In the I/O register automatic generation processing S914, the I/O register automatic generating part 814 generates the second behavior level design data 854 on the basis of the first behavior level design data 851 and the address map information 853 generated in the address map edit processing S913.

Hereinafter, the I/O register automatic generation processing S914 will be described along with a flow chart shown in FIG. 23. First, the I/O register automatic generating part 814 generates an I/O block management information table 2351, an SW register management information table 2352, and an HW register management information table 2353 on the basis of the address map information 853 (S2311 to S2313). FIGS. 24A to 24C show data structures of each table.

As shown in FIG. 24A, the I/O block management information table 2351 is foiled of one or more records each having items of an I/O register upper address where an upper address of an I/O block is set, an I/O register scope where the scope of the I/O register (CMN/region) is set, an I/O register scope instance name where the name of an instance of the I/O register scope is set, and an I/O block ID where an identifier of a block of the I/O register is set.

As shown in FIG. 24B, the SW register management information table 2352 is formed of one or more records each having items of an SW register name where the name of an SW register is set, an SW register attribute where the attribute of the SW register is set, an SW register space attribute where the space attribute of the SW register is set, an I/O register lower address where a lower address of an I/O register is set, an I/O register scope where the scope of the I/O register (CMN/region) is set, and an I/O block ID where an identifier of an I/O block to which the SW register belongs is set.

As shown in FIG. 24C, the HW register management information table 2353 is formed of one or more records each having items of an HW register name where the name of an HW register is set, an SW register name where the name of an SW register to which the HW register belongs is set, an HW register initial value where an initial value (synchronous reset information) of the HW register is set, a start bit position where a start bit position of the HW register is set when the status is "SPLIT," and a stop bit position where a stop bit position of the HW register is set when the status is "SPLIT."

Figure 25:
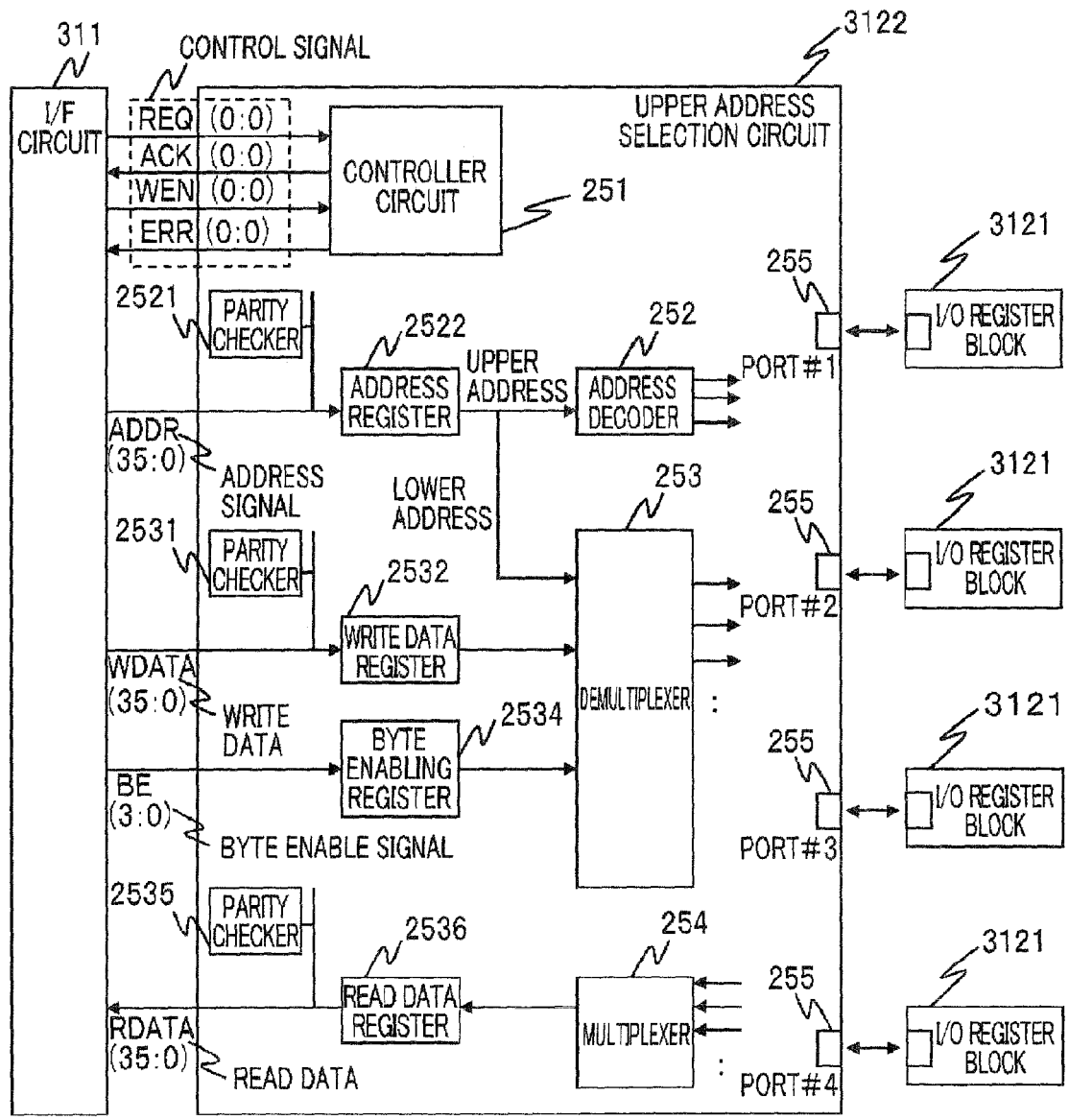
FIG. 25 is a conceptual diagram of an upper address selection circuit 3122.
Figure 26:
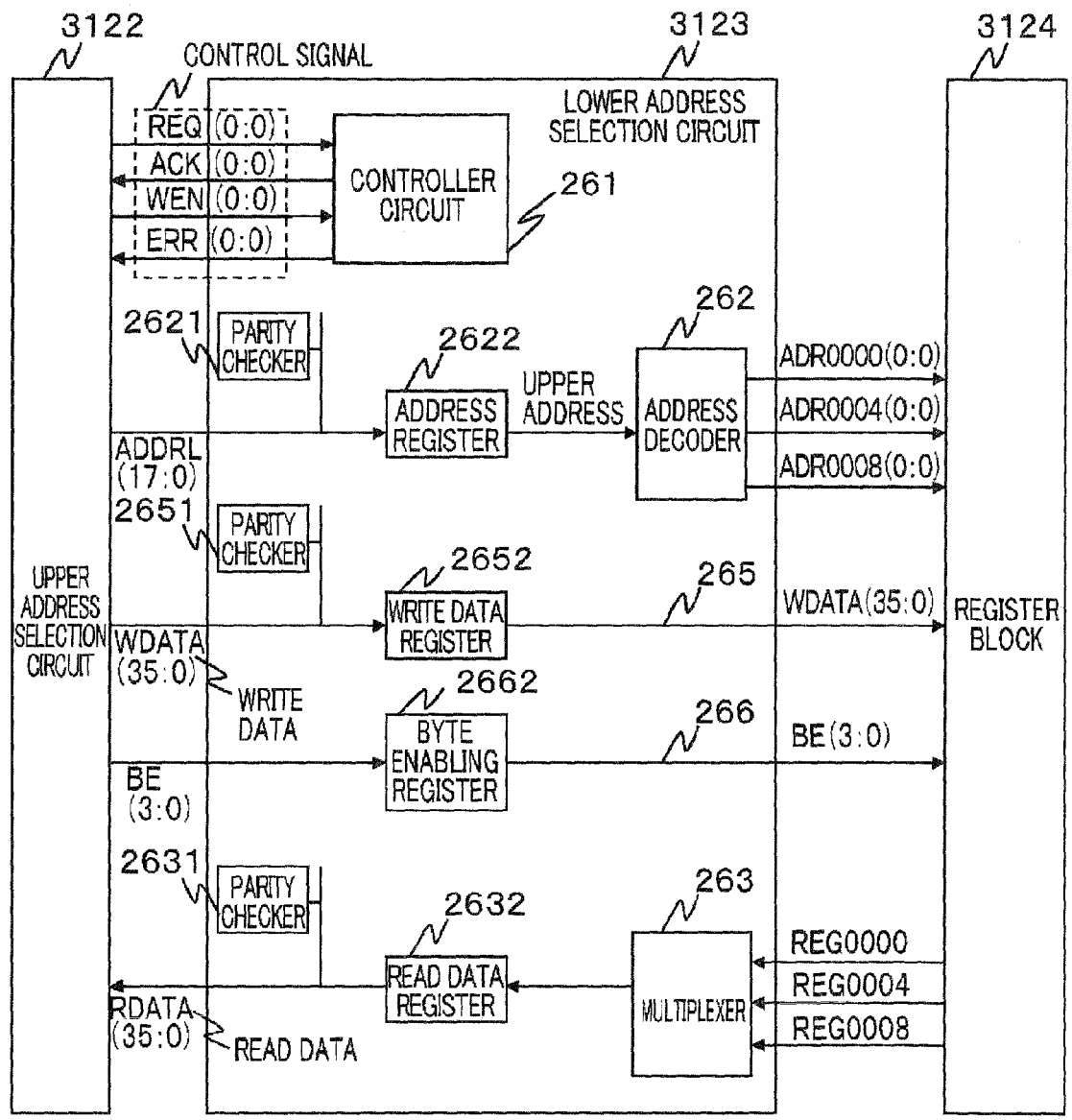
FIG. 26 is a conceptual diagram of a lower address selection circuit 3123.

Next, the I/O register automatic generating part 814 generates design data of the upper address selection circuit 3122 and design data of the lower address selection circuit 3123 shown in FIG. 8C on the basis of the first behavior level design data 851 (S2314, S2315, S2316). FIG. 25 shows a conceptual diagram of the upper address selection circuit 3122 to be generated. FIG. 26 shows a conceptual diagram of the lower address selection circuit 3123.

Upper Address Selection Circuit

As shown in FIG. 25, the upper address selection circuit 3122 has a controller circuit 251, an address decoder 252, a demultiplexer 253, a multiplexer 254, and ports 255 for communicating with the I/O register blocks 3121.

Out of these, the controller circuit 251 synchronizes communications with the I/F circuit 311, and with each I/O register block. Control signals transmitted to and received from the processor device 350 through the control bus 301 (in FIG. 25, "REQ(0:0)" that is an I/O register access request signal, "ACK(0:0)" that is an I/O register access response signal, "WEN(0:0)" that is a write instruction signal, and "ERR(0:0)" that is an error detection flag during the I/O register access) are outputted from and inputted to the controller circuit 251 through the I/F circuit 311. Here, the I/O register block 3121 is a group of I/O registers grouped in accordance with the upper address.

The address decoder 252 selects the I/O register block 3121 to be accessed on the basis of the upper address. An upper address of an address signal ("ADDR(35:0)" in FIG. 25) sent from the processor device 350 through the address bus 302 is inputted to the address decoder 252 through the I/F circuit 311. As shown in FIG. 25, between the I/F circuit 311 and the address decoder 252, a parity checker 2521, which is a circuit that checks the parity of the address signal, and an address register 2522 that holds the address signal are provided.

The demultiplexer 253 selects a port 255 to which the I/O register block 3121 to be accessed is coupled, and transfers various signals (address signal/write data/byte enable signal) from the I/F circuit 311 to the I/O register block 3121 therethrough. A lower address of the address signal sent from the processor device 350 through the address bus 302 is inputted to the demultiplexer 253 through the I/F circuit 311. Moreover, the write data (in FIG. 25, "WDATA(35:0)") and the byte enable signal (in FIG. 25, "BE(3:0)") sent from the processor device 350 are inputted to the demultiplexer 253 through the I/F circuit 311. As shown in FIG. 25, between the I/F circuit 311 and the demultiplexer 253, a parity checker 2531, which is a circuit that checks the parity of the write data, a write data register 2532 that holds the write data, and a byte enabling register 2534 that holds the byte enable signal are provided.

The multiplexer 254 selects a port 255 to which the I/O register block 3121 to be accessed is coupled, and transfers the read data (in FIG. 25, "RDATA(35:0)") from the I/O register block 3121 to the I/F circuit 311 (processor device 350) therethrough. As shown in FIG. 25, between the I/F circuit 311 and the multiplexer 254, a parity checker 2535, which is a circuit that checks the parity of the read data, and a read data register 2536 that holds the read data are provided.

Lower Address Selection Circuit

As shown in FIG. 26, the lower address selection circuit 3123 includes a controller circuit 261, an address decoder 262, and a multiplexer 263.

Out of these, the controller circuit 261 synchronizes communications with the upper address selection circuit 3122, and with each of the register blocks 3124. The register block 3124 is a group of I/O registers provided in the I/O register block 3121. Control signals (in FIG. 26, "REQ(0:0)," "ACK(0:0)," "WEN(0:0)," and "ERR(0:0)") transmitted to and received from the upper address selection circuit 3122 are outputted from and inputted to the controller circuit 261. The controller circuit 261 sends a write instruction signal ("WEN(0:0)" in FIG. 26) to the register block 3124 in accordance with the above-mentioned control signals.

The address decoder 262 selects the register block 3124 to be accessed on the basis of the lower address (in FIG. 26, "ADDRL(17:0)") inputted from the upper address selection circuit 3122. As shown in FIG. 26, between the upper address selection circuit 3122 and the address decoder 262, a parity checker 2621, which is a circuit that checks the parity of the address signal, and an address register 2622 that holds the address signal are provided.

The multiplexer 263 selects (a port of) the register block 3124 to be accessed, and transfers the read data (in FIG. 26, "RDATA(35:0)") from the register block 3124 to the upper address selection circuit 3122 therethrough. As shown in FIG. 26, between the upper address selection circuit 3122 and the multiplexer 263, a parity checker 2631, which is a circuit that checks the parity of the read data, and a read data register 2632 that holds the read data are provided.

As shown in FIG. 26, in addition to the above-mentioned configuration, in the lower address selection circuit 3123, a path 265 that transmits the write data ("WDATA (35:0)" in FIG. 26) from the upper address selection circuit 3122 to the register block 3124 and a path 266 that transmits the byte enable signal ("BE (3:0)" in FIG. 26) from the upper address selection circuit 3122 to the register block 3124 are provided. Out of these, in the path 265, a parity checker 2651, which is a circuit that checks the parity of the write data, and a write data register 2652 that holds the write data are provided. Moreover, a byte enabling register 2662 that holds the byte enable signal is provided in the path 266.

Register Block

Figure 23:
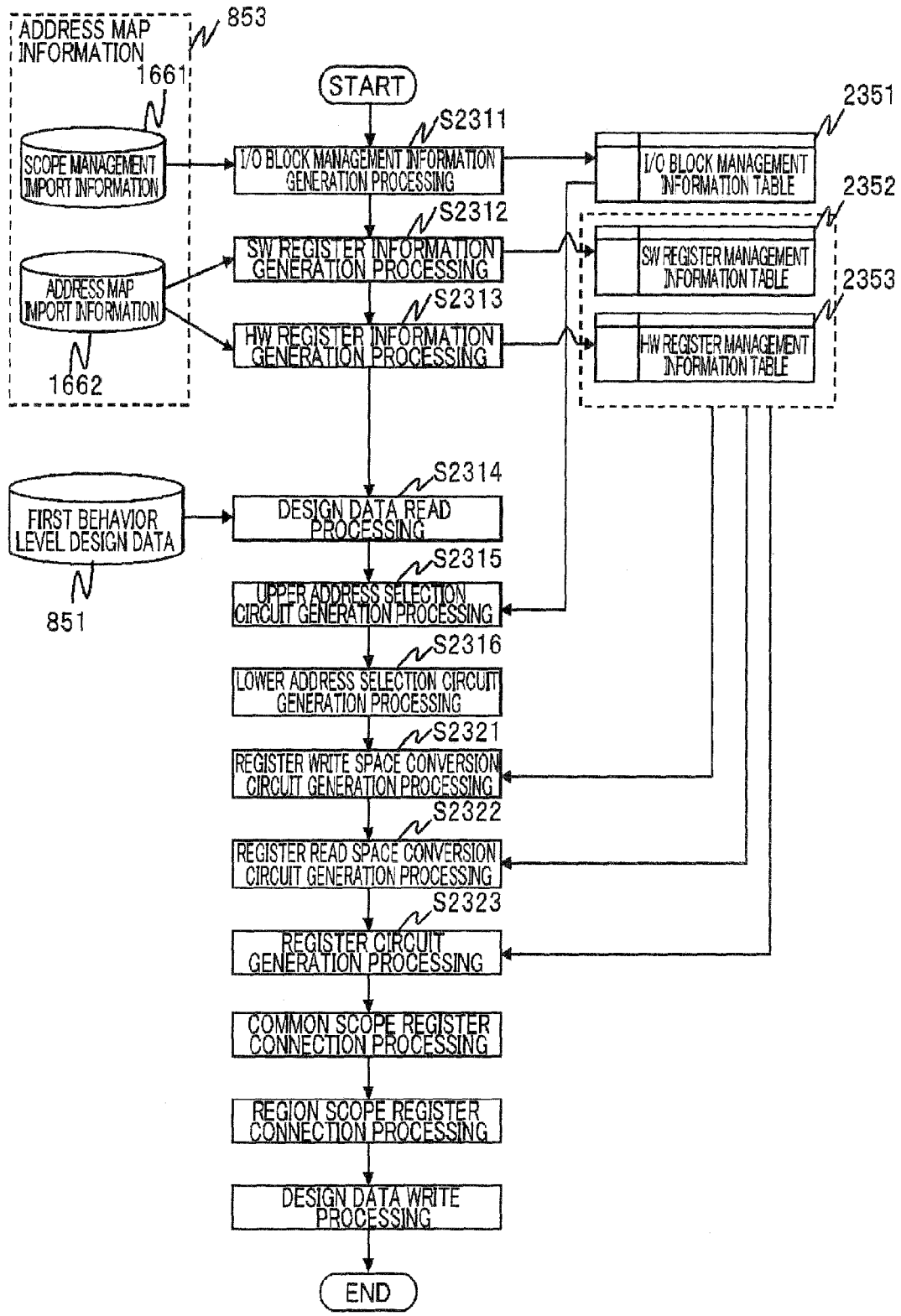
FIG. 23 is a flow chart illustrating I/O register automatic generation processing S914.
Figure 27:
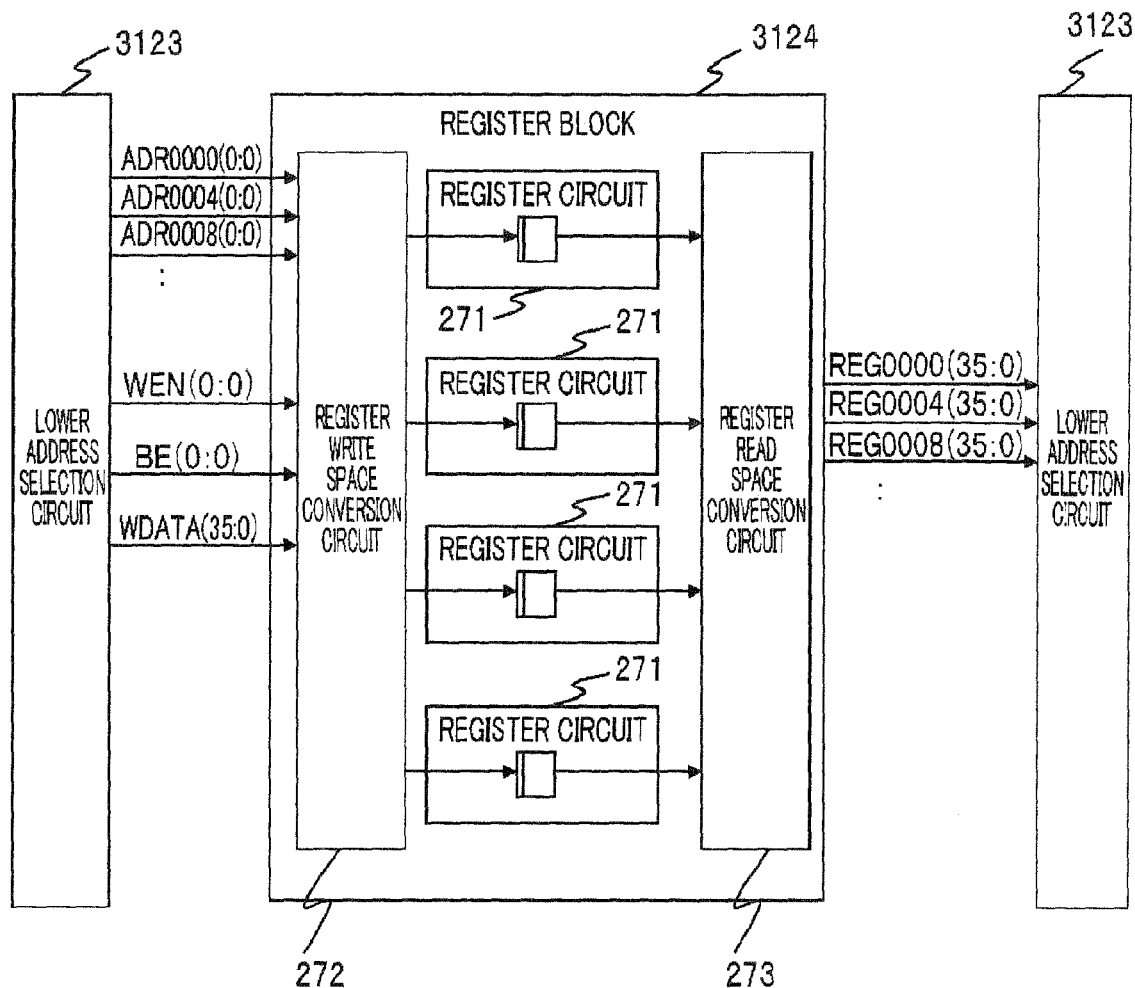
FIG. 27 is a conceptual diagram of a register block 3124.

At S2321 to S2323 of FIG. 23, the I/O register automatic generating part 814 generates design data of an internal structure of the register block 3124. FIG. 27 shows a conceptual diagram of the register block 3124 generated by the I/O register automatic generating part 814.

As shown in FIG. 27, the register block 3124 includes a register write space conversion circuit 272, a register read space conversion circuit 273, and a register circuit 271 which is a circuit that implements the HW register (entity of the HW register). The register write space conversion circuit 272 performs signal conversion in accordance with the association (the content of the address map information 853) of the address of the SW register (the address space of the SW register) with the address of the HW register (the address space of the HW register) in the writing of data to the HW register. The register read space conversion circuit 273 performs signal conversion in accordance with the association (the content of the address map information 853) of the address of the SW register with the address of the HW register in the reading of data from the HW register.

Register Write Space Conversion Circuit

Out of these, design data of the register write space conversion circuit 272 is generated in the processing at S2321 in FIG. 23 executed by the I/O register automatic generating part 814 (hereinafter, referred to as register write space conversion circuit generation processing S2321).

Figure 28A:
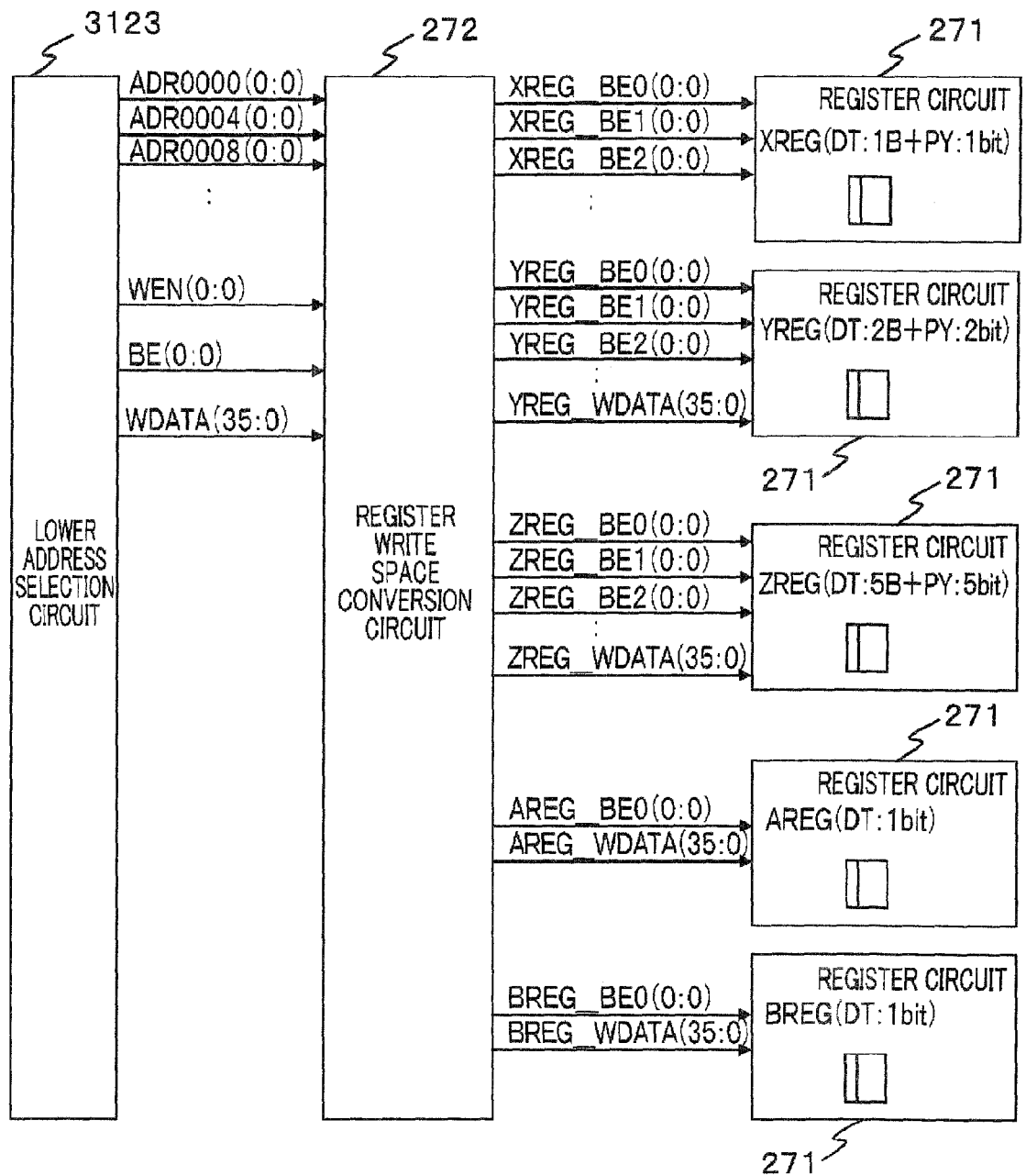
FIG. 28A is a diagram illustrating logic of signal conversion of a register write space conversion circuit 272.

FIGS. 28A to 28C are diagrams illustrating logic of signal conversion of the register write space conversion circuit 272. Out of these, FIG. 28A shows a flow of a signal among the lower address selection circuit 3123, the register write space conversion circuit 272, and the register circuit 271 in the writing of data to the HW register. FIG. 28B shows the association of the address space of the SW register with the address space of the HW register defined in the address map information 853. FIG. 28C shows an example of logic of signal conversion generated at the register write space conversion circuit generation processing S2321.

In each of FIGS. 28A to 28C, "XREG," "YREG," "ZREG," "AREG," and "BREG" each indicate an HW register. Out of these, "XREG," "AREG," and "BREG" are each a register having a bit size of 1 byte. "YREG" is a register of 2 byte. "ZREG" is a register of 5 byte. An expression such as "XREG_BE0," "YREG_BE0," or "ZREG_BE4" represents a particular area of 1 byte in each HW register.

An expression of "ADRxxxx" represents an address of an SW register. An expression such as "BE(3)" means a byte enable signal. A value within parentheses is the specification of a particular 1 byte of the SW register. In FIGS. 28A to 28C, "BE(3)," "BE(2)," "BE(1)," and "BE(0)" denote byte enable signals respectively specifying the first byte, the second byte, the third byte, and the fourth byte of the SW register.

"DT" in an expression such as "XREG (DT:1B+PY: 1 bit)" means data. "B" in expressions such as "1B," "2B," means a byte. "PY" means a parity bit. "Lower address" in an expression such as "lower address=0x0000," is a lower address of an SW register. "Space attribute" in expressions such as "space attribute=NORMAL," "space attribute=PGEN," is the space attribute 1828 set in the SW register setting screen 1800 mentioned above.

For example, "XREG_BE0<=WEN and ADR0000 and BE(3):" in FIG. 28C represents logic that a writing target of a write instruction signal "WEN" is "XREG_BE0" of "XREG" if a value of the write instruction signal "WEN" is "1", a value of ADR0000 of an SW register is "1", and a value of the byte enable signal (BE(3)) of the SW register is "1". Moreover, for example, "YREG_BE0<=WEN and ADR0000 and BE(2);" represents logic that a writing target of the write instruction signal (WEN) is "YREG_BE0" of "YREG" if a value of the write instruction signal "WEN" is "1", a value of "ADR0000" of the SW register is "1", and a value of the byte enable signal "BE(2)" of the SW register is "1".

On the other hand, in FIG. 28C, "ZREG_BE4<=WEN and ADR0000 and BE(0)", "ZREG_BE3<=WEN and ADR0004 and BE(3):", "ZREG_BE2<=WEN and ADR0004 and BE(2):", "ZREG_BE1<=WEN and ADR0004 and BE(1):", and "ZREG_BE0<=WEN and ADR0004 and BE(0):" each represent logic of signal conversion when the same HW register is allocated to multiple SW registers (a case where "SPLIT" is set in the status of the internal work table in FIG. 17). Namely, as shown in FIG. 28B, a part of "ZREG" (ZREG [39:32]) is allocated to a particular 1 byte (in FIG. 28B, +3) of the SW register having a lower address of "0x0000", and the other part of "ZREG" (ZREG [31:0]) is allocated to a particular 1 byte (in FIG. 28B, +0) of the SW register having a lower address of "0x0004". The above-mentioned logic has a content corresponding to this.

Thus, the I/O register automatic generating part 814 automatically generates the logic of signal conversion in accordance with the association of the address of the SW register with the address of the HW register (the content of the address map information 853), which is needed in the writing of data to the HW register. Moreover, when the same HW register is allocated to multiple SW registers (when "SPLIT" is set in the status of the internal work table in FIG. 17), by use of the byte enable signal, the I/O register automatic generating part 814 generates the logic of signal conversion so as to correctly associate the addresses of the SW registers with the address of the HW register in accordance with the content of the address map information 853. In this way, in this embodiment, accurate logic of signal conversion can be automatically generated in accordance with the association of the address of the SW register with the address of the HW register collectively managed in the address map information 853.

Register Read Space Conversion Circuit

In the processing at S2322 in FIG. 23 executed by the I/O register automatic generating part 814 (hereinafter, referred to as register read space conversion circuit generation processing S2322), design data of the register read space conversion circuit 273 is generated.

Figure 29A:
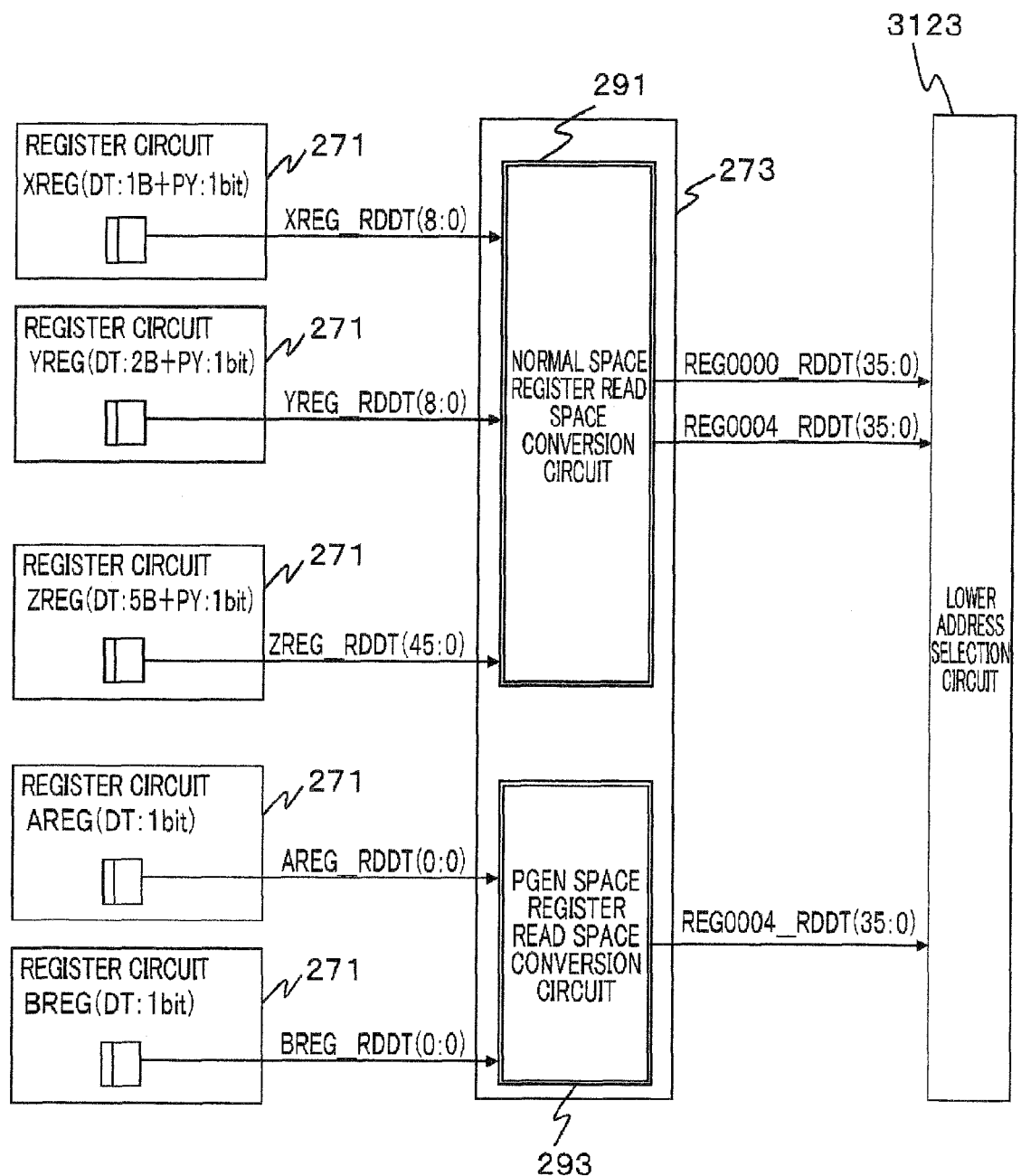
FIG. 29A is a diagram illustrating logic of signal conversion of a register read space conversion circuit 273.

FIGS. 29A to 29D are drawings illustrating logic of signal conversion of the register read space conversion circuit 273. Out of these, FIG. 29A shows a flow of a signal among the lower address selection circuit 3123, the register read space conversion circuit 273, and the register circuit 271 in the reading of data from the HW register.

FIG. 29B shows the association of the address space of the SW register with the address space of the HW register defined in the address map information 853. FIGS. 29C and 29D show an example of logic of signal conversion generated at the register read space conversion circuit generation processing S2322.

In each of FIGS. 29A to 29D, expressions such as "REG0000_RDDT(35)", "REG0000_RDDT(31 downto 24)", each indicate a particular address of an SW register. Expressions such as "XREG_RDDT(8)", "XREG_RDDT (7 downto 0)", each indicate a particular address of an HW register. Here, "downto" indicates the range of the address. For example, "REG0000_RDDT(31 downto 24)" means ranging from 31 bit to 24 bit of the SW register "REG0000", and "XREG_RDDT(7 downto 0)" means ranging from 7 bit to 0 bit of the HW register "XREG". Other expressions in each drawing are the same as those of FIGS. 28A to 28C mentioned above.

The logic of signal conversion generated at the register read space conversion circuit generation processing S2322 varies depending on the value of the space attribute 1828 set for a target SW register. FIG. 29C is the logic of signal conversion generated when the value of the space attribute 1828 of the SW register is "NORMAL", while FIG. 29D is the logic of signal conversion generated when the value of the space attribute 1828 of the SW register is "PGEN". Here, when the value of the space attribute of the SW register is "NORMAL", a NORMAL space register read space conversion circuit 291 in FIG. 29A performs the signal conversion. When the value of the space attribute of the SW register is "PGEN", a PGEN space register read space conversion circuit 293 in FIG. 29A performs the signal conversion.

When the value of the space attribute of the SW register is "NORMAL", the HW register holds the guarantee code. Accordingly, in this case, it is necessary for the SW register to take over the value of the parity (guarantee code) held by the HW register. As shown in FIG. 29C, when the value of the space attribute of the SW register is "NORMAL", logic of signal conversion for allowing the SW register to take over the value of the parity (guarantee code) held by the HW register from the HW register is generated, in addition to logic of signal conversion for associating bits in which the read data between the SW register and the HW register is stored.

In FIG. 29C, "REG0000_RDDT(31 downto 24)<=XREG_RDDT(7 downto 0)", "REG0000_RDDT(23 downto 8)<=YREG_RDDT(15 downto 0)", "REG0000_RDDT(7 downto 0)<=ZREG_RDDT(39 downto 32):", and "REG0004_RDDT(31 downto 0)<=ZREG_RDDT(31 downto 0):" are the logic of signal conversion for associating the bits in which the read data between the SW register and the HW register is stored.

On the other hand, "REG0000_RDDT(35)<=XREG_RDDT(8):", "REG0000_RDDT(34)<=YREG_RDDT(17):", "REG0000_RDDT(33)<=VREG_RDDT(16):", "REG0000_RDDT(32)<=ZREG_RDDT(44):", "REG0004_RDDT(35)<=ZREG_RDDT(43):", "REG00004_RDDT(34)<=ZREG_RDDT(42):", "REG0004_RDDT(33)<=ZREG_RDDT(41):", and "REG0004_RDDT(32)<=ZREG_RDDT(40):" are the logic of signal conversion for allowing the SW register to take over the value of the parity held by the HW register from the HW register.

When the value of the space attribute 1828 of the SW register is "PGEN", the HW register holds no parity. Accordingly, it is necessary to generate a value of the parity to be held by the SW register. As shown in FIG. 29D, when the value of the space attribute 1828 of the SW register is "PGEN", the logic of signal conversion for generating the value of the parity and then setting the generated parity value in the parity bit of the SW register is generated in addition to the logic of signal conversion for associating the bits in which the read data between the SW register and the HW register is stored.

In FIG. 29D, "REG0008_RDDT(35)<='1' xor '0' xor '0' xor '0' xor '0' xor '0' xor '0' xor AREG(0) xor '0':", "REG0008_RDDT(34)<='1' xor '0' xor '0' xor '0' xor '0' xor '0' xor '0' xor '0' xor '0':", "REG0008_RDDT(33)<='1' xor '0' xor '0' xor '0' xor '0' xor '0' xor '0' xor '0' xor '0':", and "REG0008_RDDT(32)<='1' xor '0' xor BREG(0) xor '0' xor '0' xor '0' xor '0' xor '0 'xor '0':" are the logic of signal conversion for generating the value of the parity to be held by the SW register and setting the generated parity value to the parity bit of the SW register.

On the other hand, "REG0008_RDDT(31 downto 24)<="000000" & AREG(0) & '0':", "REG0008_RDDT(23 downto 16)<="00000000":", "REG0008_RDDT(15 downto 8)<="00000000":", and "REG0008_RDDT(7 downto 0)<='0' & BREG(0) & "000000":" are the logic of signal conversion for associating the bits in which the read data between the SW register and the HW register is stored.

Thus, the I/O register automatic generating part 814 automatically generates the logic of signal conversion in accordance with the association of the address of the HW register with the address of the SW register (the content of the address map information 853), which is needed in the reading of data from the HW register. When the same HW register is allocated to multiple SW registers (when "SPLIT" is set as the status of the internal work table in FIG. 17), by use of the byte enable signal, the I/O register automatic generating part 814 generates the logic of signal conversion so as to correctly associate the addresses of the SW registers with the address of the HW register in accordance with the content of the address map information 853. In this way, in this embodiment, accurate logic of signal conversion can be automatically generated in accordance with the association of the address of the SW register with the address of the HW register collectively managed in the address map information 853.

Moreover, when the value of the space attribute 1828 of the SW register is "NORMAL", the I/O register automatic generating part 814 automatically generates the logic for allowing the SW register to take over the value of the parity held by the HW register. When the value of the space attribute 1828 of the SW register is "PGEN", the I/O register automatic generating part 814 automatically generates the logic of signal conversion for generating the value of the parity and setting the generated parity value in the parity bit of the SW register. In this manner, the design support system 1 of this embodiment automatically generates the logic of signal conversion for the takeover of the parity value or the generation of the parity depending on the value of the space attribute 1828 of the SW register. Accordingly, the appropriate logic of signal conversion can be automatically generated, without making the user conscious of differences in the space attribute 1828 of the SW register.

As described so far, when allocating, to an SW register, an HW register having a bit size larger than the bit size of the SW register, the I/O register automatic generating part 814 generates the register write space conversion circuit 272 or the register read space conversion circuit 273, which has a circuit that converts SW addresses of multiple SW registers into the address of the one HW register. Thus, according to the design support system 1 of this embodiment, even when an HW register is allocated to multiple SW registers, the register write space conversion circuit 272 and the register read space conversion circuit 273 which correspond to this case can be automatically generated.

Register Circuit

In the processing at S2323 in FIG. 23 executed by the I/O register automatic generating part 814 (hereinafter, referred to as register circuit generation processing S2323), design data of the register circuit 271 (entity of the I/O register) is generated.

Figure 30:
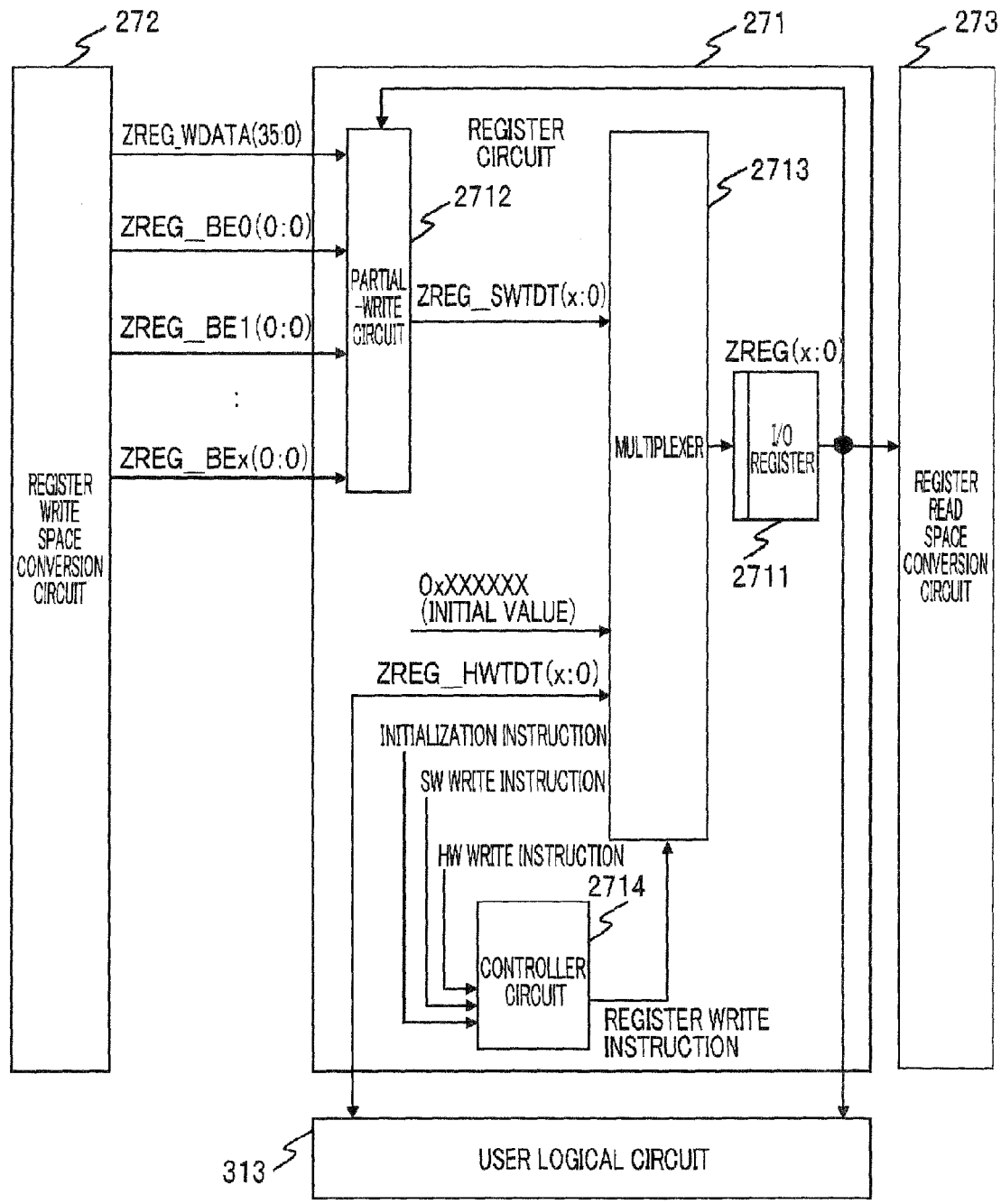
FIG. 30 is a conceptual diagram of a register circuit 271 generated by an I/O register automatic generating part 814.

FIG. 30 shows a conceptual diagram of the register circuit 271 to be generated. As shown in FIG. 30, the register circuit 271 includes an I/O register 2711 (HW register), a partial-write circuit 2712, a multiplexer 2713, and a controller circuit 2714.

The partial-write circuit 2712 writes the write data inputted from the register write space conversion circuit 272 into the I/O register 2711 in accordance with the byte enable signal (in FIG. 30, ZREG_BE0(0:0), etc.) inputted from the register write space conversion circuit 272.

Figure 31A:
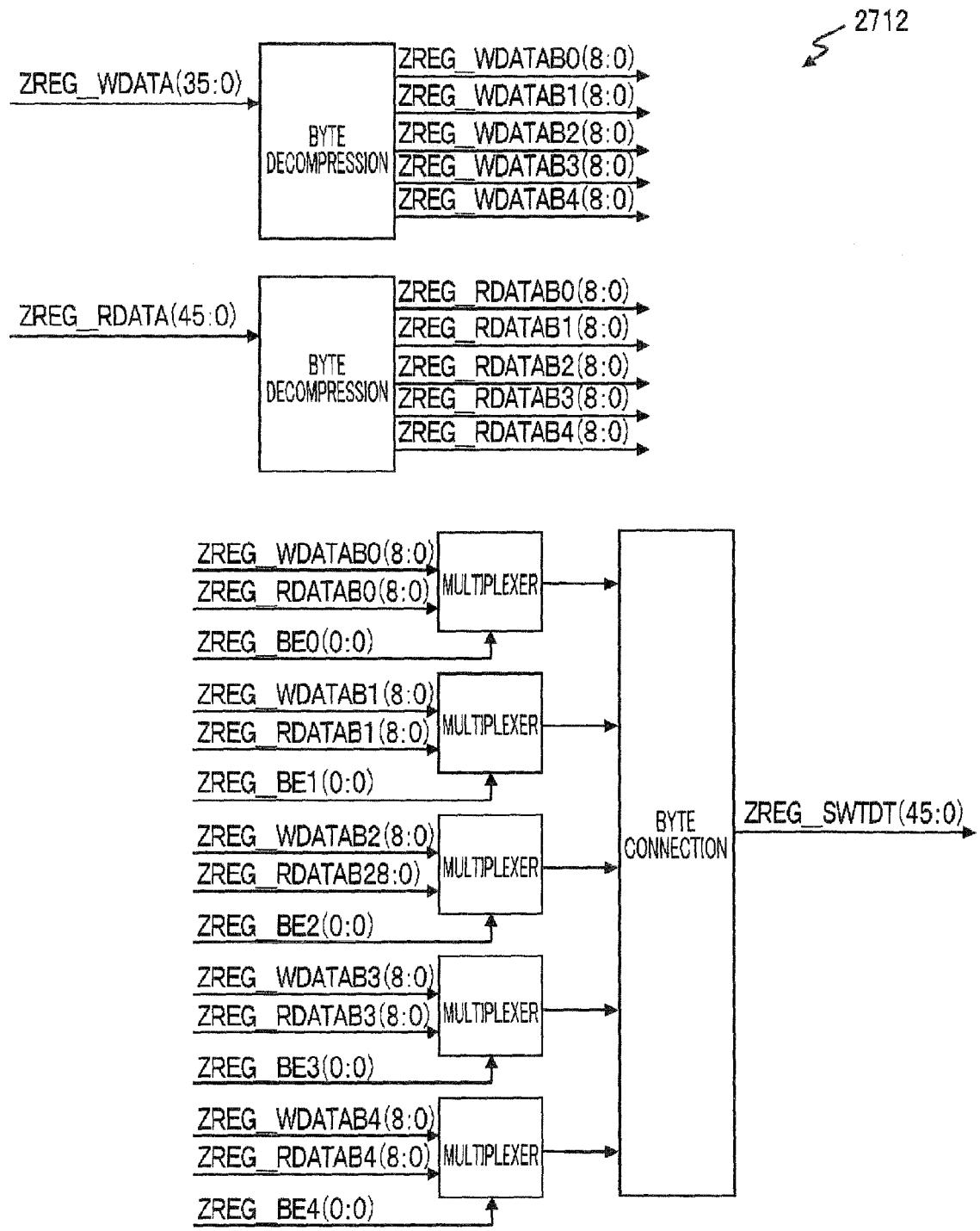
FIG. 31A is a diagram illustrating operation of a partial-write circuit 2712.

FIG. 31A is a diagram illustrating operation of the partial-write circuit 2712. For example, "ZREG_WDATA(35:0)" in FIG. 31A is the write data inputted from the register write space conversion circuit 272 into "ZREG" (I/O register 2711). "ZREG_WDATAB0 (8:0) is data (9-bit data with parity) obtained by dividing the write data "ZREG_WDATA (35:0)" into bytes (hereinafter, referred to as byte decompression) in accordance with the address map information 853. FIG. 31B shows a logical formula for byte decompression.

As shown in FIG. 31A, by synthesizing pieces of data subjected to byte decompression in accordance with the byte enable signal (in FIG. 31A, "ZREG_BE0(0:0)") (byte connection), the partial-write circuit 2712 generates data for the partial writing into the I/O register 2711 (in FIG. 31A, "ZREG_SWTDT (45:0)").

The multiplexer 2713 shown in FIG. 30 transfers the data "ZREG_SWTDT (45:0)" outputted from the partial-write circuit 2712 to the I/O register 2711 (writes the data into the I/O register 2711) in accordance with a write control signal from the controller circuit 2714.

The controller circuit 2714 shown in FIG. 30 controls the multiplexer 2713 in response to a write instruction from the processor device 350 to the I/O register 2711 (hereinafter, referred to as an SW write instruction), a write instruction from the user logical circuit 313 to the I/O register 2711 (hereinafter, referred to as an HW write instruction), an instruction from an initialization instruction circuit (hereinafter, referred to as an initialization instruction), and a memory protection instruction. Here, the above-mentioned initialization instruction circuit is the circuit automatically generated by the design support system 1 when "INI" is set in the register attribute 1827 mentioned above. The above-mentioned memory protection instruction is a signal, which is inputted into the controller circuit 2714, for controlling the writing into the I/O register 2711 when "PROTECT" is set in the register attribute 1827 mentioned above.

Figure 32:
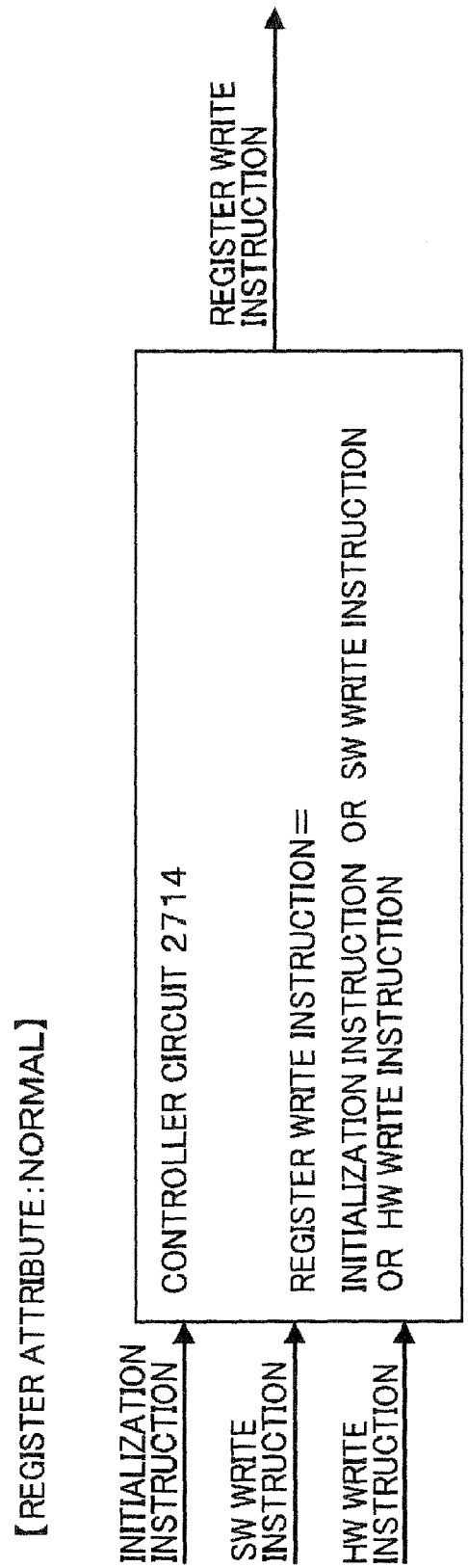
FIG. 32 is a diagram illustrating the logic of control of a multiplexer 2713 performed by a controller circuit 2714 when "NORMAL" is set in a register attribute 1827.

FIG. 32 is a diagram illustrating the logic of control of the multiplexer 2713 performed by the controller circuit 2714 in response to the SW write instruction, the HW write instruction, and the initialization instruction when "NORMAL" is set in the register attribute 1827. When either of the initialization instruction, the SW write instruction, and the HW write instruction has a content of an instruction to write data to the I/O register 2711, the controller circuit 2714 outputs, to the multiplexer 2713, an instruction to write data (instruction to write the data "ZREG_SWTDT(x:0)" inputted from the partial-write circuit 2712 to the I/O register 2711).

Figure 33:
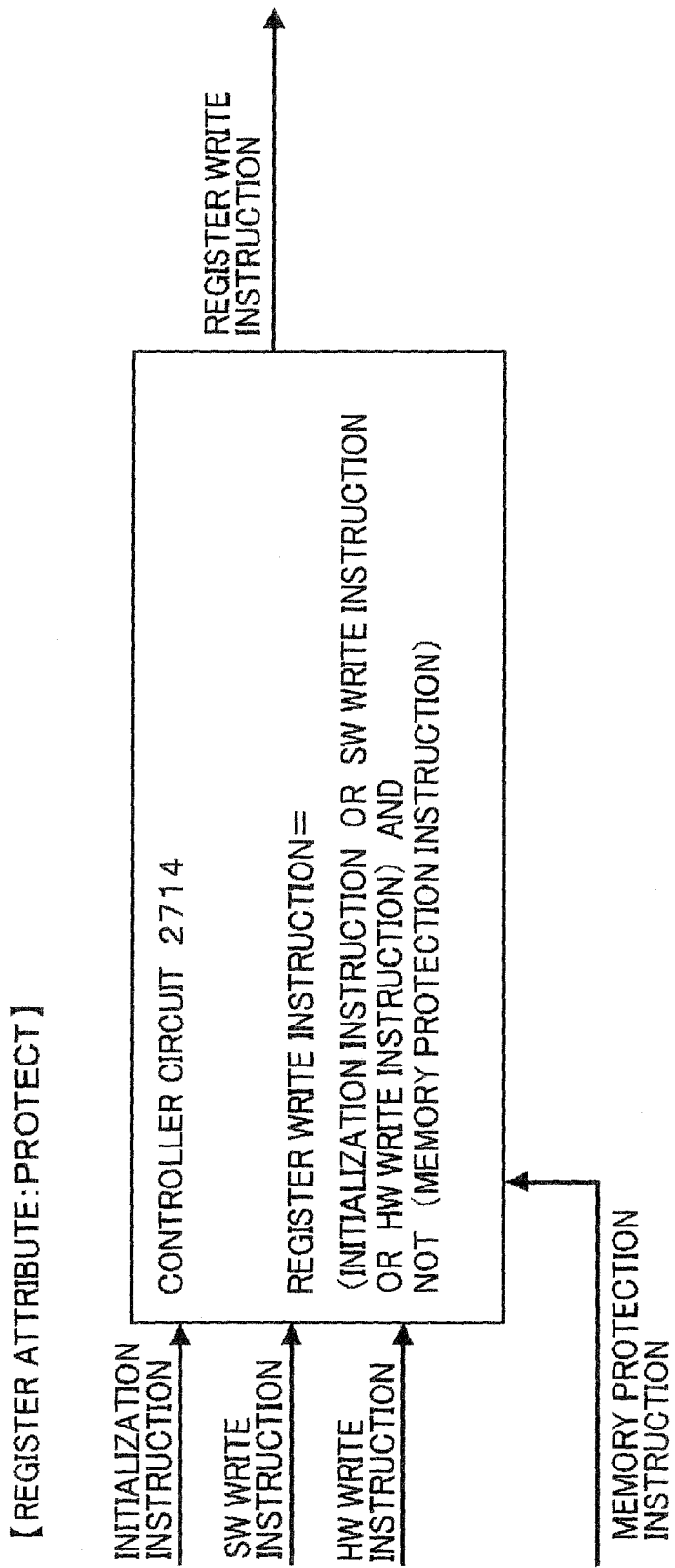
FIG. 33 is a diagram illustrating the logic of control of the multiplexer 2713 performed by the controller circuit 2714 when "PROTECT" is set in the register attribute 1827.

FIG. 33 is a diagram illustrating the logic of control of the multiplexer 2713 performed by the controller circuit 2714 in response to the SW write instruction, the HW write instruction, the initialization instruction, and the memory protection instruction when "PROTECT" is set in the register attribute 1827. As shown in FIG. 33, when either of the initialization instruction, the SW write instruction, and the HW write instruction has a content of an instruction to write data to the I/O register 2711, and the memory protection instruction has a content to allow the writing to the I/O register 2711, the controller circuit 2714 outputs, to the multiplexer 2713, an instruction to write data (instruction to write the data "ZREG_SWTDT(x:0)" inputted from the partial-write circuit 2712 to the I/O register 2711).

Figure 34:
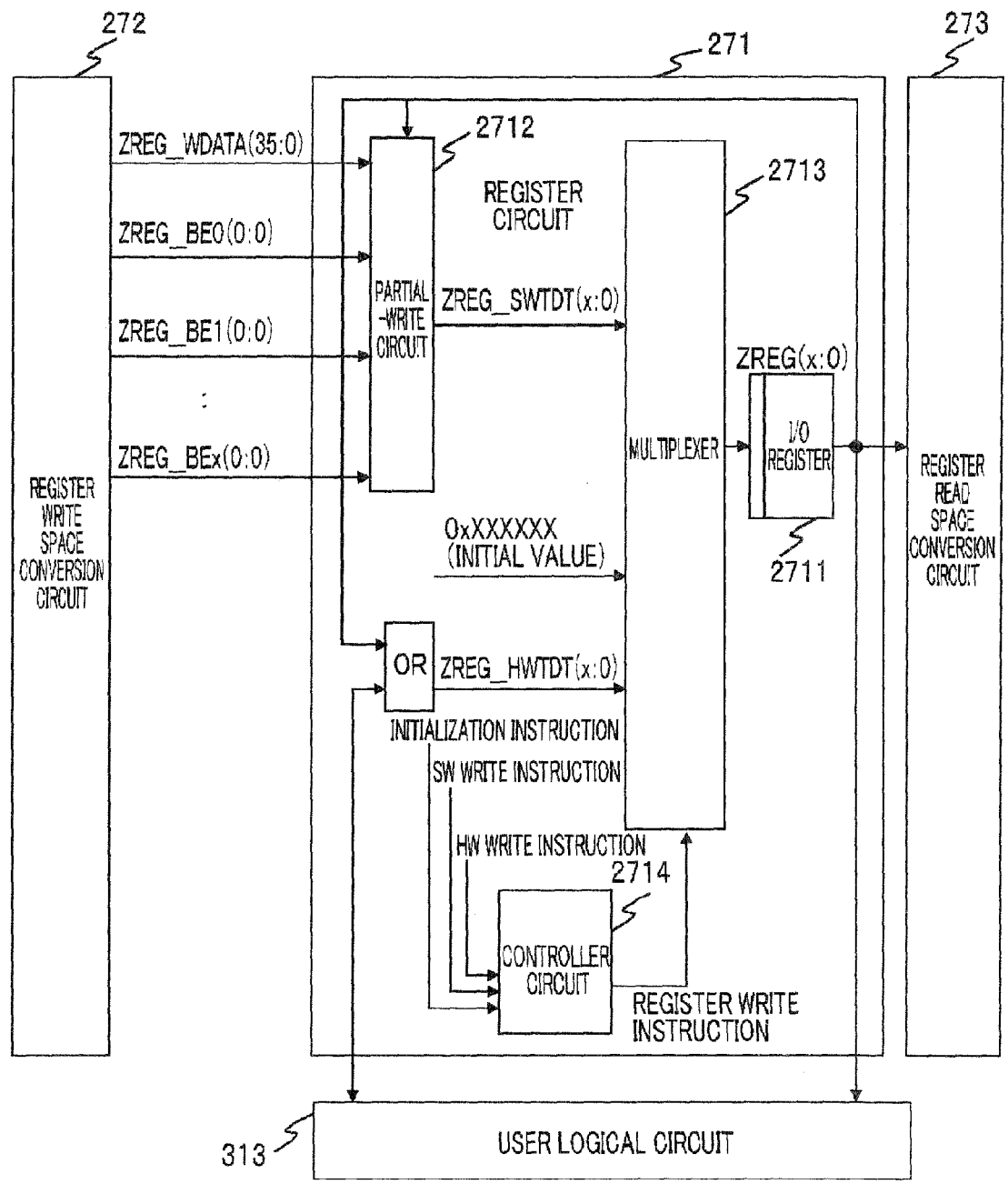
FIG. 34 is a conceptual diagram of design data generated when "ERR" is set in the register attribute 1827.

FIG. 34 is a conceptual diagram of design data generated when "ERR" is set in the register attribute 1827. In a case where "ERR" is set in the register attribute 1827, as similar to the case where "NORMAL" is set therein, the controller circuit 2714 outputs, to the multiplexer 2713, an instruction to write data (instruction to write the data "ZREG_SWTDT(x: 0)" inputted from the partial-write circuit 2712 to the I/O register 2711) when either of the initialization instruction, the SW write instruction, and the HW write instruction has a content of an instruction to write the data to the I/O register 2711. On the other hand, as shown in FIG. 34, as for data that the user logical circuit 313 instructs to write, a logical sum of the write data and a content having been written to the I/O register 2711 is written to the I/O register 2711.

Figure 35:
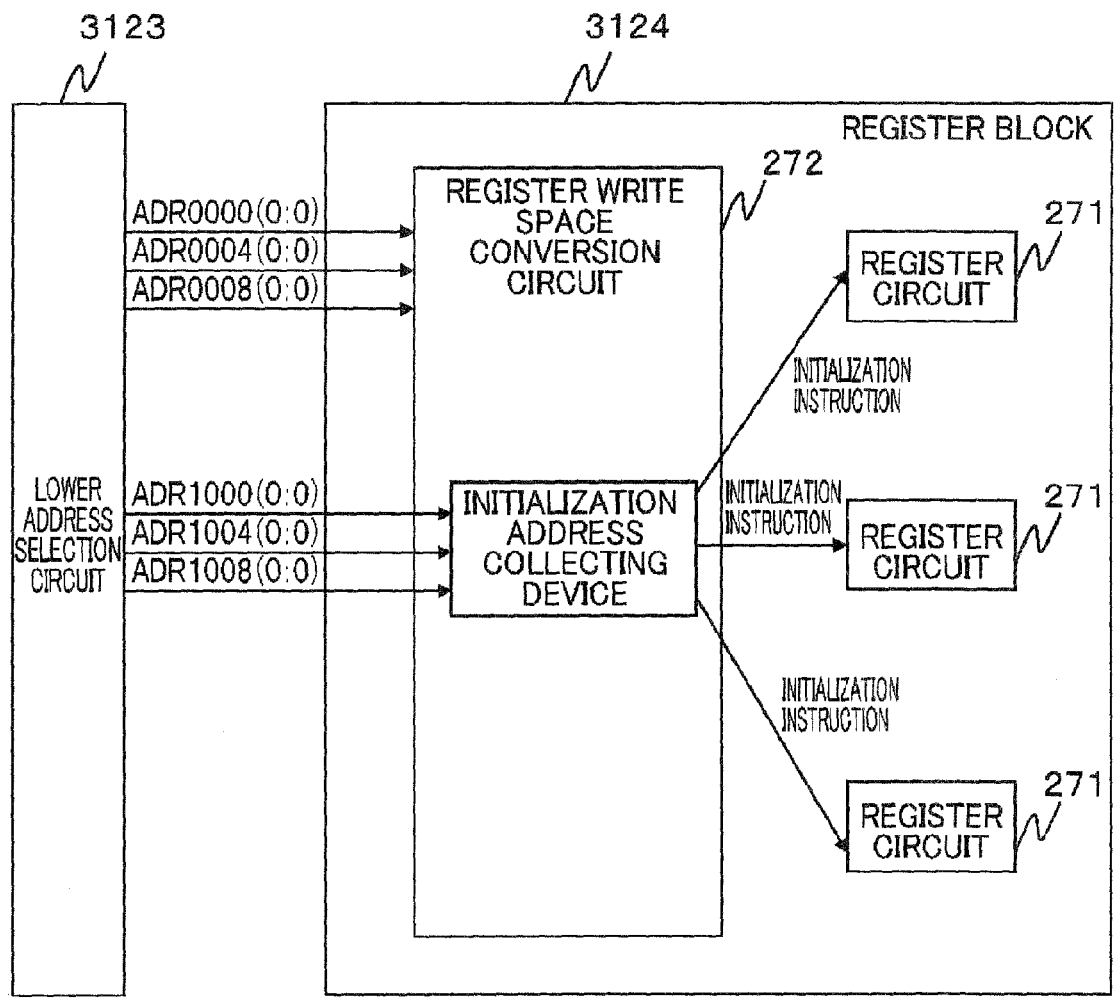
FIG. 35 is a conceptual diagram of an initialization instruction circuit generated when "INI" is set in the register attribute 1827.

FIG. 35 is a conceptual diagram of the above-mentioned initialization instruction circuit generated when "INI" is set in the register attribute 1827. The initialization instruction circuit is the circuit for generating the initialization instruction mentioned above for each register circuit 271 generated by the I/O register automatic generating part 814. The initialization instruction circuit asserts the initialization instruction to each register circuit 271 when data is written to the HW register (I/O register 2711) in which "INI" is set.

As mentioned above, when generating the internal structure of the I/O register circuit 312, the I/O register automatic generating part 814 generates the register circuit 271 that is the entity of the I/O register, as well as generates the register write space conversion circuit 272 and the register read space conversion circuit 273, which are the interfaces between the register circuit 271 and the processor device 350 side. Thus, the register circuit 271, and the register write space conversion circuit 272 and the register read space conversion circuit 273 are automatically generated at the same time. Thereby, occurrence of concentrated wiring and long distance wiring, which may be caused if these circuits are separately generated, can be reduced.

Moreover, by the control of the multiplexer 2713 in accordance with the register attribute of the SW register, the register circuit 271 including the controller circuit 2714 that allows or prohibits the writing of data to the I/O register by the multiplexer 2713 is automatically generated. Thus, according to the design support system 1 of this embodiment, the user can generate the register circuit having the desired register attribute by only specifying the register attribute in the SW register.

As described so far, according to the design support system 1 of this embodiment, on the basis of the first behavior level design data 851 subjected to modeling, the I/O register access information extracting part 812 generates the I/O register access information 852 including the information on access control (scope) from the user logical circuit 313 to the I/O register and the information on the specification of the I/O register.

Moreover, on the basis of the generated I/O register access information 852 and the association of the SW address with the HW address acquired through the user interface, the address map edit processing part 813 generates the address map information 853 including the information on the association of the SW register with the HW register. Then, on the basis of the first behavior level design data 851 and the generated address map information 853, the I/O register automatic generating part 814 generates the second behavior level design data 854, which is the design data at the behavior level that describes the internal structure of the I/O register circuit described in the first behavior level design data 851.

Thus, according to the design support system 1 of this embodiment, by only correctly setting the association of the SW address with the HW address, the user can efficiently generate the second behavior level design data 854 in which the internal structure of the I/O register circuit is described, on the basis of the first behavior level design data 851.

Although this embodiment has been described so far, the above-mentioned embodiment is intended for easy understanding of the present invention, and not for limited interpretation of the present invention. The present invention may be modified and improved without deviating from the spirit thereof, and equivalents thereof are also included in the present invention.

The invention claimed is:

1. A design support system for supporting design of an integrated circuit which includes an interface circuit for communicating with a processor device that implements a predetermined function by executing a program, a user logical circuit that is hardware implementing a predetermined function, and an input/output (I/O) register circuit having an I/O register used for transmission and receipt of data between the processor device and the user logical circuit, the design support system comprising:

an information apparatus for performing functions to design the integrated circuit; and
a user interface for permitting a user to cause functions to be performed by said information apparatus to design the integrated circuit,
wherein the information apparatus comprises:
a memory for storing design data, and
a processing unit for processing the design data in said memory,
said processing performed by said processing unit includes:
an I/O register access information extracting processing that generates I/O register access information based on the first behavior level design data which is design data at a behavior level subjected to modeling for the integrated circuit, the I/O register access information including information on access control from the user logical circuit to the I/O register and information on a specification of the I/O register;
an address map edit processing that generates address map information including information on association of an software (SW) register with an hardware (HW) register, based on the I/O register access information and association of an SW address with an HW address, the association of the SW address with the HW address being acquired through the user interface, the SW register being a register defined on the processor device side, the HW register being a register defined on the user logical circuit side, the SW address being an address used when the processor device accesses the I/O register, the HW address being an address used when the user logical circuit accesses the I/O register; and
an I/O register automatic generating processing that generates second behavior level design data, which is design data at the behavior level describing an internal structure of the I/O register circuit described in the first behavior level design data, based on the first behavior level design data and the address map information,
wherein circuits that form the integrated circuit are classified into tiered groups and managed, and
the I/O register access information outputted by the I/O register access information extracting processing includes information on at least one of:
an I/O register scope that is information on access permission from the groups to the I/O register;
an I/O register scope status that is information set in accordance with existence of writing of data from the groups to the I/O register or reading of data from the I/O register to the groups;
an I/O register bit size that is information on a bit size of the I/O register; and
an I/O register parity attribute that is information on existence of parity of the I/O register.

2. The design support system according to claim 1, wherein the I/O register access information outputted by the I/O register access information extracting processing includes information on at least one of:
an I/O register scope that is information on access permission from the groups to the I/O register,
an I/O register scope status that is information set in accordance with existence of writing of data from the groups to the I/O register or reading of data from the I/O register to the groups,
an I/O register bit size that is information on a bit size of the I/O register, and
an I/O register parity attribute that is information on existence of parity of the I/O register,
the address map edit processing presents, through the user interface, a screen that visually expresses an unallocated area of an HW register when acquiring a setting to allocate, to the SW register, the HW register having a bit size larger than a bit size of the SW register,
as a candidate for an HW register to be-associated with an SW register, the address map edit processing presents, through the user interface, the HW register in which the unallocated area remains when acquiring the setting to allocate, to the SW register, the HW register having a bit size larger than a bit size of the SW register,
the I/O register access information outputted by the I/O register access information extracting processing includes the I/O register scope as the information on the access control of the I/O register, the I/O register scope being the information on the access permission from the groups to the I/O register,
the I/O register access information outputted by the I/O register access information extracting processing includes the I/O register parity attribute as the information on the specification of the I/O register, the I/O register parity attribute being the information on the existence of the parity of the I/O register,
the address map edit processing acquires, through the user interface, a setting of a space attribute that is information on existence of parity of the SW register,
as the candidate for the HW register to be associated with the SW register, the address map edit processing presents, through the user interface, an HW register in which information on access control to the SW register and the I/O register scope coincide, and the space attribute and the I/O register parity attribute coincide,
as the internal structure of the I/O register circuit, the I/O register automatic generating processing generates:
a register write space conversion circuit that performs signal conversion between the SW address and the HW address in accordance with the address map information in writing of data into the I/O register;

a register read space conversion circuit that performs signal conversion from the SW address to the HW address in accordance with the address map information in reading of data from the I/O register; and a register circuit that is an entity of the I/O register, and writes data to or reads data from the processor device through the register write space conversion circuit and the register read space conversion circuit, the I/O register automatic generating part generates any one of the register write space conversion circuit and the register read space conversion circuit, which has a circuit that converts a plurality of the SW addresses of a plurality of the SW registers into the address of the one HW register, the address map edit processing acquires, through the user interface, the setting of the space attribute that is the information on the existence of the parity of the SW register, the I/O register automatic generating processing provides, in the register read space conversion circuit, a logical circuit for allowing the SW register to take over parity held by the HW register when a content of the space attribute of the SW register associated with the register circuit thus generated shows that parity exists, the I/O register automatic generating processing provides, in the register read space conversion circuit, a logical circuit for generating a value of parity to be given to the SW register when the content of the space attribute of the SW register associated with the register circuit thus generated shows that no parity exists, the address map edit processing accepts, through the user interface, a register attribute that is information on access control to the SW register, the I/O register access information outputted by the I/O register access information extracting processing includes register information as information on the specification of the I/O register, and the register circuit includes:

the entity of the I/O register;

a partial-write circuit that generates data to be written into the I/O register in accordance with the address map information based on the data inputted from the register write space conversion circuit;

a multiplexer that writes the data generated by the partial-write circuit into the I/O register; and a controller circuit that controls the multiplexer in accordance with the register attribute to allow or prohibit writing of the data into the I/O register by the multiplexer.

3. The design support system according to claim 1, wherein the address map edit processing presents, through the user interface, a screen that visually expresses an unallocated area of an HW register when acquiring a setting to allocate, to the SW register, the HW register having a bit size larger than a bit size of the SW register.

4. The design support system according to claim 1, wherein, as a candidate for an HW register to be associated with an SW register, the address map edit processing presents, through the user interface, an HW register in which the unallocated area remains when acquiring a setting to allocate, to the SW register, the HW register having a bit size larger than a bit size of the SW register.

5. The design support system according to claim 1, wherein the I/O register access information outputted by the I/O register access information extracting processing includes an I/O register scope as the information on access control of the I/O register, the I/O register scope being information on access permission from the groups to the I/O register, wherein the I/O register access information outputted by the I/O register access information extracting processing includes an I/O register parity attribute as the information on the specification of the I/O register, the I/O register parity attribute being information on existence of parity of the I/O register, wherein the address map edit processing acquires, through the user interface, a setting of a space attribute that is information on existence of parity of the SW register, and wherein, as a candidate for an HW register to be associated with an SW register, the address map edit processing presents, through the user interface, an HW register in which information on access control to the SW register and the I/O register scope coincide, and the space attribute and the I/O register parity attribute coincide.

6. The design support system according to claim 2, wherein the integrated circuit is a component of one of a plurality of processor boards of a storage apparatus including:

at least one channel board that receives a data I/O request sent from an external device;

at least one drive board that writes data into or reads data from a storage formed of a plurality of storage drives in response to the received data I/O request;

a cache memory that stores therein write data to be written into the storage or read data read from the storage;

the plurality of processor boards that serve to transfer data between at least two of the channel board, the drive board, and the cache memory; and a shared memory that is accessible from the processor boards, and the integrated circuit is a circuit that executes processing of at least one of data transfer between the channel board and the cache memory, and data transfer performed between the drive board and the cache memory.

7. The design support system according to claim 6, wherein the user logical circuit is at least one of a DMA (Direct Memory Access) and a memory controller.

8. A design support system for supporting design of an integrated circuit which includes an interface circuit for communicating with a processor device that implements a predetermined function by executing a program, a user logical circuit that is hardware implementing a predetermined function, and an input/output (I/O) register circuit having an I/O register used for transmission and receipt of data between the processor device and the user logical circuit, the design support system comprising:

an information apparatus for performing functions to design the integrated circuit; and a user interface for permitting a user to cause functions to be performed by said information apparatus to design the integrated circuit, wherein the information apparatus comprises:

a memory for storing design data, and a processing unit for processing the design data in said memory, wherein said processing performed by said processing unit includes:

an I/O register access information extracting processing that generates I/O register access information based on the first behavior level design data which is design data at a behavior level subjected to modeling for the integrated circuit, the I/O register access information including information on access control from the user logical circuit to the I/O register and information on a specification of the I/O register;

an address map edit processing that generates address map information including information on association of an software (SW) register with an hardware (HW) register, based on the I/O register access information and association of an SW address with an HW address, the association of the SW address with the HW address being acquired through the user interface, the SW register being a register defined on the processor device side, the HW register being a register defined on the user logical circuit side, the SW address being an address used when the processor device accesses the I/O register, the HW address being an address used when the user logical circuit accesses the I/O register; and an I/O register automatic generating processing that generates second behavior level design data which is design data at the behavior level describing an internal structure of the I/O register circuit described in the first behavior level design data, on the basis of the first behavior level design data and the address map information, wherein, as the internal structure of the I/O register circuit, the I/O register automatic generating processing generates:

a register write space conversion circuit that performs signal conversion between the SW address and the HW address in accordance with the address map information in writing of data into the I/O register;

a register read space conversion circuit that performs signal conversion from the SW address to the HW address in accordance with the address map information in reading of data from the I/O register; and a register circuit that is an entity of the I/O register, and writes data to or reads data from the processor device through the register write space conversion circuit and the register read space conversion circuit.

9. The design support system according to claim 8, wherein the I/O register automatic generating processing generates any one of the register write space conversion circuit and the register read space conversion circuit, which has a circuit that converts a plurality of the SW addresses of a plurality of the SW registers into the address of the one HW register.

10. The design support system according to claim 8, wherein the address map edit processing acquires, through the user interface, a setting of a space attribute that is information on existence of parity of the SW register, the I/O register automatic generating processing provides, in the register read space conversion circuit, a logical circuit for allowing the SW register to take over parity held by the HW register when a content of the space attribute of the SW register associated with the register circuit thus generated shows that parity exists, and the I/O register automatic generating processing provides, in the register read space conversion circuit, a logical circuit for generating a value of parity to be given to the SW register when the content of the space attribute of the SW register associated with the register circuit thus generated shows that no parity exists.

11. The design support system according to claim 8, wherein the address map edit processing accepts, through the user interface, a register attribute that is information on access control to the SW register, the I/O register access information outputted by the I/O register access information extracting processing includes register information as information on the specification of the I/O register, and the register circuit includes:

the entity of the I/O register;

a partial-write circuit that generates data to be written into the I/O register in accordance with the address map information on the basis of data inputted from the register write space conversion circuit;

a multiplexer that writes the data generated by the partial-write circuit into the I/O register; and a controller circuit that controls the multiplexer in accordance with the register attribute to allow or prohibit writing of the data into the I/O register by the multiplexer.

12. The design support system according to claim 11, wherein, in a case where a predetermined value (ERR) is set in the register attribute, the register circuit writes, into the I/O register, a result obtained by calculating a logical sum of data to be written into the I/O register and data having been written to the I/O register when writing data from the user logical block into the I/O register.

13. A method for manufacturing an integrated circuit by using a design support system for supporting design of an integrated circuit which includes an interface circuit for communicating with a processor device that implements a predetermined function by executing a program a user logical circuit that is hardware implementing a predetermined function, and an input/output (I/O) register circuit having an I/O register used for transmission and receipt of data between the processor device and the user logical circuit, said design support system including an information apparatus for performing functions to design the integrated circuit, and a user interface for permitting a user to cause functions to be performed by said information apparatus to design the integrated circuit, said information apparatus including a memory for storing design data, and a processing unit for processing the design data in said memory, the method comprising:

generating I/O register access information based on first behavior level design data that is design data at a behavior level subjected to modeling for the integrated circuit, the I/O register access information including information on access control from the user logical circuit to the I/O register and information on a specification of the I/O register;

generating address map information including information on association of an software (SW) register with an hardware (HW) register, on the basis of the I/O register access information and association of an SW address with an HW address, the association of the SW address with the HW address being acquired through the user interface, the SW register being a register defined on the processor device side, the HW register being a register defined on the user logical circuit side, the SW address being an address used when the processor device accesses the I/O register, the HW address being an address used when the user logical circuit accesses the I/O register; and generating second behavior level design data which is design data at the behavior level describing an internal structure of the I/O register circuit described in the first behavior level design data, on the basis of the first behavior level design data and the address map information, wherein circuits that form the integrated circuit are classified into tiered groups and managed, the I/O register access information includes information on at least one of:

an I/O register scope that is information on access permission from the groups to the I/O register;

an I/O register scope status that is information set in accordance with existence of writing of data from the groups to the I/O register or reading of data from the I/O register to the groups;

an I/O register bit size that is information on a bit size of the I/O register; and an I/O register parity attribute that is information on existence of parity of the I/O register, through the user interface, a screen is presented which visually expresses an unallocated area of an HW register when a setting to allocate, to the SW register, the HW register having a bit size larger than a bit size of the SW register is acquired, through the user interface, the HW register in which the unallocated area remains is presented as a candidate for an HW register to be associated with an SW register when the setting to allocate, to the SW register, the HW register having a bit size larger than a bit size of the SW register is acquired, the I/O register access information includes the I/O register scope as the information on the access control of the I/O register, the I/O register scope being the information on the access permission from the groups to the I/O register, the I/O register access information includes the I/O register parity attribute as the information on the specification of the I/O register, the I/O register panty attribute being the information on the existence of the parity of the I/O register, a setting of a space attribute is acquired through the user interface, the space attribute being information on existence of parity of the SW register;

as the candidate for the HW register to be associated with the SW register, through the user interface, an HW register is presented in which information on access control to the SW register and the I/O register scope coincide, and the space attribute and the I/O register parity attribute coincide, generated as the internal structure of the I/O register circuit are:

a register write space conversion circuit that performs signal conversion between the SW address and the HW address in accordance with the address map information in writing of data into the I/O register;

a register read space conversion circuit that performs signal conversion from the SW address to the HW address in accordance with the address map information in reading of data from the I/O register; and a register circuit that is an entity of the I/O register, and writes data to or reads data from the processor device through the register write space conversion circuit and the register read space conversion circuit, any one of the register write space conversion circuit and the register read space conversion circuit is generated, which has a circuit that converts a plurality of the SW addresses of a plurality of the SW registers into the address of the one HW register, the setting of the space attribute is acquired through the user interface, the space attribute being the information on the existence of the parity of the SW register, a logical circuit for allowing the SW register to take over parity held by the HW register is provided in the register read space conversion circuit when a content of the space attribute of the SW register associated with the register circuit thus generated shows that parity exists, a logical circuit for generating a value of parity to be given to the SW register is provided in the register read space conversion circuit when the content of the space attribute of the SW register associated with the register circuit thus generated shows that no parity exists, a register attribute is accepted through the user interface, the register attribute being information on access control to the SW register, the I/O register access information includes register information as information on the specification of the I/O register, and the register circuit includes:

the entity of the I/O register;

a partial-write circuit that generates data to be written into the I/O register in accordance with the address map information on the basis of data inputted from the register write space conversion circuit;

a multiplexer that writes the data generated by the partial-write circuit into the I/O register; and a controller circuit that controls the multiplexer in accordance with the register attribute to allow or prohibit writing of the data into the I/O register by the multiplexer.

\* \* \* \* \*